(12) United States Patent
Williams et al.

(10) Patent No.: US 7,576,391 B2
(45) Date of Patent: Aug. 18, 2009

(54) HIGH-VOLTAGE LATERAL TRENCH MOSFET

(75) Inventors: Richard K. Williams, Cupertino, CA (US); Donald Ray Disney, Cupertino, CA (US); Wai Tien Chan, Hong Kong (CN)

(73) Assignee: Advanced Analogic Technologies, Inc., Santa Clara, CA (US)

( * ) Notice: Subject to any disclaimer, the term of this patent is extended or adjusted under 35 U.S.C. 154(b) by 13 days.

(21) Appl. No.: 11/982,764

(22) Filed: Nov. 5, 2007

(65) Prior Publication Data

US 2008/0067585 A1  Mar. 20, 2008

Related U.S. Application Data

(60) Division of application No. 11/443,745, filed on May 31, 2006, which is a continuation-in-part of application No. 11/881,841, filed on Jul. 30, 2007, which is a continuation of application No. 10/767,419, filed on Jan. 29, 2004, which is a continuation of application No. 10/262,567, filed on Sep. 29, 2002.

(51) Int. Cl.
H01L 27/108 (2006.01)
(52) U.S. Cl. .............. 257/335; 257/336; 257/E21.417
(58) Field of Classification Search .............. 257/335, 257/E21.417, 336
See application file for complete search history.

(56) References Cited

U.S. PATENT DOCUMENTS

| | | | | |
|---|---|---|---|---|
| 4,345,265 A * | 8/1982 | Blanchard | ............. | 257/339 |
| 4,411,058 A | 10/1983 | Chen | ............. | 148/187 |
| 5,055,417 A | 10/1991 | Akcasu | ............. | 437/6 |
| 5,204,545 A | 4/1993 | Terashima | ............. | 257/490 |
| 5,218,228 A | 6/1993 | Williams et al. | ............. | 257/593 |
| 5,293,060 A | 3/1994 | Komori et al. | ............. | 257/544 |
| 5,304,827 A | 4/1994 | Malhi et al. | ............. | 257/262 |
| 5,349,225 A * | 9/1994 | Redwine et al. | ............. | 257/336 |
| 5,374,843 A | 12/1994 | Williams et al. | ............. | 257/492 |
| 5,478,759 A | 12/1995 | Mametani et al. | ............. | 438/228 |
| 5,485,027 A * | 1/1996 | Williams et al. | ............. | 257/343 |
| 5,521,105 A | 5/1996 | Hsu et al. | ............. | 438/197 |
| 5,541,439 A | 7/1996 | Mojaradi et al. | ............. | 257/488 |
| 5,578,508 A * | 11/1996 | Baba et al. | ............. | 438/270 |
| 5,585,294 A * | 12/1996 | Smayling et al. | ............. | 438/307 |
| 5,640,497 A | 6/1997 | Woolbright | ............. | 257/496 |
| 5,696,010 A * | 12/1997 | Malhi | ............. | 438/279 |
| 5,698,458 A | 12/1997 | Hsue et al. | ............. | 438/451 |
| 5,714,396 A | 2/1998 | Robb et al. | ............. | 438/510 |
| 5,751,054 A | 5/1998 | Yilmaz et al. | ............. | 257/603 |
| 5,777,362 A | 7/1998 | Pearce | ............. | 257/335 |
| 5,817,546 A | 10/1998 | Ferla et al. | ............. | 438/138 |
| 5,909,103 A | 6/1999 | Williams | ............. | 320/134 |

(Continued)

Primary Examiner—Bradley K Smith
Assistant Examiner—Alexander Belousov
(74) Attorney, Agent, or Firm—Patentability Associates

(57) ABSTRACT

All low-temperature processes are used to fabricate a variety of semiconductor devices in a substrate the does not include an epitaxial layer. The devices include a non-isolated lateral DMOS, a non-isolated extended drain or drifted MOS device, a lateral trench DMOS, an isolated lateral DMOS, JFET and depletion-mode devices, and P-N diode clamps and rectifiers and junction terminations. Since the processes eliminate the need for high temperature processing and employ "as-implanted" dopant profiles, they constitute a modular architecture which allows devices to be added or omitted to the IC without the necessity of altering the processes used to produce the remaining devices.

20 Claims, 66 Drawing Sheets

U.S. PATENT DOCUMENTS

| | | | | |
|---|---|---|---|---|
| 5,966,599 | A | 10/1999 | Walker et al. | 438/228 |
| 5,973,367 | A | 10/1999 | Williams | 257/365 |
| 5,998,837 | A * | 12/1999 | Williams | 257/341 |
| 6,072,215 | A | 6/2000 | Kawaji et al. | 257/334 |
| 6,072,216 | A | 6/2000 | Williams et al. | 257/339 |
| 6,096,625 | A | 8/2000 | Daniel et al. | 438/473 |
| 6,097,063 | A * | 8/2000 | Fujihira | 257/339 |
| 6,207,484 | B1 | 3/2001 | Kim et al. | 438/209 |
| 6,207,994 | B1 * | 3/2001 | Rumennik et al. | 257/342 |
| 6,255,154 | B1 | 7/2001 | Akaishi et al. | 438/217 |
| 6,271,552 | B1 | 8/2001 | D'Anna | 257/288 |
| 6,274,898 | B1 | 8/2001 | Mehta et al. | 257/298 |
| 6,294,818 | B1 | 9/2001 | Fujihira | 257/409 |
| 6,362,025 | B1 | 3/2002 | Patti et al. | 438/138 |
| 6,392,275 | B1 | 5/2002 | Jang | 257/343 |
| 6,429,481 | B1 | 8/2002 | Mo et al. | 257/341 |
| 6,468,847 | B1 * | 10/2002 | Disney | 438/197 |
| 6,472,709 | B1 * | 10/2002 | Blanchard | 257/343 |
| 6,476,457 | B2 | 11/2002 | Oh | 257/492 |
| 6,566,709 | B2 | 5/2003 | Fujihira | 257/328 |
| 6,720,615 | B2 | 4/2004 | Fujihira | 257/328 |
| 6,734,714 | B2 | 5/2004 | Disney | 327/427 |
| 6,855,985 | B2 | 2/2005 | Williams et al. | 257/338 |
| 7,061,057 | B2 | 6/2006 | Babcock et al. | 257/401 |
| 7,091,557 | B2 | 8/2006 | Deboy | 257/339 |
| 7,126,166 | B2 | 10/2006 | Nair et al. | 257/110 |
| 2001/0000288 | A1 | 4/2001 | Oh | 257/409 |
| 2001/0015459 | A1 * | 8/2001 | Watanabe et al. | 257/341 |
| 2004/0217377 | A1 * | 11/2004 | Deboy | 257/197 |
| 2005/0042815 | A1 * | 2/2005 | Williams et al. | 438/202 |

\* cited by examiner

HIGH-VOLTAGE LATERAL TRENCH MOSFET

CROSS-REFERENCE TO RELATED APPLICATIONS

This application is a continuation-in-part of application Ser. No. 11/881,841, filed Jul. 30, 2007, which is a continuation of application Ser. No. 10/767,419, filed Jan. 29, 2004, now U.S. Pat. No. 7,265,434, which is a continuation of application Ser. No. 10/262,567, filed Sep. 29, 2002, now U.S. Pat. No. 6,855,985, which is incorporated herein by reference in its entirety.

This application is related to application Ser. No. 10/262,567, filed Sep. 29, 2002, now U.S. Pat. No. 6,855,985, which is incorporated herein by reference in its entirety.

BACKGROUND OF THE INVENTION

This invention relates to semiconductor chip fabrication and in particular to methods of fabricating, integrating and electrically isolating high-voltage and low-voltage bipolar, CMOS and DMOS transistors and passive components in a semiconductor chip monolithically without the need for high temperature fabrication processing steps.

In the fabrication of semiconductor integrated circuit (IC) chips, it is frequently necessary to electrically isolate devices that are formed on the surface of the chip, especially when these components operate at different voltages. Such complete electrical isolation is necessary to integrate certain types of transistors including bipolar junction transistors and various metal-oxide-semiconductor (MOS) transistors including power DMOS transistors. Complete isolation is also needed to allow CMOS control circuitry to float to potentials well above the substrate potential during operation.

Complete isolation is especially important in the fabrication of analog, power, and mixed signal integrated circuits. In many circuits and applications it may be necessary or desirable to integrate both isolated and non-isolated high-voltage devices on the same chip as other isolated components, with the caveat that high-voltage device fabrication should not degrade the isolation's electrical properties, and that the isolation's fabrication steps should not adversely alter high-voltage device characteristics. There are various ways of doing this.

Conventional CMOS fabricated in P-type substrate material does not facilitate complete isolation of its devices since every P-type well forming the body (back-gate) of NMOS transistors is shorted to the substrate potential, typically the most negative on-chip potential. Epitaxial junction-isolation or epi-JI employs an N-type epitaxial layer grown atop a P-type silicon substrate and separated into electrically isolated tubs by a deep P-type isolation diffusion—one requiring high temperature processes to implement. High temperature processing causes a redistribution of dopant atoms in the substrate and epitaxial layers, causing unwanted tradeoffs and compromises in the manufacturing of dissimilar devices fabricated using one common process. Moreover, the high-temperature diffusions and epitaxy employed in epi-JI processes are generally incompatible with the large wafer diameters and advanced low-temperature processing equipment common in submicron CMOS fabs.

The Benefit of an Isolated Source-Body Short

In high voltage or power devices, there is a distinct performance and survivability advantage to MOS transistors integrating a source-body short over those without a source-body short. Compared to conventional logic and small-signal devices, a power or high voltage device with an integral source-body short has distinct advantage over devices with separate and physically remote source and body contacts.

The need for a source-body short in many power devices is a consequence of their application and power circuit requirements. One way to quickly access the electrical requirements of a power device in a given application is to consider its topological relationship to the load and to its source of power. We herein refer to this relationship as a "switch-load topology".

In FIGS. 1A and 1B, a power MOSFET connected to ground or a negative potential is connected in series with a load connected to a positive potential or supply $V_{cc}$. Since the MOSFET "switch" is connected to ground, we herein topologically refer to it as a low-side switch or LSS, even if it is used as a current source. In FIG. 1A, using a conventional non-isolated CMOS process, circuit 1 includes load 3, an LSS comprising an NMOS 2, and a current sense resistor 4. In such a process, body contact of MOSFET 2 is necessarily shorted to the substrate, i.e. it is grounded.

To measure the voltage across the sense resistor, current sensing requires the source of NMOS 2 should not be shorted to the body and substrate, i.e. $V_B \neq V_S$. The voltage differential between source and body causes a number of problems. Specifically, any voltage developed across sense resistor 4 increases the source-to-body potential which in turn increases the MOSFET's threshold voltage (due to a phenomenon known as the "body effect"). A high threshold in turn increases on-resistance while lowering saturation current, adversely impacting switch performance. Another undesired effect of disconnecting the source and body is any avalanche or displacement current in drain-to-body diode 5 does not pass through the sense resistor and is therefore not detected. Finally, without a low resistance body contact, snapback breakdown can occur easily.

Using LSS devices with an integral source-body short such as NMOS 12 in circuit 10 of FIG. 1B, drain-to-body diode 15 is anti-parallel to the MOSFET's drain and source terminals (i.e. reverse biased but in parallel), so that any current flowing through load 13 is detected in sense resistor 14 regardless of whether this current flows through the channel of NMOS 12 or through reverse biased diode 15. Because $V_{SB}=0$ regardless of the source potential, no body effect is manifest, and the transistor's conduction characteristics do not change substantially with current.

The source-body short also improves avalanche-ruggedness by reducing the risk of snapback effects (discussed below), particularly if the source-body short can be distributed uniformly across a large area device rather than shorted together in a single location. Integration of a source body short into a large area NMOS, while common in discrete power devices, requires isolation of the P-type body from the P-type substrate in integrated form, something conventional CMOS cannot offer. Processes offering such isolation are complex to manufacture, often requiring high temperature fabrication steps.

In FIGS. 1C and 1D, a power MOSFET connected to a positive potential or supply $V_{cc}$ is connected in series with a load connected to ground or a negative potential. Since the MOSFET "switch" is connected to the positive supply, we herein topologically refer to it as a high-side switch or HSS, even if it is used as a current source.

Using a conventional non-isolated CMOS process, circuit 20 in FIG. 1C includes load 23 and a HSS comprising NMOS 22. In such a process, body contact of MOSFET 22 is necessarily shorted to the substrate, i.e. it is grounded. When the NMOS is on and $V_S$ increases to a potential approaching $V_{cc}$, a large reverse biased potential $-V_{SB}$ develops across diode 25. The resulting body effect causes the threshold of NMOS 22 to increase substantially, making it difficult to provide adequate gate drive to achieve a low on-resistance without damaging the thin gate oxide of NMOS 22.

Using devices with an integral source-body short such as NMOS 32 in circuit 30 of FIG. 1D, the current in load 33 can easily be controlled without the need to counteract threshold variations due to body effect. In such a topology, drain-to-body diode 35 remains anti-parallel to the MOSFET's drain and source terminals (i.e. reverse biased but in parallel), and remains reversed biased under all normal operating conditions. Because $V_{SB}=0$ regardless of the source potential, no body effect is manifest, and the transistor's conduction characteristics do not change substantially with current. The source-body short also improves avalanche-ruggedness by reducing the risk of snapback effects (discussed below), particularly if the source-body short can be distributed uniformly across a large area device rather than shorted together in a single location. Integration of a source body short into a large area NMOS, while common in discrete power devices, requires isolation of the P-type body from the P-type substrate in integrated form, something conventional CMOS cannot offer. Processes offering such isolation are complex to manufacture, often requiring high temperature fabrication steps.

In FIGS. 1E, 1F and 1G a power MOSFET is employed as a bidirectional switch without either source or drain permanently connected to either a positive or negative supply rail. Since the MOSFET "switch" is not connected to any supply but instead may block current or conduct current in either direction, we herein topologically refer to it as an AC switch, or a "pass transistor".

Using conventional CMOS fabrication, pass transistor 40 in FIG. 1E comprises NMOS 41 with a grounded body connection and reverse biased source-to-body and drain-to-body diodes 42 and 43, respectively. The terms "source" and "drain" are somewhat arbitrary in pass transistor or AC switch applications since it is often impossible to determine which terminal, the one biased at $V_S$ or the one biased at $V_D$, will be more positive at any given instance. Because the voltage across diodes 42 and 43 is large, the body effect can cause significant changes in the threshold, on-resistance, and saturation current of NMOS 41, making it a poor AC switch.

An alternative approach to implementing AC switch requiring at least two NMOS devices with a source-body short is shown in circuit 45 of FIG. 1F, where NMOS transistors 46 and 47 are connected in series with a common source $V_S$ such that drain-to-body diodes 48 and 49 are connected back-to-back. In its off state, the gate terminal is biased to the source terminal $V_S$ thereby preventing channel conduction. Conduction through the anti-parallel body diodes is also prevented since one of the two diodes remains reversed biased regardless of the polarity applied across the series connected switches.

In its on state, whenever the common gate is biased above the source terminal, AC switch 45 may conduct current in either direction since both transistors are turned on. The resulting AC switch is able to block bi-directionally and conduct bi-directionally. Despite the fact that the voltage $V_S$ floats at a potential between $V_{D1}$ and $V_{D2}$, no body effect is manifest since $V_{SB}=0$, i.e. each transistor has an integral source body short. Such a device can easily be integrated into any process having full isolation or capable of integrating DMOS devices. Without isolation, such a device cannot be integrated monolithically with other components or circuitry.

It should also be noted that the devices can be connected with a common drain rather than common source but still need an isolated source-body short.

A disadvantage of AC switch 45 is its high specific on-resistance, i.e. a large $R_{DS}A$, since the two series connected transistors exhibit additive resistances. If the switches were somehow connected in parallel, then the same area switch would exhibit a resistance one quarter that of the back-to-back approach of switch 45.

One such switch is shown in circuit 50 of FIG. 1G combing a symmetric NMOS device 51 and a body-bias generating (BBG) circuit 52. The purpose of BBG circuit 52 is to bias the body of NMOS 51 to the most negative potential applied across the device, to reverse bias either drain-to-body diode 55 or source-to-body diode 56, depending on whether the $V_S$ or $V_D$ terminal is more positive. In that way no diode conduction ever occurs and if the gate of the transistor is biased to the body potential, the device is off and will block bi-directionally. Conversely, since the device is symmetric, if the gate is biased "on" the device will conduct bi-directionally. Note that the nomenclature "drain" and "source" are arbitrary and used only to identify the circuit elements.

The BBG circuit shown as an example utilizes cross coupled NMOS transistors 53 and 54 to determine and bias the body potential $V_B$ on NMOS 51, but in so doing, they themselves must include a source-body short isolated from the substrate. So while switch 50 does not utilize a DMOS transistor such as the preferred implementation of AC switch 45 does, it still needs isolation to be integrated into an IC with other circuitry.

Suppressing Snapback Breakdown Effects

Aside from the need to integrate NMOS devices with isolated source body shorts, another limitation of conventional CMOS is its inability to prevent undesirable snapback breakdown effects in MOSFET operation, particularly in NMOS transistors.

Snapback breakdown refers to a phenomena leading to negative resistance in a device where for some range of operating conditions an increase in current corresponds to a "decrease" in the voltage sustaining capability of the transistor. Negative resistance is especially problematic in power electronic circuitry, giving rise to excess currents, oscillations and instability, electrical noise, localized heating, thermal runaway and even device destruction.

In power electronics, methods are required to prevent negative resistance at all costs, including using special device construction involving unusual design and process methods, in intentionally degrading or limiting the maximum voltage or current imposed on a device, and by other circuit and application methods. Unless a device is overheating, negative electrical resistance is generally a consequence of either parasitic bipolar conduction, conductivity modulation resulting from impact ionization, or some combination of both.

In FIG. 2A for example, a lightly doped drain NMOS 60 comprising P-type substrate 61, P+ substrate contact 62, N+ drain 64, N– drift region 65, MOS insulated gate 69, and N+ source 63 is biased in its on state with some positive voltage ~Vcc applied to its drain. Overlaid schematically on the device, is drain diode 59 representing the drain-to-substrate diode current either arising from avalanche, from impact ionization or from junction leakage. The majority-carrier substrate current, or "holes" flowing in P-type substrate 61 exhibits a resistive voltage drop, schematically represented by series-connected $R_{DB}$ and $R_{SB}$ substrate resistances 67 and 68, respectively. Because of substrate resistance, the resulting voltage $V_B$ in the bulk substrate located beneath source 63 will rise to a voltage higher than the ground terminal connected to P+ contact 62. If this voltage approaches a few tenths of a volt, N+ region 63 may start to inject electrons, i.e. minority carriers, into substrate 61 which will naturally be attracted by the two-dimensional electric fields in the device to the most positive potential, in this case N+ drain 64. This electron conduction mechanism is represented by parasitic NPN bipolar transistor 66 comprising N+ collector 64, P-type substrate base 61, and N+ emitter 63. Since the voltage sustaining capability of a bipolar transistor is lower than a simple P-N junction diode (because of current gain), the sustaining voltage of NPN 66 is lower than the NMOS itself and the voltage will snapback to a lower value, $BV_{CER}$—a notation describing the bipolar's collector-to-emitter voltage and having a resistive, non-shorted, base contact.

Another mechanism leading to snapback illustrated in the cross sectional view of FIG. 2B is impact ionization in the drain of the MOSFET. In this case the NMOS is biased to a high-voltage $V_{CC}$ thereby reverse biasing the drain-to-substrate junction comprising N+ drain 64 and P-type substrate 61. The voltage is dropped across a depletion region illustrated by equipotential curves 71 at voltages 0V (substrate), $V_1$, $V_2$, $V_3$, $V_4$ and $V_5$, each curve in increasing magnitude of voltage potential. The N– drift region under such a bias condition depletes, allowing the equipotential lines to cross the junction boundary between the N– drift region and the substrate.

Ideally these equipotential lines should be spaced linearly along the drift region with half the applied voltage being located at the center of the drift region between gate 69 and N+ drain 64. Because of surface charge and other unavoidable surface effects, however, the equipotential lines do not spread themselves uniformly, but instead "bunch up" near the gate edge resulting an a locally higher electric field at the end of the drift region. Even worse, the high electric field is physically located near a region of high current density. In saturation when the device has a high drain potential while conducting current, the main current path indicated by arrow 72, flows under the gate then away from the surface as it approaches the edge of depleted drift region 65. The product of high current density and high electric field results in impact ionization, i.e. local carrier creation, resulting from collisions of fast electrons with the atomic structure of the crystal. The collisions dislodge valence electrons from bonding the atoms together, and convert them into more free conduction electrons which are in turn also accelerated by the locally high electric field.

The resulting impact ionization is herein represented by the concentric contours 73 representing increased generation rates. Since impact ionization creates electron-hole pairs, two undesirable effects result. First the electrons are accelerated to high energies relative to the crystal, i.e. they become energetically "hot", and may get swept into the gate oxide damaging the dielectric. The second phenomenon is the generated hole current contributes to additional voltage drop across the substrate resistance $R_{SB}$, exacerbating the NPN snapback effect.

At even higher impact ionization rates and high currents, another phenomenon occurs. In such cases the generated carriers start to alter the local conductivity of the drift region by introducing sufficient additional charge that it begins to alter local space charge neutrality. The extra electrons attract extra holes, which act like an increase in drift doping. The higher effective doping decreases depletion spreading into the N– layer and forces the equipotentials to bunch up even more, essentially increasing the local electric field at the edge of the drift region and further increasing impact ionization. The result is another cause of negative resistance since more impact ionization causes a high local field and contributes to even more current. Moreover, the two negative resistance effects can occur simultaneously, interacting in a complex and even unpredictable way. Regardless of the mechanism, the result is a decrease in the drain voltage that the NMOS can sustain at a given current.

Electrically the phenomenon of snapback is shown in graph 75 of drain current $I_D$ versus drain voltage $V_{DS}$ in FIG. 2C. Ideal device breakdown BVDSS shown by curve 76 may be substantially greater than snapback voltage $BV_{CER}$ shown by curve 77, even by a factor of two or more in voltage. If the drain is driven into avalanche at high currents while sustaining voltage $BV_{DSS}$, it may suddenly collapse back to $BV_{CER}$, causing the current to increase and destroying the device. If the NMOS is operating as a current source or switching from on to off, the onset of snapback may be exacerbated by increased substrate leakage due to impact ionization. Curves 78, 69, 80, and 81 illustrate the device may not even be useful for operating at any voltage above $BV_{CER}$.

One reason for the onset of snapback is that the $R_{SB}$ substrate resistance 68 between and beneath N+ source 63 and body contact 62 is too large, especially if the substrate is lightly doped. The other effect is that the parasitic NPN gain is too great since there is not enough base charge in the lightly doped substrate. One obvious way to reduce the NPN transistor's adverse influence is to increase substrate doping, but unfortunately doing so also increases the electric field at the drain leading to even more impact ionization and substrate current.

The snapback effect is sometimes represented schematically by illustrating the parasitic bipolar associated with a MOSFET. For example, circuit 85 in FIG. 2D illustrates NMOS 86 with parasitic NPN 87, and nonlinear emitter to base shorting resistor 88. Similarly a PMOS includes a parasitic PNP, but since PNP gain is much lower than NPN gain, and since hot hole induced impact ionization rates are much lower than electron ionization rates, the snapback phenomenon is less of an issue in a PMOS than in an NMOS.

Conventional DMOS Fabrication

One way to suppress snapback through additional channel doping and lower substrate resistance without increasing the drain electric field is by forming a DMOS field effect transistor. A DMOS, a name where the letter "D" stands for double (and originally for double diffused) is constructed where the channel or body doping under the gate is not uniform, but concentrated or localized near the source side of the gate to avoid adversely increasing electric fields in the vicinity of the drain region. In this way the channel concentration can be adjusted without affecting impact ionization or drain voltage breakdown voltages.

DMOS field effect transistors may be in isolated or non-isolated versions. In conventional technology, the isolated requires the use of epitaxial deposition, generally of N-type epitaxy grown atop a P-type substrate As shown in FIG. 3A, N-type epitaxial layer 92 is grown atop P-type substrate 91 to form an isolated DMOS device 90, further comprising gate polysilicon 98, gate oxide 99, N+ drain contact 94, N+ source 96, P+ body contact 97 and a P-type "body" or PB region 93 unique to DMOS transistors. The N– drift region 95 is optional and may not be required if the epitaxial doping is sufficient to achieve low on-resistance. The extra N– drift doping may be added to optimize the tradeoff between breakdown and resistance but remains limited by impact ionization effects where the gate juxtaposes the drift region.

In an alternative form N-type epitaxial layer can be replaced by a P-type epitaxial layer or substrate, but then N– drift region 95 is mandatory for device operation. Without an N-type epitaxial layer however, the DMOS is not isolated and has its P-type body electrically shorted to ground, i.e. to the substrate.

Conventional DMOS fabrication is shown in cross sections 100 and 105 in FIGS. 3B and 3C. As shown epitaxial layer 92 is covered by patterned photoresist 101 and implanted by boron at a low energy to form shallow layer 102. The implantation is performed at a low energy, typically between 50 to 100 keV, and nearly perpendicular to the wafer's surface, e.g. only 3 degrees off axis, with limited lateral penetration under gate 98.

The implant is then driven in, i.e. diffused at high temperatures over a long time, to extend the dopant laterally under gate 98 to form junction 93 as shown in FIG. 3C. The diffusion, taking anywhere from 7 to 24 hours, requires high temperatures over 1050° C. and typically 1100° C. or higher, a process incompatible with many modern low-temperature fabrication facilities and large wafer diameters. The progression of the diffusion as shown in FIG. 3C and illustrated by diffusions 106 at times $t_1$, $t_2$ and $t_3$, occurs both laterally and vertically, where the lateral extent is roughly 80% of the vertical junction depth. In the version shown, the body diffusion is self-aligned to the gate since it was implanted after the gate was formed.

If a low temperature process is required, another self aligned fabrication method to form a DMOS device is shown in FIG. 3D. In this technique the body implant is performed at a higher energy, typically at several hundred thousand electron volts, but more importantly at a steep angle, e.g. at 45°, to guarantee the body dopant penetrates laterally under gate 98 to a sufficient extent to fully enclose N+ source 96. The lateral implant method is complex and undesirable for manufacturing since the implant must be performed four times to cover all four gate orientations on a wafer. Rotating the wafer during implantation makes uniform implantation difficult.

Another DMOS fabrication method is to form a non-self aligned DMOS 120 such as shown in FIGS. 3E to 3G. In FIG. 3E, a shallow boron implant 129 is formed in epitaxial layer 122 masked by patterned photoresist 128. The implant is then diffused at high temperatures as shown in FIG. 3F for a long period of time. The P-type region diffuses both vertically and laterally as illustrated by curves 123 representing the P-N junction at increasing times $t_1$, $t_2$, $t_3$ and $t_4$. Finally in FIG. 3G, gate electrode 125 with underlying gate oxide 126 is positioned over the edge of the junction 124 such that the junction at the surface is located between gate edges 127A and 127B. Since it is not self-aligned the relative location of gate 125 and junction 124 is subject to mask misalignment during manufacturing.

In every case described, the process of high temperature diffusion leads to a monotonically decreasing dopant concentration profile of the DMOS body region, with the highest concentration at the wafer's surface. Unfortunately such a profile means the surface electric field is higher than in the bulk away from the surface, not ideal for manufacturing robust avalanche-rugged devices.

Conventional Junction Isolation Fabrication

The high temperature diffusions involved in DMOS body fabrication are further complicated by the steps needed to achieve full electrical isolation of circuitry using epitaxial junction isolation.

In such conventional prior art processes as shown in FIGS. 4A through 4I, a p-type substrate 131 is masked by photoresist 132 and implanted with arsenic or antimony 133, then masked again by photoresist 134 and implanted with boron 135 a shown in FIG. 4C. The implants are then diffused at extremely high temperatures, sometimes as high as 1200° C., and for as long as 24 hours to diffuse the slow moving antimony into the substrate and away from the surface prior to epitaxial growth. During such diffusions, oxide 138 is grown to protect the surface from lateral doping from out-gassing of the buried layers. The oxidation is also used to help define a pattern in the wafer for subsequent mask alignment, since the oxide growth rate over antimony NBL layer 136A will be faster than over boron PBL layer 137A.

After buried layer diffusion, the oxide is stripped off as shown in FIG. 4E and an HCl acid etch is performed in-situ at the beginning of epitaxial growth, thereby removing the top silicon layers to improve adhesion and reduce crystal defects in the epitaxial layer. The result of the epitaxial growth is shown in FIG. 4F where epitaxial layer covers the now expanded NBL region 136B and PBL 137B, both up-diffusing into the epitaxial layer during its high temperature growth.

Next, as shown in FIGS. 4G and 4H. a high dose phosphorus implant 140 is introduced through a mask 141, followed by a high dose boron implant 142 through a photoresist mask 143. After a long high temperature isolation diffusion P-type isolation region 145 connects with a portion of P-type buried layer PBL 137C. Similarly, N-type sinker diffusion 144 connects with buried layer NBL 136C. The depth of the diffusion and the time required depend on the thickness of epitaxial layer 139 and other subsequent high temperature diffusions in the process. High temperature diffusion also causes the buried layers to further expand laterally and up-diffuse to form 137C and 136C larger than their size in the previous processing step, i.e. as 137B and 136B.

Any DMOS body diffusions will also change all the junction depths and the net epitaxial thickness above the buried layers, all making manufacturing processing complex and specific to a particular epitaxial thickness. Since epi thickness determines device voltage ratings, the entire process and the corresponding design rules are all voltage specific.

Adapting Low-Temperature Modular Fabrication to High-Voltage Devices

As described previously, the problem with conventional epitaxial and high-temperature processes and manufacturing methods used to fabricate, isolate, and integrate high-voltage devices is that each high temperature process causes dopant redistribution affecting every high-voltage and low-voltage device. High temperature fabrication also precludes the use of large diameter wafers and modern submicron wafer fabs— fabs capable of high-density transistor integration, large die and high yields at low manufacturing costs.

What is needed is a process for integrating high-voltage and DMOS transistors with fully-isolated floating pockets of low-voltage CMOS, bipolar transistors, diodes, and passive circuit components that eliminates the need for high temperature processing and epitaxy. Ideally, such a manufacturing process should employ "as-implanted" dopant profiles— ones where the final dopant profiles remain substantially unaltered from their original implanted profiles by any subsequent wafer processing steps. Ideally the process should be constructed in a modular architecture where devices may be added or omitted and the corresponding process steps added or removed to the integrated flow without changing the other devices available in the process's device arsenal.

SUMMARY OF THE INVENTION

In accordance with this invention, a series of processes are used to integrate high-voltage and DMOS transistors with fully-isolated floating pockets of low-voltage CMOS, bipolar transistors, diodes, and passive circuit components. The processes eliminate the need for high temperature processing and epitaxy and employ "as-implanted" dopant profiles—ones where the final dopant profiles remain substantially unaltered from their original implanted profiles by any subsequent wafer processing steps. Together, the processes form a modular architecture which allows devices to be added or omitted to the IC and the corresponding process steps added to or removed from the integrated flow without the necessity of altering the processes used to produce the other devices on the IC.

Advantageously, the processes are performed on a substrate without an epitaxial layer and do not include the formation of an epitaxial layer.

Using these low-temperature processes, a number of unique high voltage and power devices may be fabricated and integrated into an IC in a modular fashion. Included are a non-isolated lateral DMOS, non-isolated extended drain or drifted MOS devices, a lateral trench DMOS, an isolated lateral DMOS, JFET and depletion-mode devices, along with P-N diode clamps and rectifiers and junction termination for low-voltage components floating at high voltages with respect to the substrate.

A process of fabricating the non-isolated DMOS includes the implantation of a conformal drift region through a field oxide layer; the implantation of a drain region within the drift region at a first end of the field oxide layer; the formation of a gate at a second end of the field oxide layer; and the implantation of a body region near the second end of the field oxide layer; and the implantation of a source region within the body region. The drift and body regions may be formed with chained implants to produce a non-Gaussian vertical dopant profile. The non-isolated DMOS may be fabricated in a drain-centric form. In one embodiment, the field oxide layer may be omitted and the drift and body regions may be fabricated with a chained implant to produce a non-Gaussian vertical dopant profile. In another series of embodiments, lateral DMOS is formed with a Zener diode clamp to create a more robust avalanche-rugged device. The device may also be formed with an extended drain, and the gate may or may not surround the drain.

A process of fabricating a non-isolated extended drain or drifted MOS device may create a drain-centric device with an extended drain that is self-aligned to the gate, which may surround the drain. The device may be formed in a non-Gaussian well. In an alternative embodiment, the device is asymmetric and the gate does not surround the drain. A CMOS pair may be fabricated using this asymmetric structure.

A process of fabricating a lateral trench DMOS (LTDMOS) may include the formation of a trench gate, the implantation of a drift layer which may extend to a level near the bottom of the trench, the formation of as-implanted body, preferably using a chain implant of varying implant energies and doses, and the formation of source and drain regions. This device may be fabricated in a trench gate-centric form. The LTDMOS may include a deep drain region which may be surrounded by a conformal drift region. The device may be fabricated in a drain-centric form. By the proper placement of field oxide segments at the surface of the semiconductor material, the device may include a conformal drift region having deeper portions in the vicinities of the trench and drain.

A process of fabricating an isolated lateral DMOS typically includes the implantation of a deep layer of opposite conductivity to the substrate. By implanting the deep layer through an opening in a field oxide layer, the deep layer may be in the form of a saucer, with edges that extend upward to the edges of the field oxide layer so as to form a isolated pocket. A body region may be implanted within the isolated pocket using a chained implant. A drift region may also be implanted into the pocket. Alternatively, the field oxide layer may be omitted, in which case the deep layer is substantially flat. The isolated pocket may be formed using an implanted well that extends downward from the semiconductor surface and overlaps the deep layer. The lateral DMOS may be symmetric about the body region.

A process of fabricating a junction field-effect transistor (JFET) may include the implantation of a drift region of opposite conductivity type to the substrate and the implantation of source, drain and body (gate) regions within the drift region. The source and drain regions are of the same conductivity type as the drift region; the body (gate) is of the same conductivity type as the substrate. The drain region may include a deep chained implant.

A process of fabricating a depletion-mode MOS device may include forming a gate over a semiconductor surface, implanting a drift region self-aligned to the gate, and implanting source and drain regions. The process may also include using a chained implant to form a deep drain region. In an alternative embodiment the drift region is implanted prior to the formation of the gate and is therefore not self-aligned to the gate. In yet another embodiment a deep conformal drift region is implanted prior to the formation of the gate. Each of the foregoing embodiments may be modified to include a subsurface shield to reduce the onset on NPN parasitic bipolar conduction and to suppress snapback effects. The depletion-mode device may also be fabricated in a fully isolated form with a deep isolation layer overlapped by an annular sidewall isolation wells that may also function as a deep drain.

A process for fabricating a diode may include using multiple or chained implants to form the anode or cathode, thereby forming a region wherein the deeper portions are more highly concentrated than the surface portions. An isolated diode may be formed by implanting a deep layer and annular wells that adjoin the deep layer and surround the anode and cathode regions.

A process of this invention may also be used to form a termination edge for floating isolated P-type pockets to high-voltages above the substrate. Variations of the process include the formation of metal or polysilicon field plates atop an interlevel dielectric or field oxide layer. The N-well that forms the sidewall of the isolation structure may extend laterally under the field oxide layer. Another embodiment includes a polysilicon field plate that overlaps the edge of the N-well and has a portion extending over the field oxide layer. In another embodiment the termination includes a deep N-drift region connected to the N-well and extending under the interlevel dielectric or field oxide layer. In some embodiments the deep N layer that forms the floor of the isolation structure extends laterally beyond the isolated pocket.

BRIEF DESCRIPTION OF THE DRAWINGS

FIG. 1A shows a low-side switch (LSS) with grounded body; FIG. 1B shows an isolated or discrete low-side switch (LSS) with an integral source-body short; FIG. 1C shows a high-side switch (HSS) with a grounded body; FIG. 1D shows an isolated or discrete high-side switch (HSS) with an integral source-body short; FIG. 1E shows a pass transistor with a grounded body; FIG. 1F shows an isolated or discrete AC switch with integral source-body shorts; FIG. 1G shows an isolated AC switch with body bias generator FIG. 2A is a cross-sectional view of a device with a schematic overlay of a parasitic NPN; FIG. 2B illustrates the phenomenon of impact ionization in the device shown in FIG. 2A; FIG. 2C is an $I_D$-$V_{DS}$ graph of the electrical characteristics of the device; FIG. 2D is a schematic representation of the device.

FIG. 3A shows a cross-sectional view of the completed device; FIG. 3B illustrates a self-aligned body implant; FIG. 3C illustrates a body diffusion; FIG. 3D illustrates the formation of a self-aligned body using a tilt implant; FIG. 3E illustrates a non-self-aligned body implant; FIG. 3F illustrates the stages of a body diffusion; FIG. 3G illustrates the formation of a non-self-aligned gate.

In FIG. 10A, the DMOS has a shallow N– drift drain region. In FIG. 10B, the DMOS has a uniform N-type deep drift region as a drain extension. In FIG. 10C, the DMOS has a conformal N-type drift region as a drain extension. In FIG. 10D, the DMOS has a conformal N-type well as drain extension.

FIG. 11A is a cross-sectional view of the device. FIG. 11B is a schematic representation of the device. FIG. 11C shows the $I_D$-$V_{DS}$ electrical characteristics of the device. FIG. 11D shows the equipotential distribution in the device at high voltages.

FIG. 17A shows the P-body juxtaposing the N-well drain. FIG. 17B shows the minimum field oxide spacing of the P-body and the N-well drain. FIG. 17C shows an extended uniform drift region. FIG. 17D shows an extended conformal drift region. FIG. 17E shows an N-well drain overlapping a P-body. FIG. 17F shows a device having no N-well drain.

FIG. 18A is a cross-sectional view. FIG. 18B is a plan view of a device with a reduced body width. FIG. 18C is a plan view of a device with staggered source-body contacts.

FIG. 27A shows a device with a shallow LDD drain. FIG. 27B shows a device with a uniform deep drifted drain. FIG. 27C shows a device with a conformal deep drifted drain.

FIG. 29A shows a device with a non-isolated N+ to P-well and an N+ to P-base or P-body. FIG. 29B shows a device with an isolated N+ to P-base or P-body. FIG. 29C shows a device with an isolated N+ to P-well. FIG. 29D shows a device with a multi-stripe isolated N-well to P-well buried Zener. FIG. 29E shows a device with an isolated P+ to N-base.

DESCRIPTION OF THE INVENTION

Figure 1A:
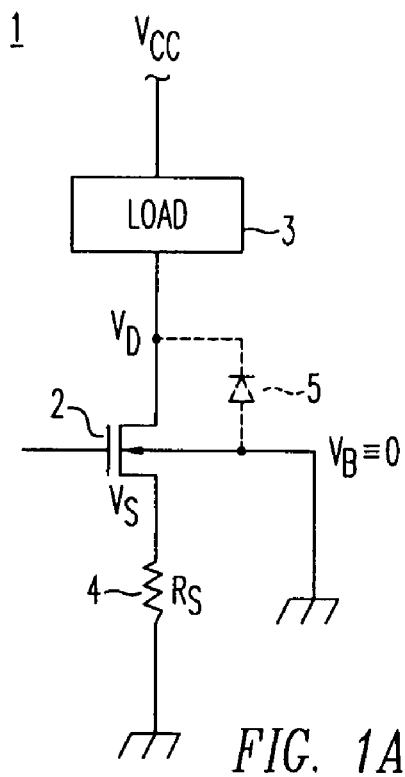
FIGS. 1A-1G are schematic diagrams of various NMOS switch-load topologies used in high-voltage and power applications.
Figure 1B:
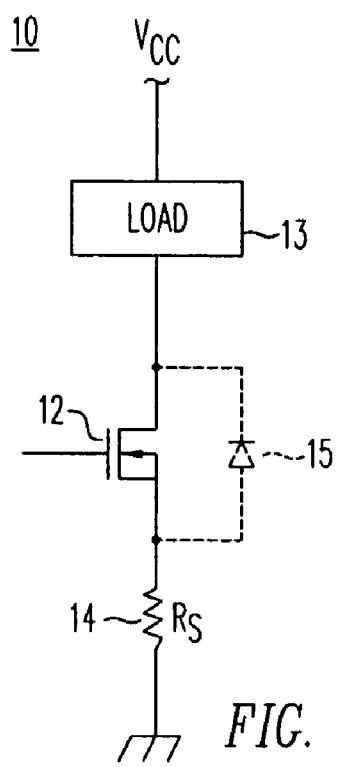
Figure 1C:
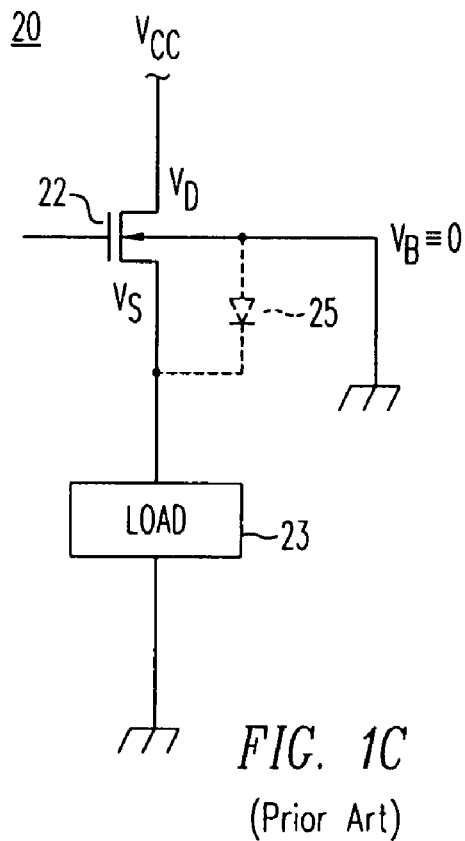
Figure 1D:
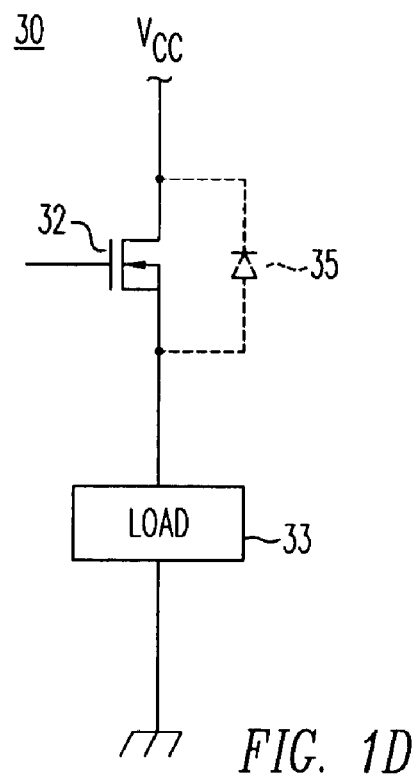
Figure 1E:
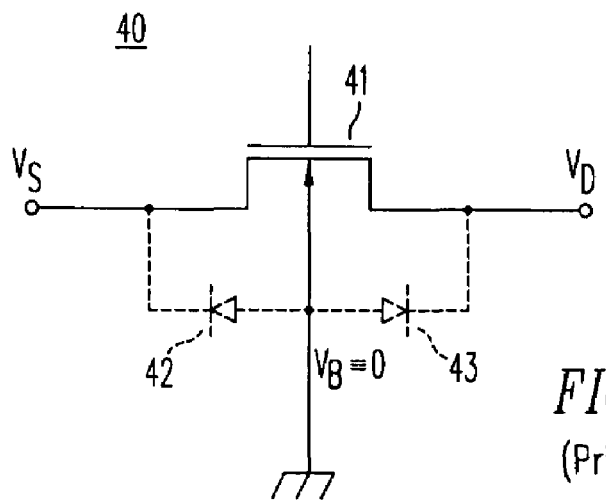
Figure 1F:
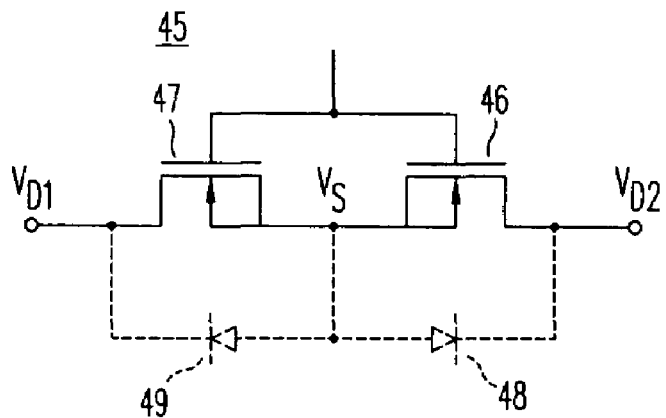
Figure 1G:
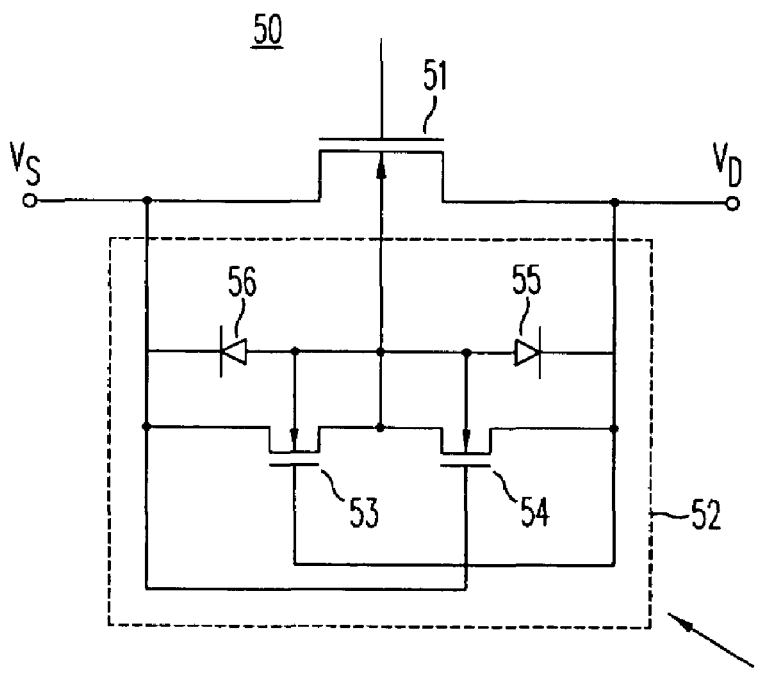

U.S. Pat. No. 6,855,985 describes an all low-temperature fabrication method using as-implanted junction isolation structures. This method employs high-energy and chain implants with dopant implanted through contoured oxides to achieve fully-isolated bipolar, CMOS and DMOS devices without the need for isolation diffusions, epitaxy or high temperature processes.

The subject matter in this application is related to the above-referenced patent and focuses on the design and integration of various kinds of new or improved high-voltage and DMOS devices, snapback prevention, isolated clamping diodes and rectifiers, and methods to float low-voltage devices in isolated pockets to high voltages above the substrate potential.

The low-temperature fabrication of the high-voltage devices described herein are compatible with the modular low-temperature fabrication methods described in the aforementioned patents and patent applications, but are not necessarily limited to modular process architectures.

Wafer Fabrication

Except as specifically noted, the fabrication of the high-voltage and power devices described herein utilizes the same process sequences that are described in the above referenced patents. A brief summary of the basic process flow includes Field oxide formation
Trench and trench gate formation including planarization
High-energy implanted deep drift layer (ND) formation
Chain-implant trench DMOS body (P-Body) formation
Phosphorus high-energy implanted floor isolation (DN) formation
First chain-implanted non-Gaussian N-well (NW1/NW1B) formation
First chain-implanted non-Gaussian P-well (PW1/PW1B) formation
Second chain-implanted non-Gaussian N-well (NW2/NW2B) formation
Second chain-implanted non-Gaussian P-well (PW2/PW2B) formation
Dual gate oxide and gate electrode formation
N-base implant
P-base implant
First N-LDD implant (NLDD1)
First P-LDD implant (PLDD1)
Second N-LDD implant (NLDD2)
Second P-LDD implant (PLDD2)
Sidewall spacer formation
ESD implant
N+ implant
P+ implant
Rapid thermal anneal (RTA implant activation)
Multilayer metal interconnect process
Passivation Since the process as described utilizes as-implanted dopant profiles with little or no dopant redistribution, implants may be performed in virtually any order except that it is preferred that the P-well and N-well implantation precede gate formation, the trench gate formation precede DMOS body implantation, N-LDD and P-LDD implants follow gate formation but precede sidewall spacer formation, and N+ and P+ implants follow sidewall spacer formation. This process flow is designed to be modular, so it is possible to eliminate one or more process steps for fabrication of a given IC, depending on which set of devices are required for that IC design.

By way of example, Table 1 summarizes a preferred embodiment and a preferred range of conditions for the implants described in this application:

TABLE 1

| Implant (Species) | Preferred Embodiment (Energy, Dose) | Preferred Range (Energy, Dose) |
|---|---|---|
| DN ($P^+$) | E = 2.0 MeV, Q = 2E13 $cm^{-2}$ | E = 1.0 MeV to 3.0 keV, Q = 1E12 to 1E14 $cm^{-2}$ |
| ND deep drift ($P^+$) | E = 800 keV, Q = 2E12 $cm^{-2}$<br>E = 600 keV, Q = 2E12 $cm^{-2}$ | E = 400 keV to 1.2 MeV, Q = 5E11 to 5E12 $cm^{-2}$<br>E = 300 keV to 900 keV, Q = 5E11 to 5E12 $cm^{-2}$ |
| P-body ($B^+$) | E = 120 keV, Q = 2E12 $cm^{-2}$<br>E = 80 keV, Q = 4E12 $cm^{-2}$ | E = 60 keV to 180 keV, Q = 5E11 to 5E12 $cm^{-2}$<br>E = 40 keV to 120 keV, Q = 1E12 to 1E13 $cm^{-2}$ |
| 1st P-well + ($B^+$) | E = 240 keV, Q = 1E13 $cm^{-2}$<br>E = 120 keV, Q = 6E12 $cm^{-2}$ | E = 120 keV to 360 keV, Q = 5E12 to 5E13 $cm^{-2}$<br>E = 60 keV to 180 keV, Q = 1E12 to 1E13 $cm^{-2}$ |
| 1st N-well + ($P^+$) | E = 460 keV, Q = 5E12 $cm^{-2}$<br>E = 160 keV, Q = 1E12 $cm^{-2}$ | E = 230 keV to 690 keV, Q = 1E12 to 1E13 $cm^{-2}$<br>E = 80 keV to 240 keV, Q = 5E11 to 5E12 $cm^{-2}$ |
| 2nd P-well + ($B^+$) | E = 460 keV, Q = 1E13 $cm^{-2}$<br>E = 160 keV, Q = 1E12 $cm^{-2}$ | E = 230 keV to 690 keV, Q = 5E12 to 5E13 $cm^{-2}$<br>E = 80 keV to 240 keV, Q = 5E11 to 5E12 $cm^{-2}$ |
| 2nd N-well + ($P^+$) | E = 950 keV, Q = 1E13 $cm^{-2}$<br>E = 260 keV, Q = 1E12 $cm^{-2}$ | E = 500 keV to 1.5 MeV, Q = 5E12 to 5E13 $cm^{-2}$<br>E = 130 keV to 390 keV, Q = 5E11 to 5E12 $cm^{-2}$ |
| N-base ($P^+$) | E = 300 keV, Q = 2E12 $cm^{-2}$<br>E = 120 keV, Q = 9E12 $cm^{-2}$ | E = 150 keV to 450 keV, Q = 5E11 to 5E12 $cm^{-2}$<br>E = 60 keV to 180 keV, Q = 5E12 to 5E13 $cm^{-2}$ |
| P-base ($B^+$) | E = 240 keV, Q = 6E12 $cm^{-2}$<br>E = 100 keV, Q = 6E12 $cm^{-2}$ | E = 120 keV to 360 keV, Q = 1E12 to 1E13 $cm^{-2}$<br>E = 50 keV to 150 keV, Q = 1E12 to 1E13 $cm^{-2}$ |
| NLDD1 ($P^+$) | E = 80 keV, Q = 2E13 $cm^{-2}$ | E = 40 keV to 160 keV, Q = 5E12 to 5E13 $cm^{-2}$ |
| PLDD1 ($BF_2^+$) | E = 80 keV, Q = 2E12 $cm^{-2}$ | E = 40 keV to 160 keV, Q = 5E11 to 5E12 $cm^{-2}$ |
| NLDD2 ($P^+$) | E = 80 keV, Q = 6E12 $cm^{-2}$ | E = 40 keV to 160 keV, Q = 1E12 to 1E13 $cm^{-2}$ |
| PLDD2 ($BF_2^+$) | E = 100 keV, Q = 3E12 $cm^{-2}$ | E = 50 keV to 150 keV, Q = 1E12 to 1E13 $cm^{-2}$ |
| N+ ($As^+$) | E = 30 keV, Q = 5E15 $cm^{-2}$ | E = 20 keV to 60 keV, Q = 1E15 to 1E16 $cm^{-2}$ |
| P+ ($BF_2^+$) | E = 30 keV, Q = 3E15 $cm^{-2}$ | E = 20 keV to 60 keV, Q = 1E15 to 1E16 $cm^{-2}$ |

Several of the above implants are potentially usable to form the drift regions of high voltage devices because the total implant dose is sufficiently low to support two-sided depletion spreading, and in some cases to allow complete depletion of the layer prior to the onset of avalanche breakdown. The phenomenon whereby surface electric fields in a device are reduced at high voltages by fully depleting a region of limited implant dose (or charge) is also referred to as "RESURF", an acronym for reduced surface fields. Historically, the term RESURF was used for epitaxial layers of limited charge while LDD, drift region, or drain extension referred to implanted layers. No distinction is made herein between the advantages of shallow LDD versus deep drift regions except that shallow LDD regions are typically self aligned to a MOS gate while deep high energy implanted drift regions (such as the ND implant) typically precede gate formation.

In one embodiment of this invention, the first and second wells in the above table refer to the 5V and 12V P-wells and N-wells used for fabricating 5V and 12V CMOS. The terms 5V and 12V are not used to be limiting but only describe two different P-type well concentrations and two-different N-type well concentrations, e.g. 3V and 15V, or 12V and 30V, 1.5V and 3V, etc. In general the lower voltage wells tend to be more heavily doped than the higher voltage wells, especially near the silicon surface, but with non-Gaussian dopant profiles comprising a combination of various implants differing in dose and energy, i.e. a chain implant, the lower voltage wells are not necessarily the higher in peak concentration, in average concentration, or in total implanted charge (dose). Higher voltage wells also tend to be deeper than N-wells optimized for low voltage devices. In one embodiment for example, the N-well and P-well for 5V CMOS utilize implants with a mean projected range of 0.4 to 0.5 microns, while the wells needed for 12V CMOS have a mean projected range between 0.7 to 1.1 microns in depth in active areas. The depth under the field oxide is reduced roughly by the thickness of the layer during implantation. The deep N-type drift may have a depth in active areas similar to 12V wells or slightly deeper.

The applicability of such a well as a drift region or extended drain depends on the two-dimensional electric field distribution at the onset of avalanche. In non-Gaussian and retrograde dopant profiles, the surface electric field and breakdown voltage does not track concentration as simply as it does in conventional diffused wells comprising purely Gaussian dopant profiles.

Consistent with this observation, in the subsequent figures each well is described by two graphical elements, a top portion e.g. labeled PW1 for first P-well; and a buried or deeper portion labeled PW1B for first buried P-well. To be buried beneath the well's top portion, the buried portion is implanted at a higher energy to reach a greater depth. Typically the buried portion of the well will also use a higher implant dose and exhibit a higher peak concentration than the surface portion, i.e. the dopant profile will be retrograde—more concentrated in the bulk than at the surface, although it is not required for manufacturing's sake. Retrograde profiles cannot be produced using conventional diffused junctions without the need for expensive epitaxial depositions and high temperature buried layer diffusions described previously.

The wells may in fact comprise any number of implants of differing energies and implant doses, to create arbitrary dopant profiles useful in both low-voltage CMOS and in high voltage device fabrication. For the sake of clarity we refer to the top and bottom well portions distinctly but collectively, we describe their combination as one well. For example, PW1 and PW1B together comprise a first P-well (e.g. for 5V devices), while PW2 and PW2B together comprise a second well for operation at higher voltages. In general the second well, being more lightly doped, is likely the better candidate to operate as a high voltage drift region, but may in fact be worse if its surface concentration is higher. In principle, designing the peak concentration and electric fields within a high voltage device to occur deeper in the semiconductor, away from the surface, should result in a more robust device useful at higher voltages.

Using the aforementioned process architecture, a number of unique high voltage and power devices may be fabricated and integrated into an IC in a modular fashion. These new high voltage devices include a non-isolated lateral DMOS, non-isolated extended drain or drifted MOS devices, a lateral trench DMOS, an isolated lateral DMOS, JFET and depletion-mode devices, along with P-N diode clamps and rectifiers and junction termination for low-voltage components floating at high voltages with respect to the substrate.

Non-Isolated Lateral DMOS

One type of high-voltage transistor fabricated using the low-temperature fabrication methods described herein is a non-isolated lateral DMOS transistor.

Figure 5A:
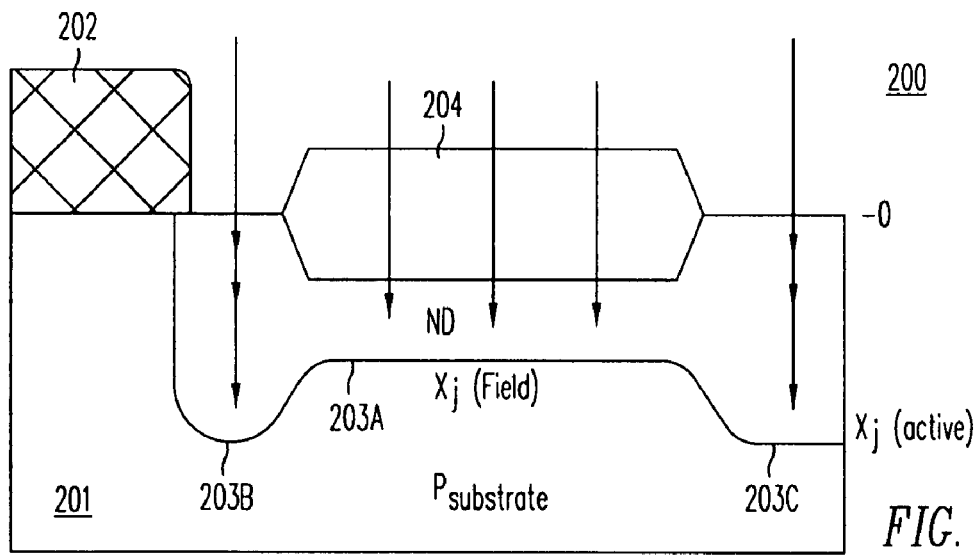
FIGS. 5A-5C are a series of cross-sectional views illustrating a low-temperature fabrication of a non-isolated lateral DMOS.
Figure 5B:
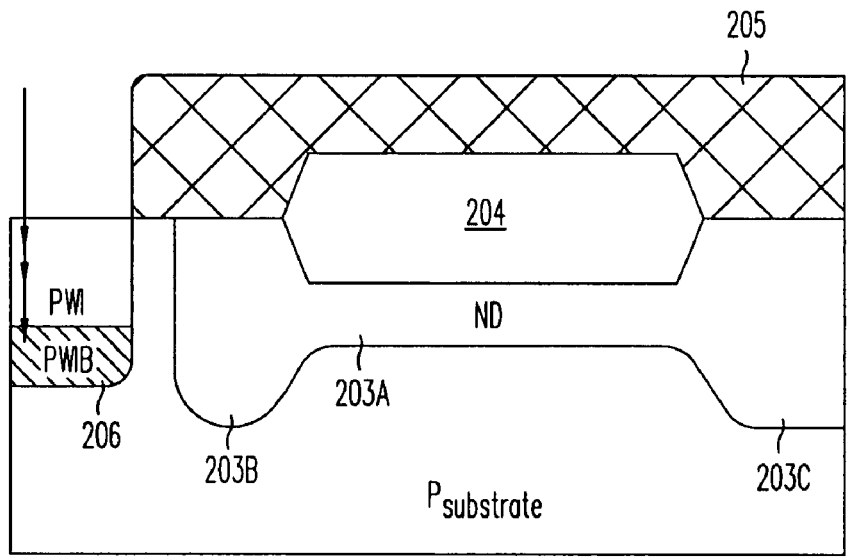
Figure 5C:
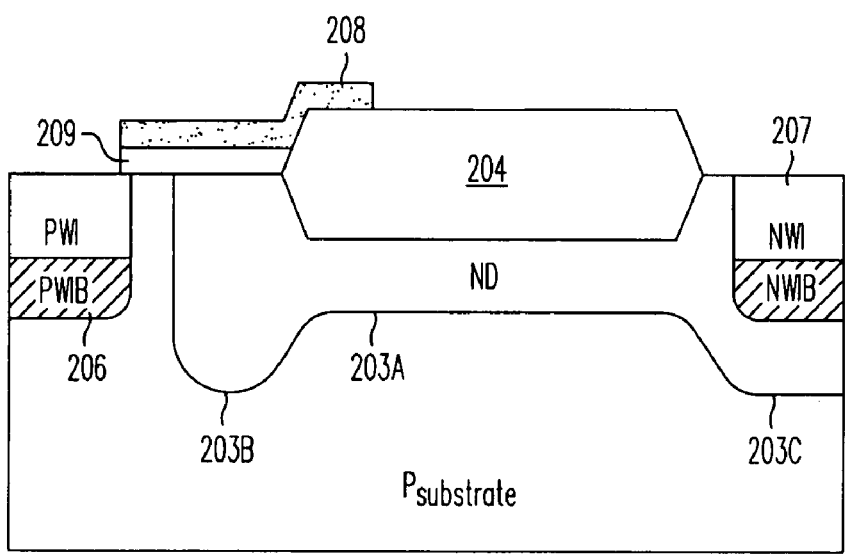

The fabrication of a non-isolated lateral DMOS transistor 200 is illustrated in cross section in FIGS. 5A-5C. The process includes a high-energy ion implantation of a lightly-doped N-type drift region through a contouring oxide. As shown in FIG. 5A, an implant contouring field oxide layer 204 formed in substrate 201 using LOCOS (for example), is selectively masked with photoresist 202 and implanted with a high-energy phosphorus drift implant to form a non-uniform, conformal drift region 203, with a shallower portion 203A beneath oxide 204 and deeper portions 203B and 203C beneath active areas not covered by field oxide layer 204. (Note: As used herein, the term "conformal" refers to a region or layer of dopant (a) that is formed by implantation through a layer (often an oxide layer) at the surface of the semiconductor material, and (b) whose vertical thickness and/or depth in the semiconductor material vary in accordance with the thickness and/or other features of the surface layer, including any openings formed in the surface layer.) No implant penetrates mask 202. The total integrated charge Q of deeper active areas 203B and 203C is greater than the shallower drift region 203A. The total charge present in the silicon is given by $$Q = \int_{x_1}^{x_j} N(x)dx$$

where in the case of active areas $x_1=0$, i.e. the silicon surface. For implants under the field oxide, $x_1$ is the interface between the field oxide and the underlying silicon. Since the implant is the same in both regions, the dopant in the silicon under the field oxide is less than in the active areas. Beneath the transition area from no oxide to full thickness, i.e. the bird's beak area, the total drift charge is graded, a natural artifact of the disclosed manufacturing process.

As shown in FIG. 5B, a P-type well 206 is introduced into an area adjacent drift region 203 by ion implantation through photoresist mask 205. In the final device, this P-well will serve as the body of the lateral DMOS but because it precedes the gate formation, it is not self-aligned to the transistor's gate. Unlike a conventional diffused well which has its peak concentration near the surface and a monotonically decreasing concentration with increasing depth, P-type well 206 is formed by high energy ion implantation of boron, and preferably by a boron chain implant comprising a series of boron implants varying in dose and energy. The chain implant, while it may comprise any number of implants, is graphically represented in the drawing by two regions—a surface layer PW1, and a subsurface layer PW1B, formed by ion implantation through a single mask and without the use of epitaxy. In a preferred embodiment the deeper layer is more highly concentrated than the surface well.

In FIG. 5C, N-well 207 is introduced into the drain region of the DMOS inside N-type drift region 203C to reduce the transistor's drain resistance and to further shape the electric field in the drain to reduce pre-avalanche impact ionization. To avoid dopant redistribution from high temperature diffusion, N-well 207 is formed using high energy ion implantation of phosphorus, and preferably by a phosphorus chain implant comprising a series of phosphorus implants varying in dose and energy. The chain implant, while it may comprise any number of implants, is graphically represented in the drawing by two regions—a surface layer NW1, and a subsurface layer NW1B, formed by ion implantation through a single mask and without the use of epitaxy. In a preferred embodiment the deeper layer is more highly concentrated than the surface well.

While the cross section illustrates a first P-well 206 and a first N-well 207 which may for example represent P-well PW1 and N-well NW1 used for 5V CMOS, it is also possible to utilize a second P-well and a second N-well such as PW2 and NW2 optimized for other voltage CMOS, e.g. 12V or 20V devices.

After well formation, gate oxide 209 is grown, a polysilicon layer is deposited and patterned to form gate 208. This gate is preferably positioned above a portion of P-type well 206 and a portion of drift layer 203 to insure proper transistor action.

Aside from its all low temperature fabrication and integration into a fully-modular process architecture, N-channel lateral DMOS device 200 offers other advantages over conventionally fabricated lateral DMOS including reduced surface electric fields under the gate corresponding to less hot carrier generation resulting from its lower well surface concentration; enhanced subsurface electric fields from the heavily-doped deeper portion of the P-well 206 forcing avalanche breakdown into the bulk and away from the semiconductor's surface; and, improved gain and lower on-resistance resulting from a shorter length of gate 208 located atop active areas, the shorter gate made possible by the nearly vertical sidewall junction of chain-implanted P-well 206. In contrast, diffused well DMOS require longer gates to cover the larger lateral dimensions of a high-temperature diffused well.

Figure 6:
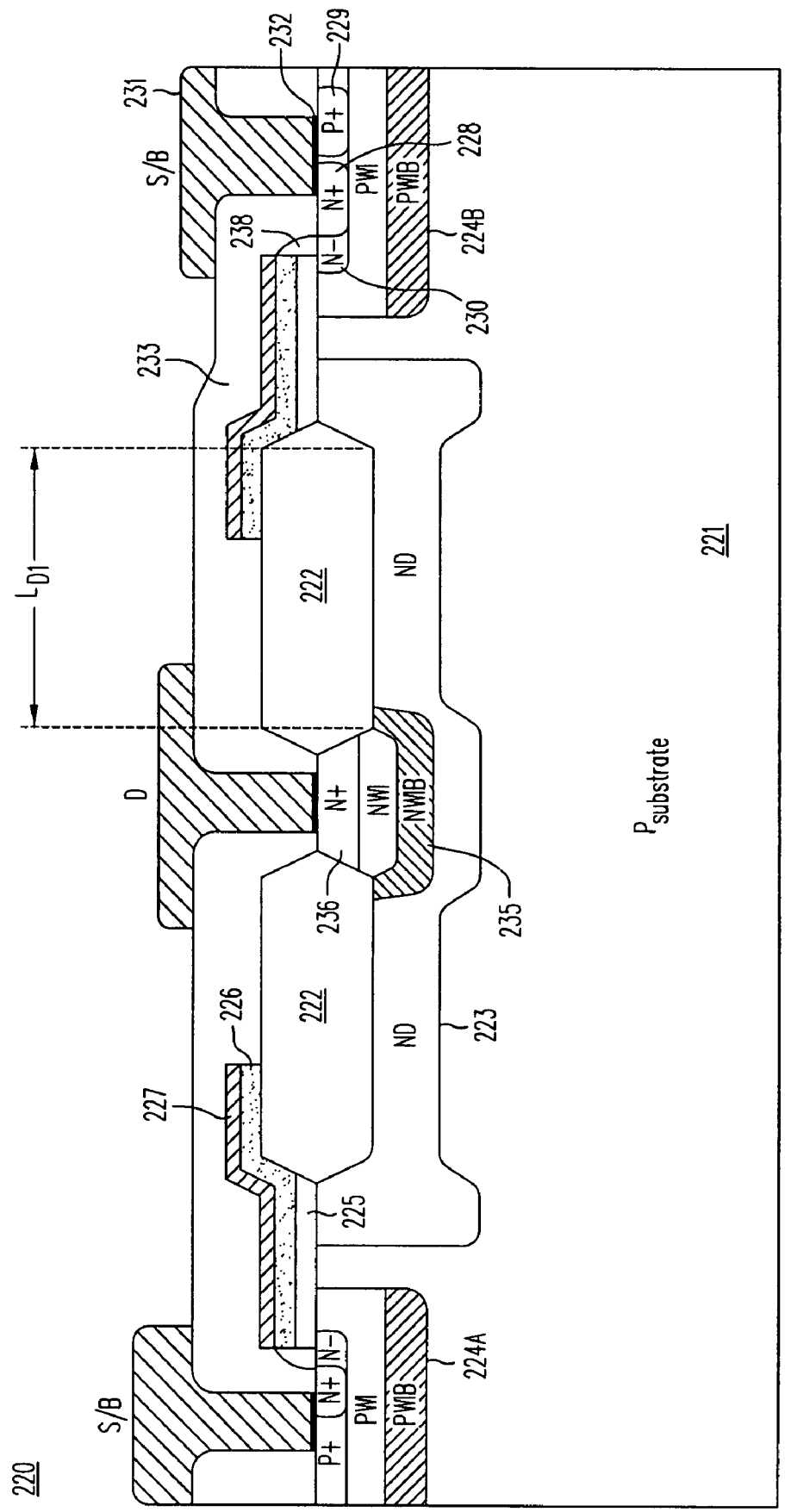
FIG. 6 illustrates a cross-sectional view of a non-isolated lateral DMOS with a non-Gaussian P-type well and a conformal N-type drift region.

An example of drain-centric lateral DMOS 220 using a non-Gaussian P-type well and conformal N-type drift is shown in cross section in FIG. 6. The device comprises drift 223 conforming to field oxide layer 222 with N-well drain 235, N+ drain 236, N+ source 228 with lightly doped extension 230, P+ body contact 229, polysilicon gate 226 with overlying silicide 227 formed atop gate oxide 225, interlevel dielectric (ILD) 233, metal interconnect 231 with contact barrier metal 232. The drift length $L_{D1}$, as measured from the edge of the active gate to the edge of active N-well NW1 can be adjusted to select the breakdown voltage of the device without substantially altering the manufacturing process. In this device the DMOS body is formed by P-wells 224A and 224B which may comprise a stripe geometry or an annular geometry, enclosing the drain on all or a few sides. (Note: As used herein, the term "annular" refers to a doped region or other structure that laterally surrounds a feature in an IC chip. The annular region or structure may be circular, square, rectangular, polygonal or any other shape, and the annular region or other structure may or may not be in contact with the feature that it laterally surrounds.) The P-well as shown comprising a non-Gaussian or non-monotonic profile represented by a top portion PW1 and a subsurface portion PW1B, where in a preferred embodiment PW1B is more heavily doped than PW1, and in an alternative embodiment P-wells 224A and 224B comprise a series of chained implants differing in dose and energy.

Figure 7:
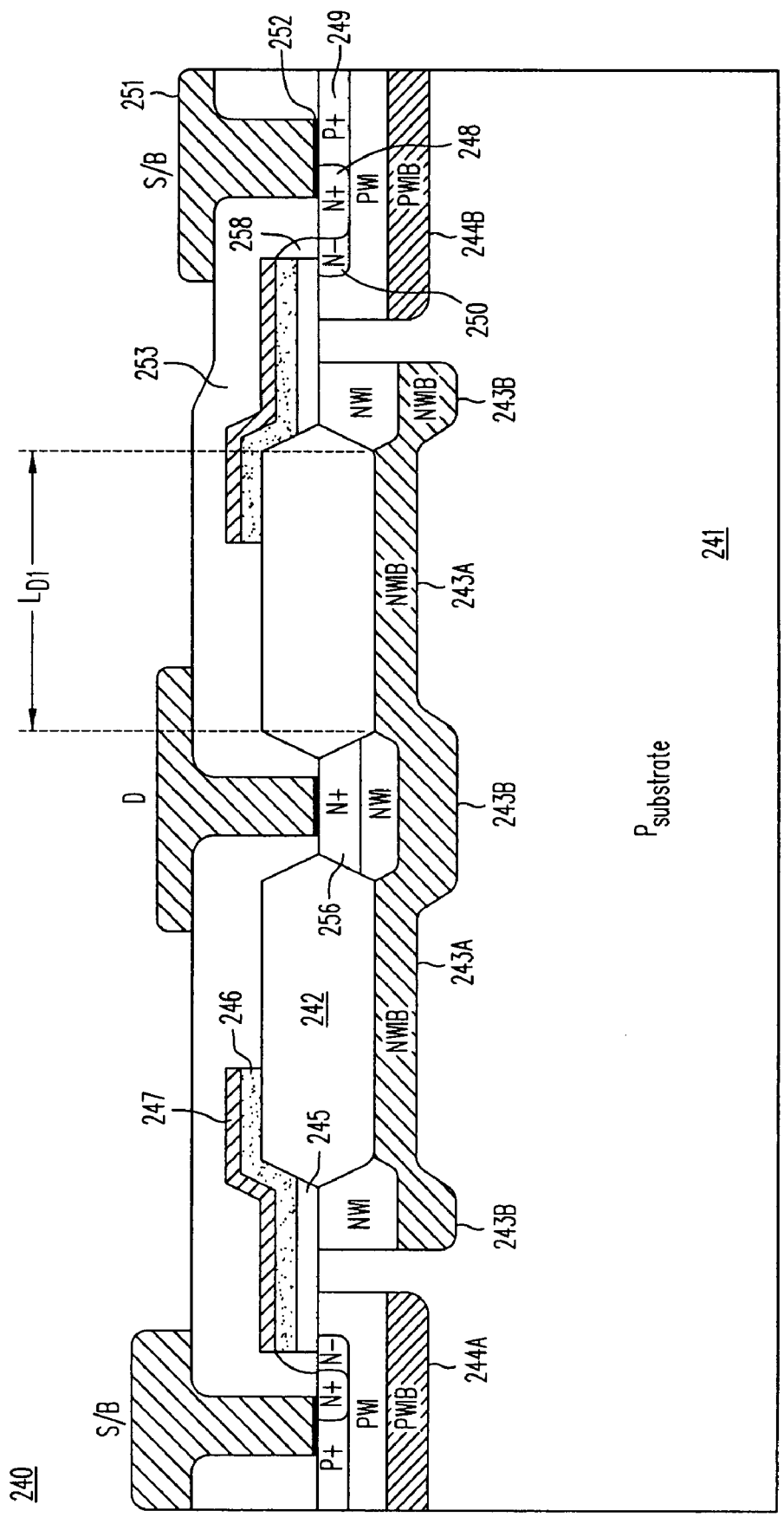
FIG. 7 is a cross-sectional view of a non-isolated lateral DMOS with a non-Gaussian P-type well and a drift region comprising a conformal N-type chain-implanted well.

FIG. 7 illustrates in cross section a non-isolated lateral DMOS 240 with non-Gaussian P-type well and drift comprising a conformal N-type chain-implanted well. The device comprises drift 243 conforming to field oxide layer 242, with N+ drain 256, N+ source 248 with lightly doped extension 250, P+ body contact 249, polysilicon gate 246 with overlying silicide 247 formed atop gate oxide 245, ILD 253, metal interconnect 251 with contact barrier metal 252. In this device the DMOS body is formed by P-wells 244A and 244B which may comprise a stripe geometry or annular, enclosing the drain on all or a few sides. Each of the P-wells 244A and 244B is shown comprising a non-Gaussian or non-monotonic profile represented by a top portion PW1 and a subsurface portion PW1B, where in a preferred embodiment PW1B is more heavily doped than PW1, and in an alternative embodiment P-wells 244A and 244B comprise a series of chained implants differing in dose and energy.

The drift 243, constructed of a chain implanted N-well, comprises a deep portion NW1B and a shallower portion NW1. The shallower portion NW1 is located in active areas such as 243B. Non-active areas such as 243A include only the deep portion NW1B, reducing series drain resistance without increasing the electric field under gate oxide 245. The drift length $L_{D1}$, measured from the edge of the active gate to the edge of active N-well NW1, can be adjusted to select the breakdown voltage of the device without substantially altering the manufacturing process. In general, a higher total integrated charge in the drift is preferable in low-voltage drifted-drain devices. A first N-well and P-well may be substituted by a second N-well and P-well in varying combinations depending on the dopant profiles and the intended voltage range of the device.

Figure 8:
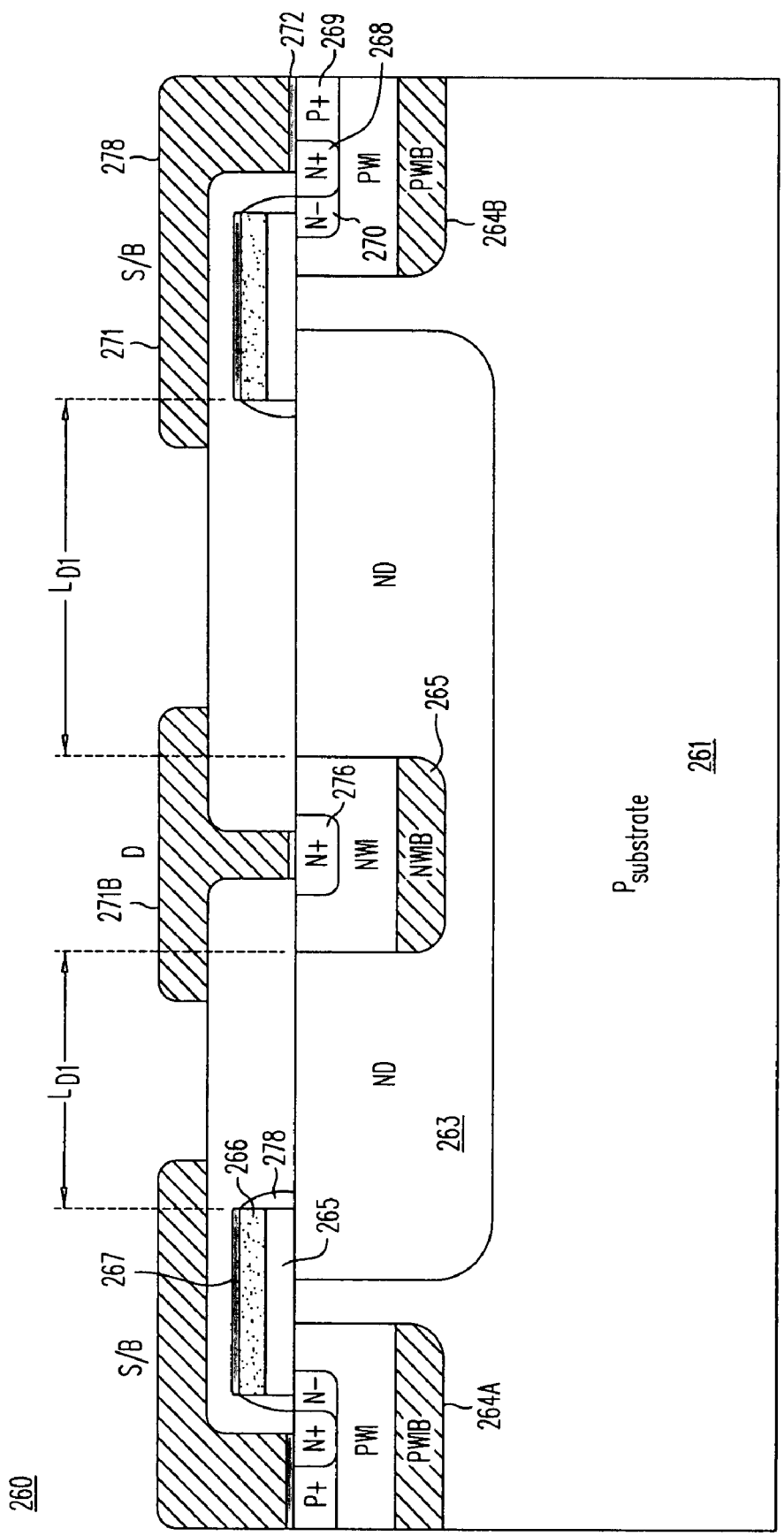
FIG. 8 is a cross-sectional view of a non-isolated lateral DMOS with a non-Gaussian P-type well and a uniform N-type drift region.

FIG. 8 illustrates in cross section a non-isolated lateral DMOS 260 comprising a non-Gaussian P-type well and an N-type drift formed in active regions only (not under field oxide). The device comprises drift 263, N-well drain 265, N+ drain 276, N+ source 268 with a lightly doped extension 270, P+ body contact 269, polysilicon gate 266 with overlying silicide 267 formed atop gate oxide 265, ILD 273, metal interconnect 271 with contact barrier metal 272. In this device the DMOS body is formed by P-wells 264A and 264B which may comprise a stripe geometry or an annular geometry, enclosing the drain on all or a few sides. The P-well is shown comprising a non-Gaussian or non-monotonic profile represented by a top portion PW1 and a subsurface portion PW1B, where in a preferred embodiment PW1B is more heavily doped than PW1, and in an alternative embodiment P-wells 264A and 264B comprise a series of chained implants differing in dose and energy.

The drift 263, constructed of a high energy implanted drift layer ND, is optimized for avalanche and breakdown characteristics. Multiple implants with various doses and energies may be combined to form the drift layer ND. The drift length $L_{D1}$, as measured from the edge of the gate to the edge of N-well NW1 can be adjusted to select the breakdown voltage of the device without substantially altering the manufacturing process. In general, a higher total integrated charge in the drift is preferable in low-voltage drifted-drain devices. A first N-well and P-well may be substituted by a second N-well and P-well in varying combinations depending on the dopant profiles and the intended voltage range of the device.

The source metal interconnect 271A and 271C is shown extending over and beyond the gate 266 to overlap a portion of drift 263. This optional layout allows the source metal to serve as a field plate to reduce the electric field crowding near the end of the gate, thereby increasing the breakdown voltage of DMOS 260. Note that this layout is optional and may be applied to all other DMOS devices in this description, as well.

Figure 9:
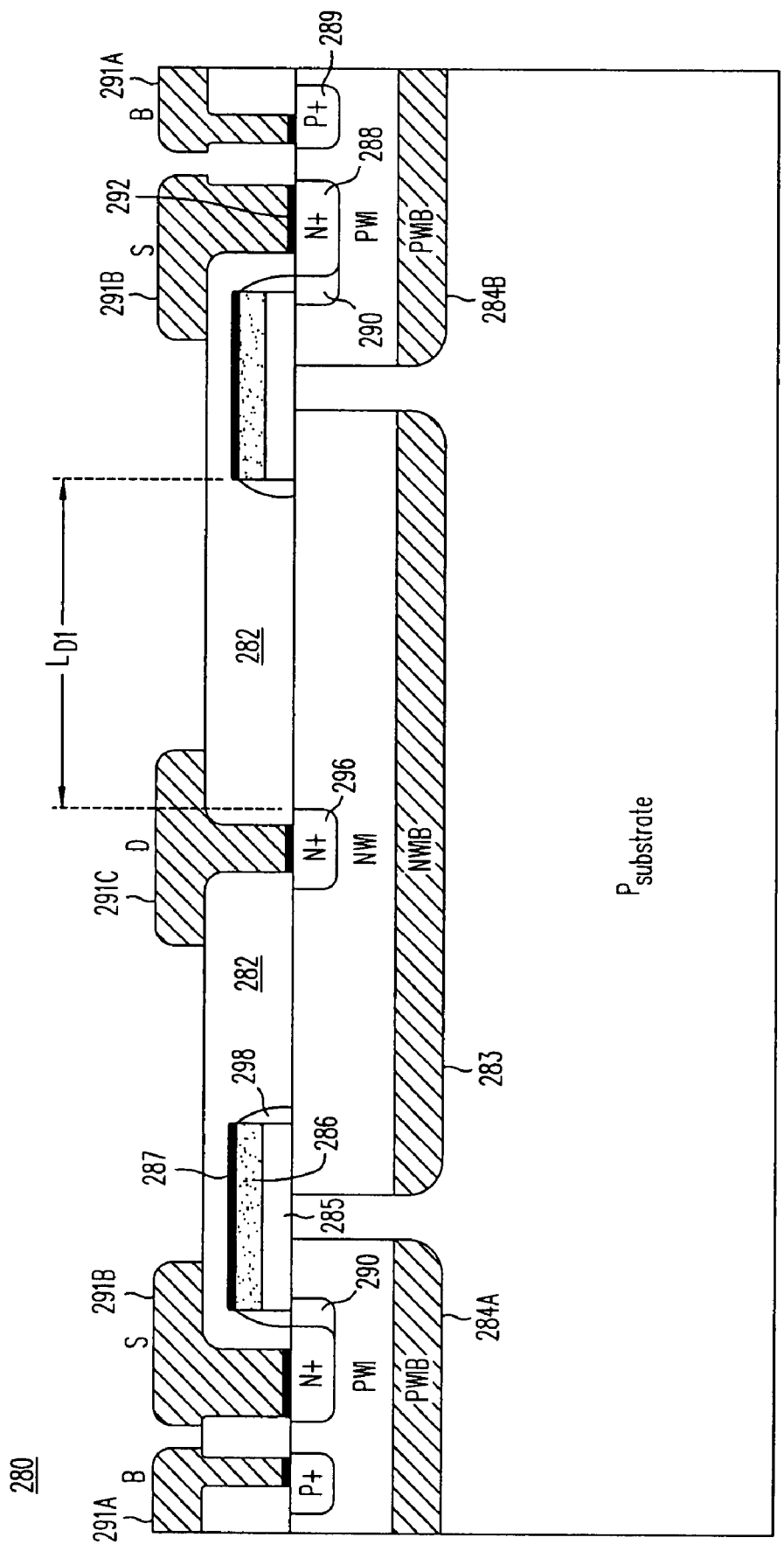
FIG. 9 is a cross-sectional view of a non-isolated lateral DMOS with a non-Gaussian P-type well and a drift region comprising a uniform N-type chain-implanted well.

FIG. 9 illustrates in cross section a non-isolated lateral DMOS 280 with a non-Gaussian P-type well and a drift region comprising uniform N-type chain-implanted well. The device utilizes a drift comprising a chain-implanted N-well 283 formed in active areas only (not under field oxide), N+ drain 296, N+ source 288 with a lightly doped extension 290, P+ body contact 289, polysilicon gate 286 with overlying silicide 287 formed atop gate oxide 285, ILD 282, metal interconnect 291 with contact barrier metal 292. In this device the DMOS body is formed by P-wells 284A and 284B which may comprise a stripe geometry or an annular geometry, enclosing the drain on all or a few sides. Each of P-wells 284A and 284B is shown comprising a non-Gaussian or non-monotonic profile represented by a top portion PW1 and a subsurface portion PW1B, where in a preferred embodiment PW1B is more heavily doped than PW1, and in an alternative embodiment P-wells 284A and 284B comprise a series of chained implants differing in dose and energy.

The drift, constructed of a chain-implanted N-well 283, comprises a non-Gaussian or non-monotonic profile represented by a top portion NW1 and a subsurface portion NW1B, where in a preferred embodiment NW1B is more heavily doped than NW1, and in an alternative embodiment N-well 283 comprises a chain-implant constructed using a series of implants differing in dose and energy.

The drift length $L_{D1}$, measured from the edge of the gate 286 to the edge of the N+ drain 296, can be adjusted to select the breakdown voltage of the device without substantially altering the manufacturing process. In general higher total integrated charge in the drift is preferable in low-voltage drifted-drain devices. A first N-well and P-well may be substituted by a second N-well and P-well in varying combinations depending on the dopant profiles and the intended voltage range of the device.

In FIG. 9, the N+ source 288 is shown separated from P+ body contact 289, and source metal interconnect 291B is shown separated from the body metal interconnect 291A. This optional layout allows the source voltage to float above the body voltage up within the limitation of the source to body breakdown voltage (typically several volts) and may be used to allow sensing of the current flowing through DMOS 280. Note that this layout is optional and may be applied to all other DMOS devices in this description, as well.

Note that many features shown in FIGS. 6-9 are for illustrative purposes only, and that modifications to these structures are within the scope of this invention. The lightly doped source extension 230 of FIG. 6, for example, is not necessary for operation of the LDMOS devices, and alternative embodiments in which this region is replaced by a more heavily-doped source extension may actually provide better on-state characteristics. While only a single level of metal interconnect is shown in these examples, preferred embodiments will of course comprise additional levels of metallization that serve to lower the on-resistance of the DMOS devices and could also form source and/or drain field plates, internal bussing for the gate, etc. The metallization layer is shown extending into the ILD layer, but other preferred embodiments will use a metal plug (e.g. tungsten) to fill the contact hole in the ILD layer, and a planar metallization layer on top of the ILD layer. The field oxide layers are shown to comprise LOCOS, but alternate structures such as deposited or grown and etched back oxide, recessed oxide, and non-oxide dielectric materials may also be employed.

FIGS. 10A-10D illustrate a modifications of the aforementioned lateral DMOS with a Zener diode clamp. This produces a more robust avalanche-rugged device, even though the breakdown voltage is decreased by the presence of the clamp. The increased ruggedness results from forcing avalanche into the bulk silicon beneath the drain, far away from the MOS gate.

Figure 10A:
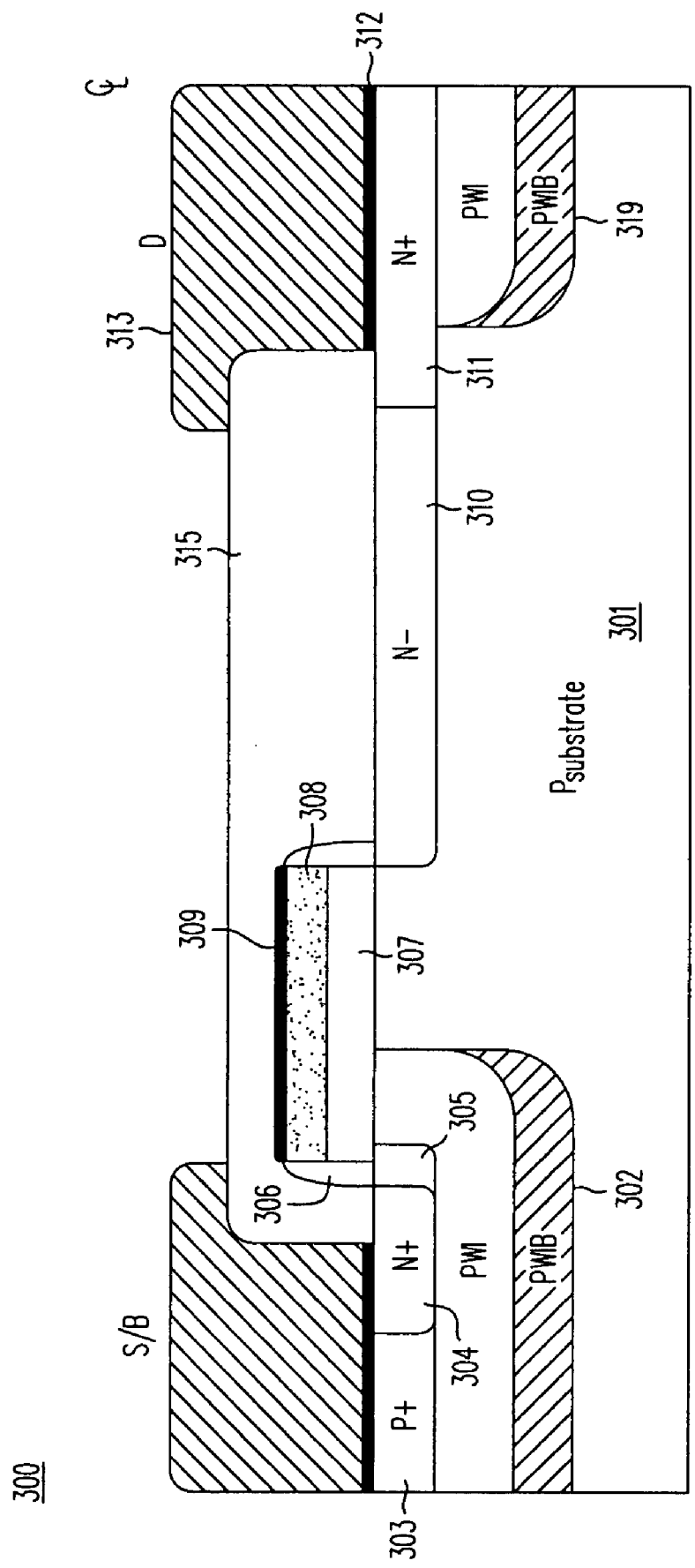
FIGS. 10A-10D are cross-sectional views of a non-isolated lateral DMOS with a non-Gaussian P-type well as DMOS body and an avalanche clamped drain.

In the lateral DMOS 300 of FIG. 10A, for example, the Zener clamp comprises P-well 319 located beneath N+ drain 311. The same P-well implant steps may be used to form P-well 319 and P-well 302, the non-Gaussian body of the lateral DMOS 300. Alternatively, different P-well implant steps may be used to form P-wells 319 and 302. P-wells 319 and 302 as shown comprise a non-Gaussian or non-monotonic profile, represented by a top portion PW1 and a subsurface portion PW1B. In a preferred embodiment PW1B is more heavily doped than PW1, and in an alternative embodiment comprises a chain-implant of multiple implants differing in dose and energy. The drain extension in this device comprises a shallow N− drift 310 which may also be used for 12V NMOS devices. The remaining elements of the device are similar to the aforementioned lateral DMOS, including N+ source 304, P+ body contact 303, gate oxide 307, poly gate 308, silicide 309, sidewall spacer 306, N− source extension 305, ILD 315, barrier metal 312, and metal interconnect 313.

Figure 10B:
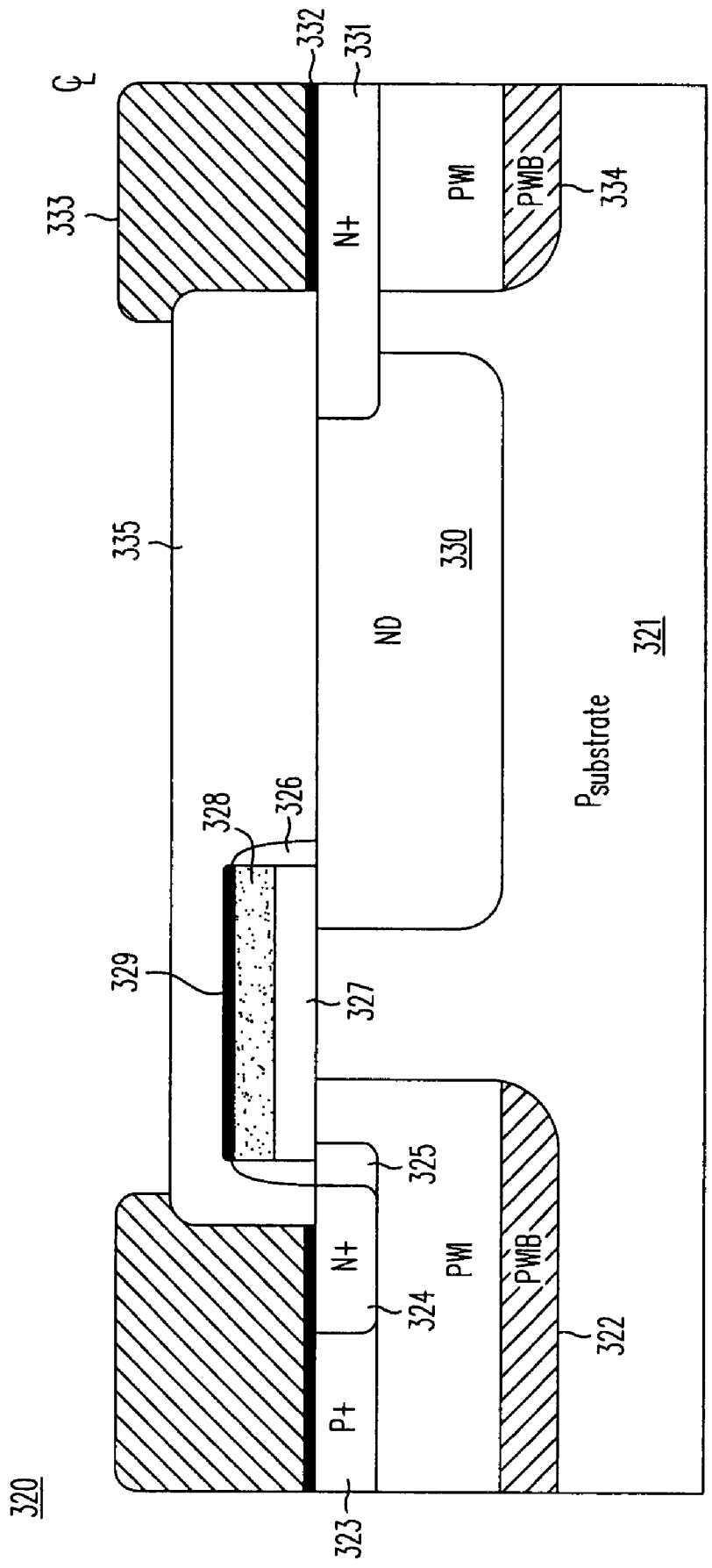

An avalanche clamped lateral DMOS 320 is shown in FIG. 10B with a high-energy implanted drift 330 and P-well clamp 334, similar to a voltage clamped version of DMOS 260 of FIG. 8.

Figure 10C:
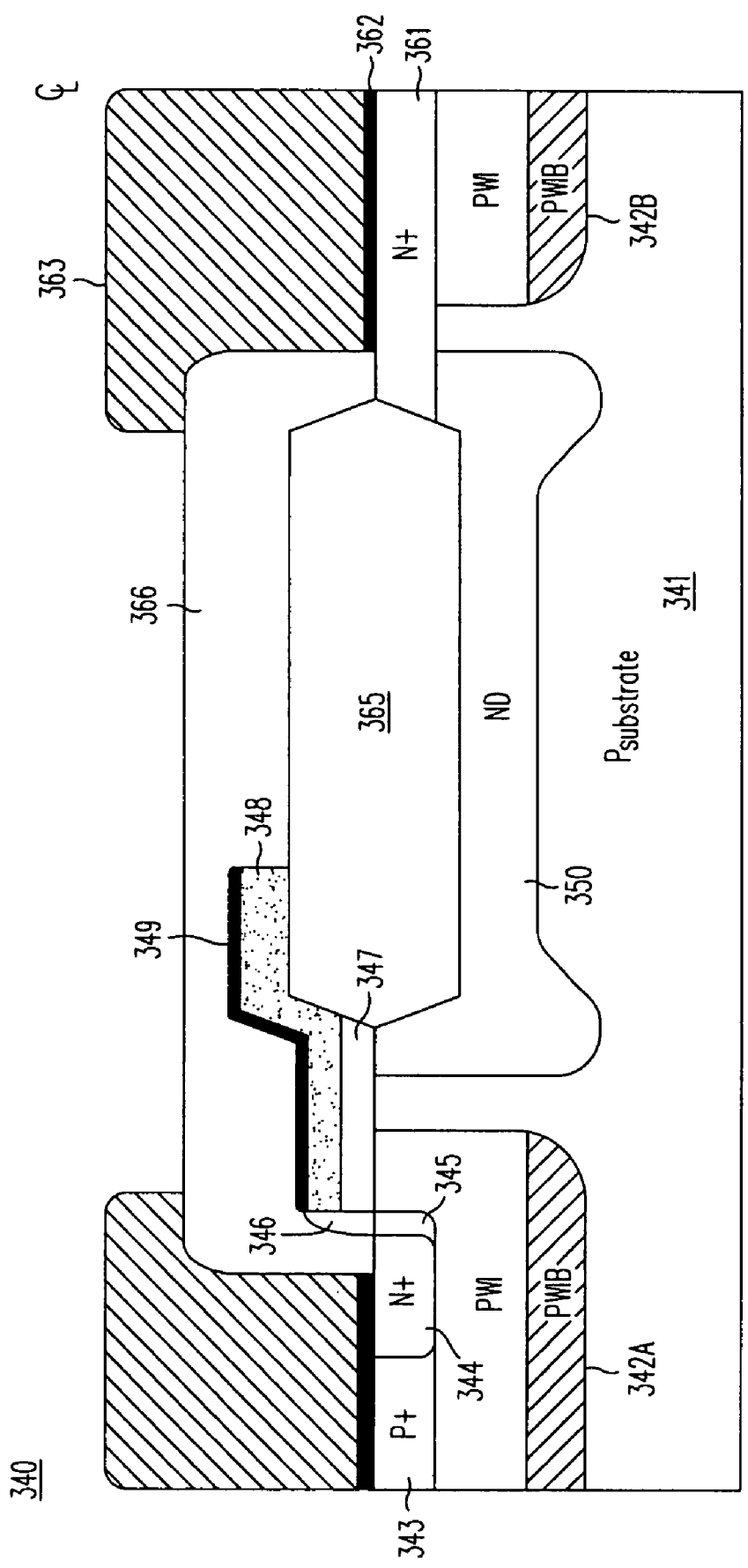

An avalanche clamped lateral DMOS 340 is shown in FIG. 10C with a conformal high-energy implanted drift 350 and P-well clamp 342B, similar to a voltage clamped version of DMOS 220 of FIG. 6.

Figure 10D:
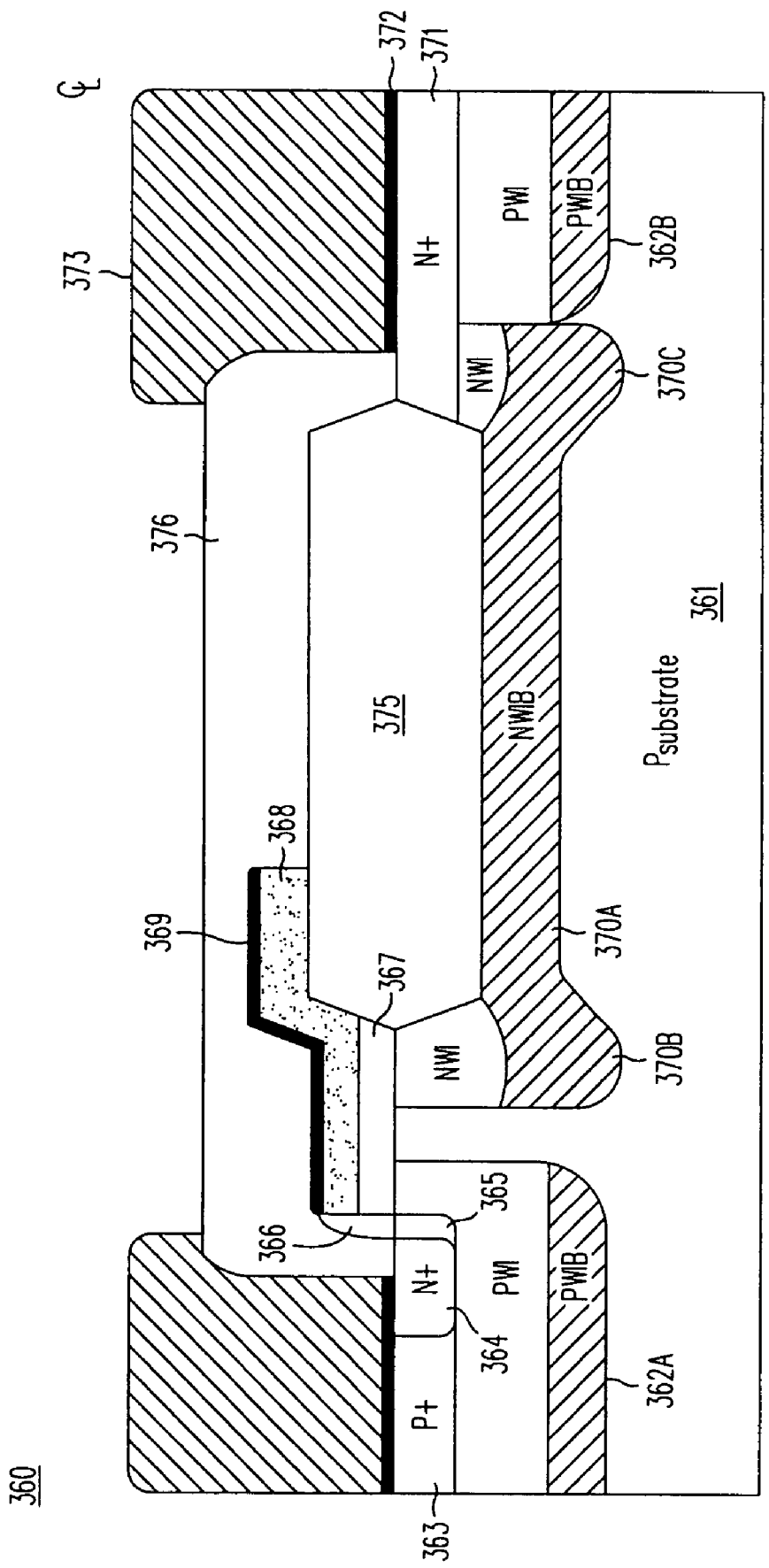

Another avalanche clamped lateral DMOS 340 is shown in FIG. 10D using chain-implanted N-well 370A as a drift with P-well clamp 362B, similar to a voltage clamped version of DMOS 240 of FIG. 7.

It should be noted that the devices of FIGS. 10A-10D are shown as symmetrical, with the centerline of the device at the right side of the drawing. This is not required, however.

Figure 11A:
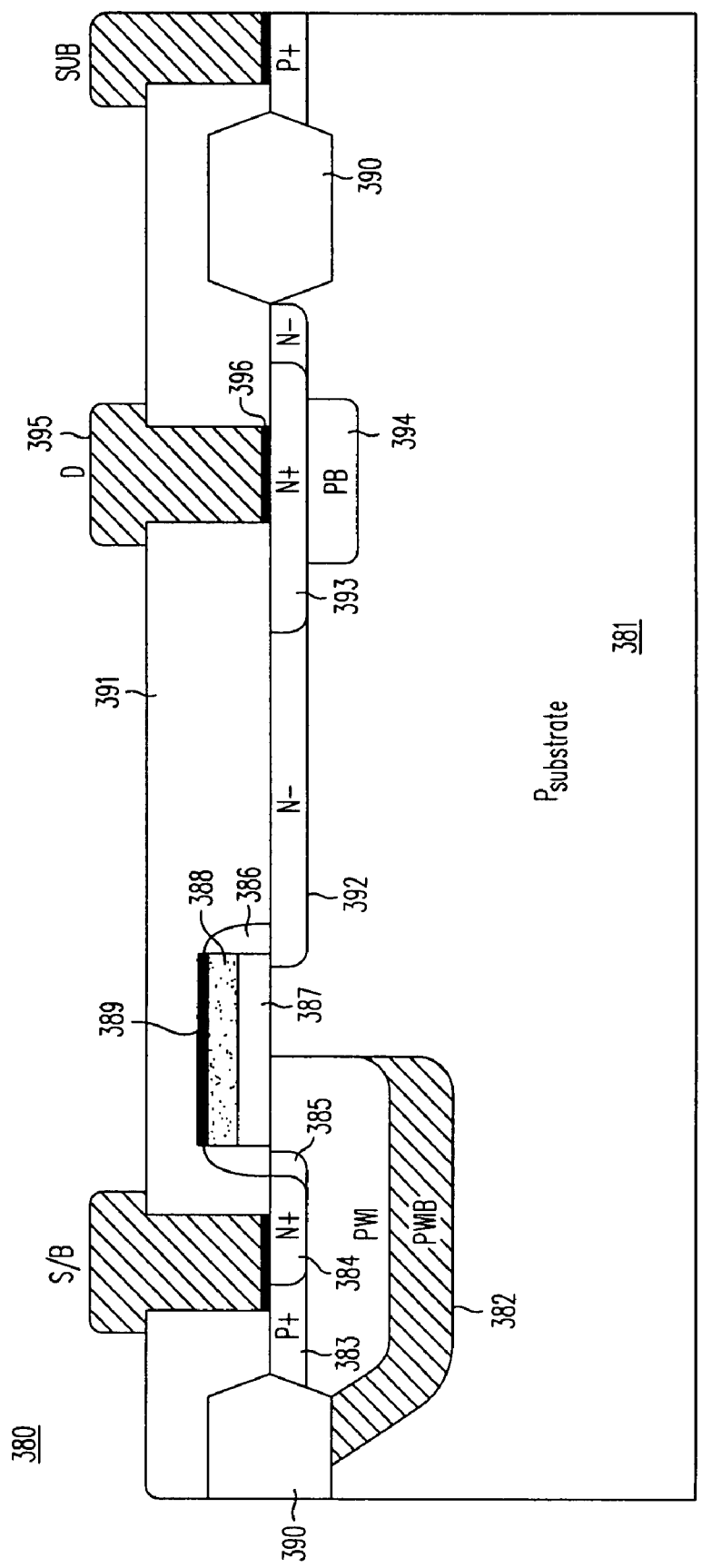
FIGS. 11A-11D illustrate aspects of avalanche clamping of a non-isolated lateral DMOS using a P-body (or P-base).

Drain voltage clamping can also be accomplished using a shallower P-type region than a P-well. In lateral DMOS 380 of FIG. 11A, for example, the Zener clamp comprises P-base or P-body 394 located beneath N+ drain 393. P-well 382 forms the body of the lateral DMOS 380, comprising a non-Gaussian or non-monotonic profile represented by a top portion PW1 and a subsurface portion PW1B. In a preferred embodiment, PW1B is more heavily doped than PW1, and in an alternative embodiment comprises a chain-implant of multiple implants differing in dose and energy. The drain extension in this device comprises a shallow N− drift region 392 which may also be used for 12V NMOS devices. The remaining elements of the device are similar to those in the aforementioned lateral DMOS devices, including N+ source 384, P+ body contact 383, gate oxide 387, gate 388, silicide 389, sidewall spacer 386; N− source extension 385, ILD 391, barrier metal 396, and metal interconnect 395.

Figure 11B:
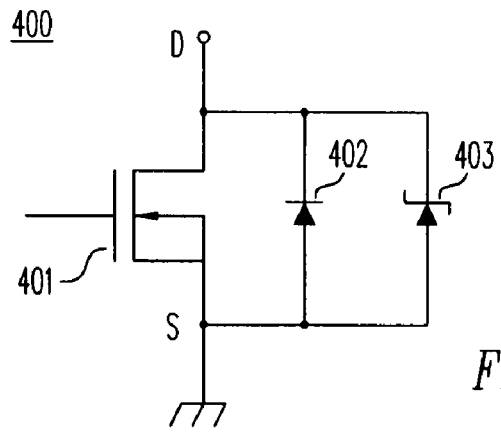

Subcircuit schematic 400 of FIG. 11B illustrates the concept of integrated lateral DMOS voltage clamping schematically, where NMOS 401 illustrates the N-channel DMOS, diode 402 represents the $BV_{DSS}$ of the unclamped transistor, and Zener diode 403 illustrates the integrated drain voltage clamp.

Figure 11C:
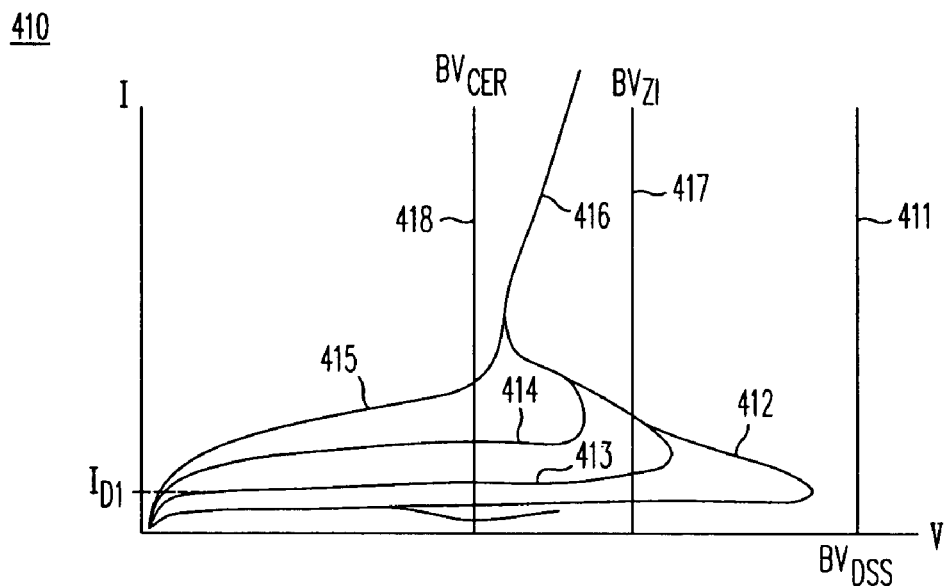

FIG. 11C illustrates the $I_D$-$V_{DS}$ characteristics 410 of the voltage clamped lateral DMOS. The family of curves 412, 413, 414, and 415 represent increasing drain current corresponding to increasing gate drives. At higher current the maximum sustained voltage $BV_{CER}$ is shown by curve 416, virtually independent of gate drive. This voltage is substantially below the off-state breakdown $BV_{DSS}$ shown by curve 411. Snapback from $BV_{DSS}$ breakdown 411 to the lower $BV_{CER}$ value 416 can result in excess current and device damage. To absolutely avoid snapback, the Zener breakdown voltage $BV_{Z2}$ shown as curve 418 must be set below $BV_{CER}$ 416. This degree of voltage clamping may overly limit the operating voltage range of a voltage clamped lateral DMOS. Noting that curve 413 shows a substantial negative resistance but requires a certain current level $I_{D1}$ to invoke snapback, a clamp voltage $BV_{Z1}$, shown by curve 417 lower than $BV_{DSS}$ but greater than $BV_{CER}$ may be sufficient to achieve robust operation without substantially restricting the operating voltage range.

Figure 11D:
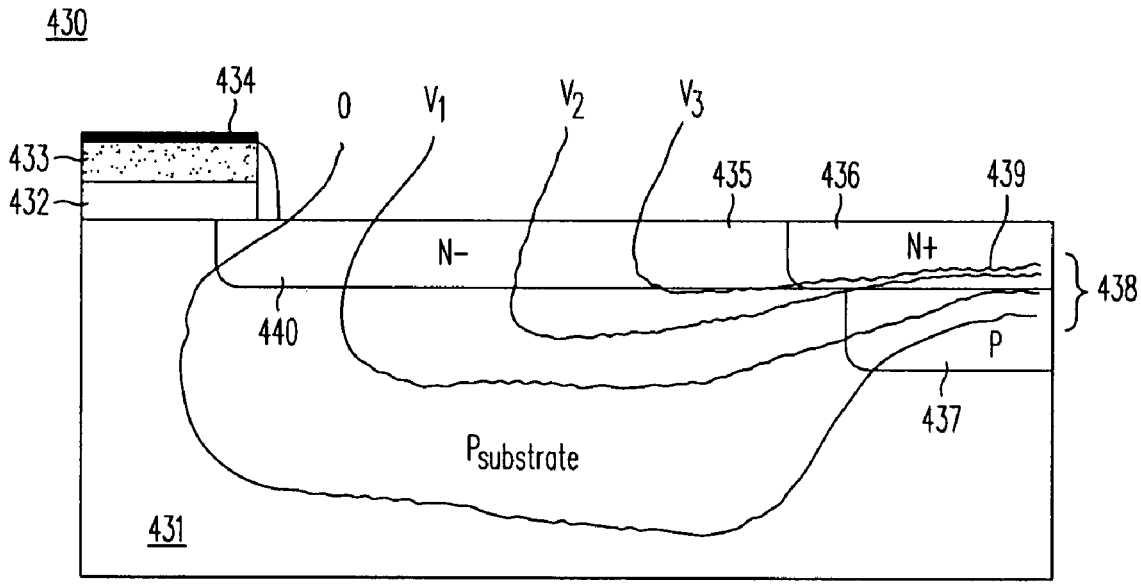

FIG. 11D is a simplified cross-sectional view 430 which illustrates the clamping action of the drain voltage clamp and its effect on the equipotential lines 438. In this device, the applied voltage on N+ drain 439 causes N− drift 440 to deplete allowing equipotential lines 438 to spread across the drift region 435 in voltage increments 0, $V_1$, $V_2$, and $V_3$, thereby maintaining a low electric field near gate oxide 432 and gate 433. The action of P-type layer 437 is to increase the electric field beneath drain 439, squeezing the equipotential lines 438 together and forcing breakdown in this area, which is far away from gate 433.

In summary, the drain voltage clamp methods described herein improve lateral DMOS avalanche capability by moving the breakdown location away from the gate, reducing device breakdown to improve the survival rate of devices subjected to EOS.

Non-Isolated Extended-Drain MOS

The drain avalanche clamp concept can also be applied to devices other than lateral DMOS, including lightly-doped-drain (LDD) drain-extended MOS transistors. In such devices, the length of the drain extension or "drift" $L_D$ is generally longer than that of the gate's sidewall spacer, typically from one-half microns up to tens-of-microns in length. Unlike a lateral DMOS, where a more heavily doped well or body surrounds the source extending beneath the gate, non-DMOS devices employ a laterally uniform well concentration, at least within active regions. The P-well and N-well doping profiles in the devices described herein are as-implanted, and not produced through conventional means requiring long high-temperature diffusions. The vertical dopant profile in the devices, i.e. perpendicular to the wafer's surface, may therefore comprise non-Gaussian and non-monotonic profiles used to optimize both on-state conduction and off-state blocking characteristics.

In this section, the title "non-isolated" refers to the absence of a high-energy implanted DN layer in the device—a dedicated implant used for forming floor isolation beneath one or more devices. Without the DN implant, any P-well is electrically shorted to the P-type substrate, meaning the body or channel of all non-isolated NMOS transistors is necessarily grounded. P-channel devices on the other hand, are formed in N-wells and are naturally self-isolated without the need for the DN layer. But because the subsurface portion of an N-well is typically not as heavily concentrated as the DN layer, the ability of the N-well to prevent substrate current resulting from parasitic PNP conduction (should the P-type drain become forward biased to the N-well) is not as good as if the DN layer surrounds the PMOS N-well.

Figure 12:
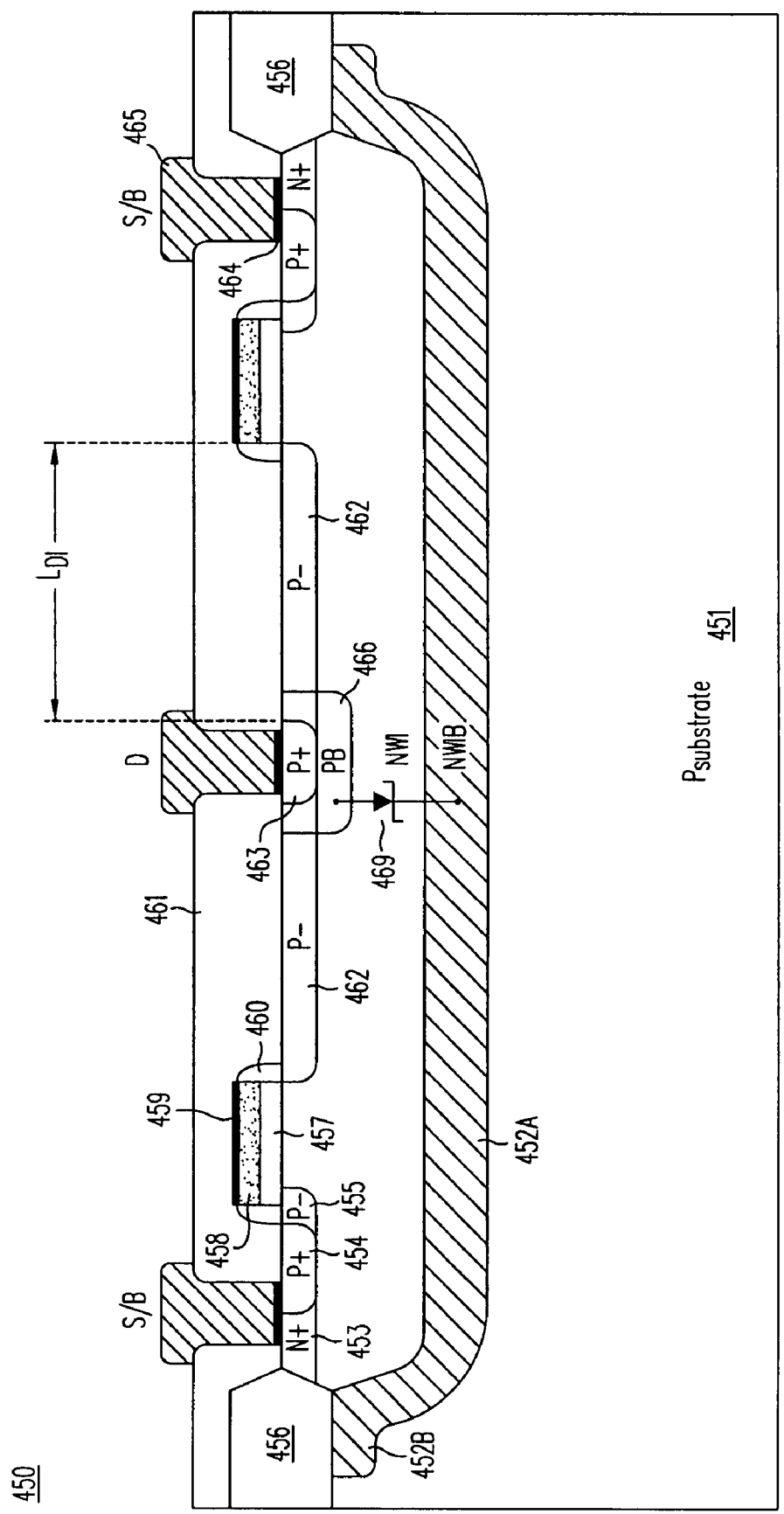
FIG. 12 is a cross-sectional view of a non-isolated extended-drain PMOS with a graded drain.

FIG. 12 shows a cross-sectional view of a non-isolated extended-drain PMOS 450. The device as illustrated is symmetrical and drain-centric—meaning that P+ drain 463 is surrounded by gate 458 (including silicide 459), source 454, and N+ well-contact 453 on both sides as shown. The device may be constructed using stripe geometry or it may constitute a fully-enclosed rectangular or polygonal shape. The gate oxide 457 may comprise a first thin gate oxide or a thicker gate oxide for higher voltage devices. The drift length $L_{D1}$ of self-aligned P−drift layer 462 is determined by the distance from gate 458 to P+ drain 463, not by sidewall spacer 460. As a consequence of the presence of sidewall spacer 460, a lightly doped source region 455 is formed. This region may be implanted using an existing Ldd implant compatible with low voltage PMOS devices, or it may use a dedicated implant that is optimized for the PMOS 450. Contact through ILD 461 is made using metal interconnect 465 with an underlying barrier metal 464.

As shown, the N-well 452A,452B comprises a non-Gaussian or non-monotonic profile, represented by a top portion NW1 and a subsurface portion NW1B. In a preferred embodiment, NW1B is more heavily doped than NW1, and in an alternative embodiment N-well 452A,452B comprises a series of chained implants differing in dose and energy. Since the N-well 452A,452B is formed after field oxide layer 456, its junction depth under the field oxide is shallower, as shown by region 452B, and region 452B may substantially comprise only the buried portion NW1B of the N-well. A second well NW2 with buried portion NW2B may be used to substitute the first N-well.

Drain extension or drift region 462 comprises a shallow implant preferably formed after gate 458 and field oxide layer 456, and therefore being fully self-aligned to these layers. As shown, the drift region 462 is surrounded by gate 458 and never touches or abuts field oxide layer 456.

An optional PB layer 466, comprising either a P-body implant, a P-base implant or another dedicated implant, is introduced surrounding P+ drain 463 to reduce the surface electric field surrounding the drain by grading the concentration. In addition to reducing the surface electric field, it may also improve the transistor's avalanche-ruggedness by lowering the drain breakdown through subsurface avalanche. In PMOS 450, this bulk avalanche is represented schematically as diode 469, a voltage clamp comprising P+ drain 463, PB layer 466, and N-well 452A.

Figure 13:
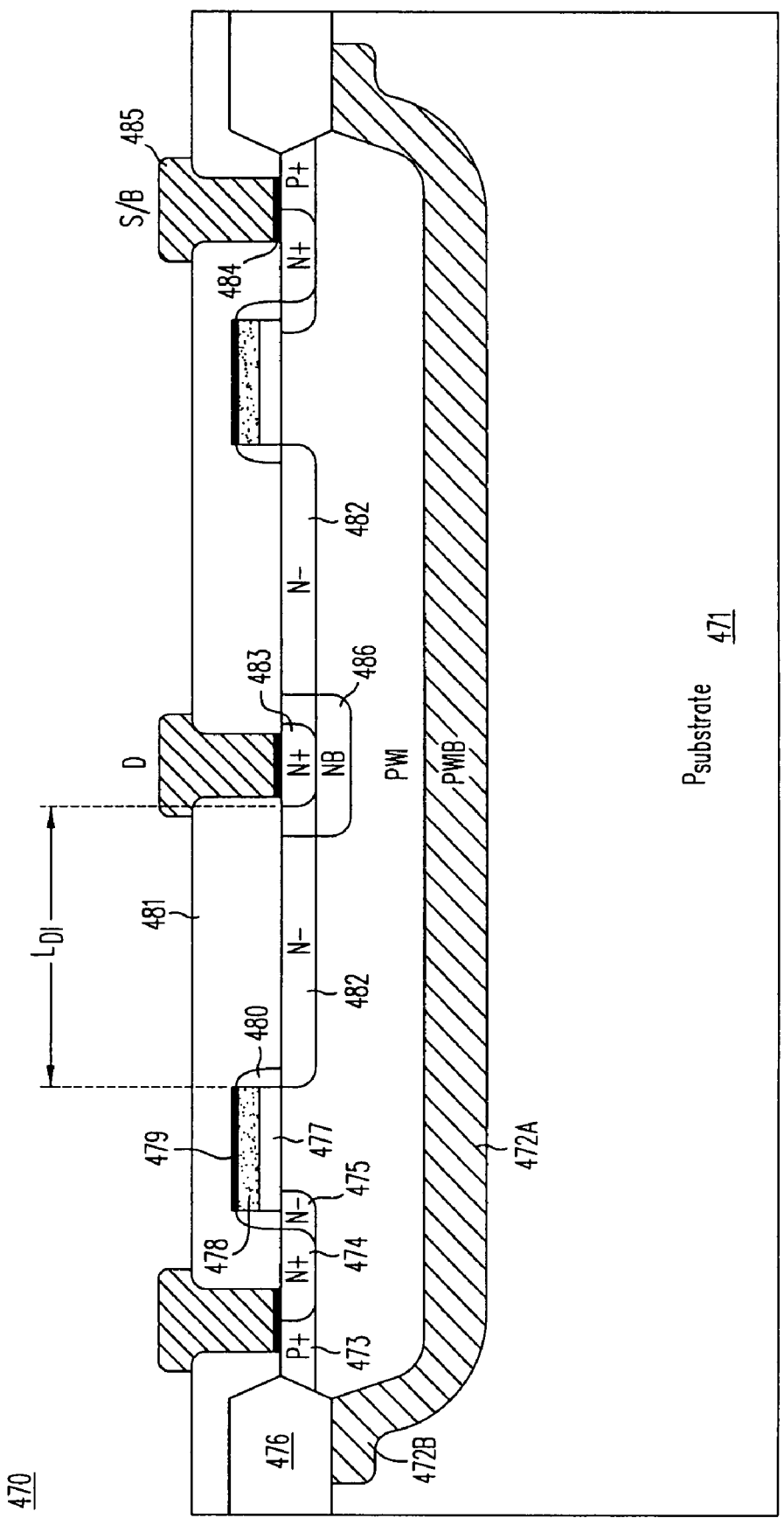
FIG. 13 is a cross-sectional view of a non-isolated extended-drain NMOS with a graded drain.

FIG. 13 illustrates a cross-sectional view of a non-isolated extended-drain NMOS 470 that is analogous to PMOS 450. NMOS 470 as illustrated is symmetric and drain-centric; meaning N+ drain 483 is surrounded on both sides by gate 478 (including silicide 479), source 474, and N+ well-contact 473. The device may be constructed using stripe geometry or it may constitute a fully-enclosed rectangular or polygonal shape. The gate oxide 477 may comprise a first thin gate oxide or a thicker gate oxide for higher voltage devices. The length $L_{D1}$ of self-aligned N− drift region 482 is determined by the distance of gate 478 to N+ drain 483, not by sidewall spacer 480. As a consequence of the presence of sidewall spacer 480, a lightly doped source region 475 is formed. Lightly-doped source region 475 may be implanted using an existing Ldd implant compatible with low voltage NMOS devices, or it may use a dedicated implant that is optimized for the NMOS 470. Contact through ILD 481 is made using metal interconnect 485 with an underlying barrier metal 484.

As shown, P-well 472A,472B comprises a non-Gaussian or non-monotonic profile, represented by a top portion PW1 and a subsurface portion PW1B. In a preferred embodiment PW1B is more heavily doped than PW1, and in an alternative embodiment P-well 472A,472B comprises a series of chained implants differing in dose and energy. Since P-well 472A,472B is formed after field oxide layer 476, its junction depth under field oxide layer 476, as in region 472B, is shallow and may substantially comprise only the buried portion PW1B of the P-well. A second well PW2 with buried portion PW2B may be used to substitute the first P-well.

Drain extension or drift region 482 comprises a shallow implant preferably formed after gate 478 and field oxide layer 476, and therefore being fully self-aligned to these layers. In the device shown the drift region 482 is surrounded by gate 478 and never touches or abuts field oxide layer 476.

An optional NB layer 486 comprising either an N-body implant, an N-base implant or another dedicated implant, is introduced surrounding N+ drain 483 to reduce the surface electric field surrounding the drain by grading the concentration. In addition to reducing the surface electric field, it may also improve the transistor's avalanche-ruggedness by lowering the drain breakdown through subsurface avalanche.

Figure 14:
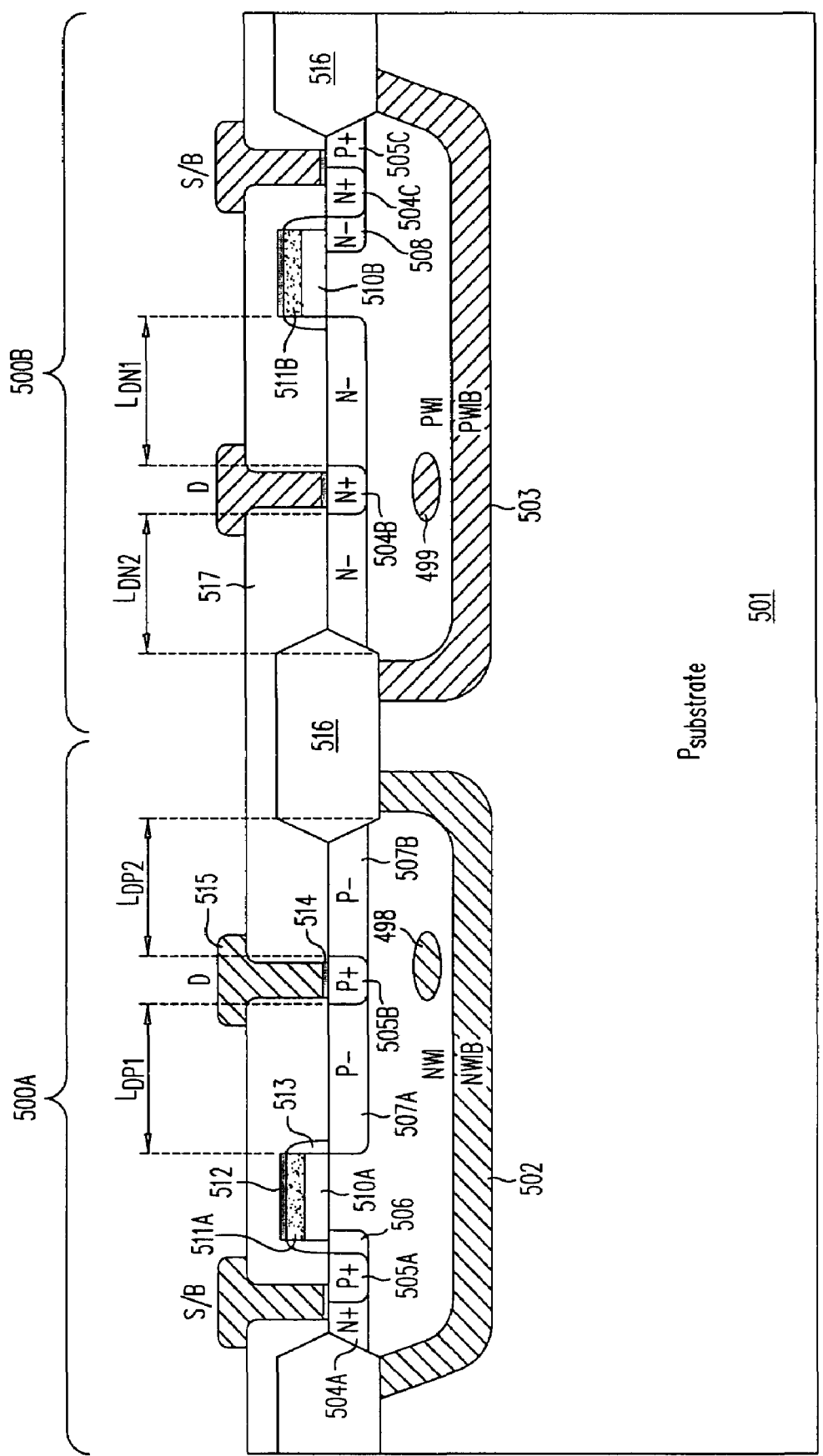
FIG. 14 is a cross sectional view of a non-isolated extended-drain CMOS.

Non-isolated drain extended PMOS 450 and NMOS 470 can be modified into devices wherein the drain is not surrounded by the gate on all sides. FIG. 14 shows schematic cross-sections of asymmetric extended-drain CMOS devices including PMOS 500A and NMOS 500B, wherein drain extensions abut a gate on one side and field oxide on one or more other sides.

The asymmetric drifted PMOS 500A is formed in N-well 502 and includes P+ drain 505B with an intervening P− drift region 507A of length $L_{DP1}$ between the P+ drain and gate 511A on one side. A second P−drift region 507B of length $L_{DP2}$ is interposed between drain 505B and field oxide layer 516. Drift region 507A, drift region 507B, and source extension 506 may be formed using the same implantation step, such as PLDD2 of the process flow described above, or they may be separate implants that are individually optimized for their specific function. The $L_{DP2}$ and $L_{DP1}$ of drift regions 507A and 507B may also be individually optimized for their function. For example, the length and resistivity of 507B are important for determining the BV of PMOS 500A, but do not affect the on-state performance or hot-carrier reliability (HCI) of the device, while the doping and length of drift region 507A have implications for BV, on-resistance, and HCI.

Similarly, the asymmetric drifted NMOS 500B is formed in P-well 503 and includes N+ drain 504B with an intervening N− drift region 509A of length $L_{DN1}$ between the N+ drain and its gate 511B on one side. A second N− drift region 509B of length $L_{DN2}$ is interposed between drain 504B and field oxide layer 516. Drift region 509A, drift region 509B, and source extension 508 may be formed using a common implantation step, such as NLDD2 of the flow described above, or they may be formed by separate implant steps that are individually optimized for each specific function. The $L_{DN2}$ and $L_{DN1}$ of drift regions 509A and 509B may also be individually optimized for their function. For example, the length and resistivity of drift region 509B is important for determining the BV of the NMOS, but do not affect the on-state performance or hot-carrier reliability (HCI) of the device, while the doping and length of 509A have implications for BV, on-resistance, and HCI. In one embodiment, the BV of drift region 509B is intentionally made lower than the BV of drift region 509A so that the breakdown always occurs far from the gate 511B.

In a preferred embodiment, source extension 508 is doped heavily to provide low resistance from the source to the channel of the NMOS, while drift region 509A has a different doping profile that is optimized to support the drain breakdown voltage and provide good HCI. In another embodiment, drift region 509A also includes a second area of higher doping near the N+ drain region, to provide graded drift region doping for better trade-off between on-resistance and HCI. Drift region 509A may also be implanted at higher energy to provide a retrograde profile that improves HCI by allowing most of the current to flow farther from the sensitive gate oxide-silicon interface.

The construction and fabrication of PMOS 500A and NMOS 500B are otherwise similar to the PMOS and NMOS devices of FIGS. 12 and 13. The P+ implant forms source 505A and drain 505B in PMOS 500A while it forms the P-well contact 505C in NMOS 500B. Conversely, the N+ implant forms source 504C and drain 504B in NMOS 500B while it forms the N-well contact 504A in PMOS 500A. The gate oxide 510A and 510B of PMOS 500A and NMOS 500B may be the same or may be individually optimized.

The PB layer 466 and NB layer 486 illustrated in FIGS. 12 and 13 may also be employed in the PMOS 500A and NMOS 500B. Alternatively a deeper implant can be used to force breakdown under the drain and into the bulk silicon. In PMOS 500A, an optional N-type region 498 can be masked and implanted into N-well 502 to locally increase the concentration and lower the breakdown of the junction formed between P+ drain 505B and N-well 502. Similarly, in NMOS 500B, P-type region 499 can be masked and implanted into P-well 503 to locally increase the concentration and lower the breakdown of the junction formed between N+ drain 504B and P-well 503.

Lateral Trench DMOS

Compared to the aforementioned "planar" MOS and DMOS transistors having a gate that sits atop the silicon surface and forms an MOS channel under the gate along the silicon surface, the lateral trench gated DMOS transistor (LTDMOS) utilizes a trench gate to control channel current vertically down the side of an etched trench, perpendicular, not parallel, to the wafer surface. Unlike a vertical trench DMOS, where the channel current flows vertically through the entire substrate and out its backside, an LTDMOS redirects its vertical channel current laterally into its drain before the current flows back to a drain contact on the topside surface of the wafer. The LTDMOS is much more three-dimensional than conventional planar MOS transistors. The trench gate structure, while more difficult to manufacture than planar gate devices, confers certain advantages to a device's electrical properties.

Using a trench opening of 0.4 microns or less, the gate consumes less surface area than conventional MOS transistors, especially five volt devices which require 0.5 to 0.6 micron gate lengths; twelve volt devices which typically require 0.8 microns or more; and voltages twenty volts and higher which require even longer gate lengths up to 4 microns. So space saving is a simple benefit of a trench gate.

Another benefit of an LTDMOS is its ability to form a fully self-aligned gate using a series of chained implants of differing energies and dose to create box-shaped and other non-Gaussian and/or non-monotonic dopant profiles without the need for high temperature processing or long diffusions. These unique dopant profiles can be tailored to help reduce depletion spreading into the channel, suppress short channel effects, inhibit punch-through channel leakage and breakdown, and limit threshold variability.

Figure 3A:
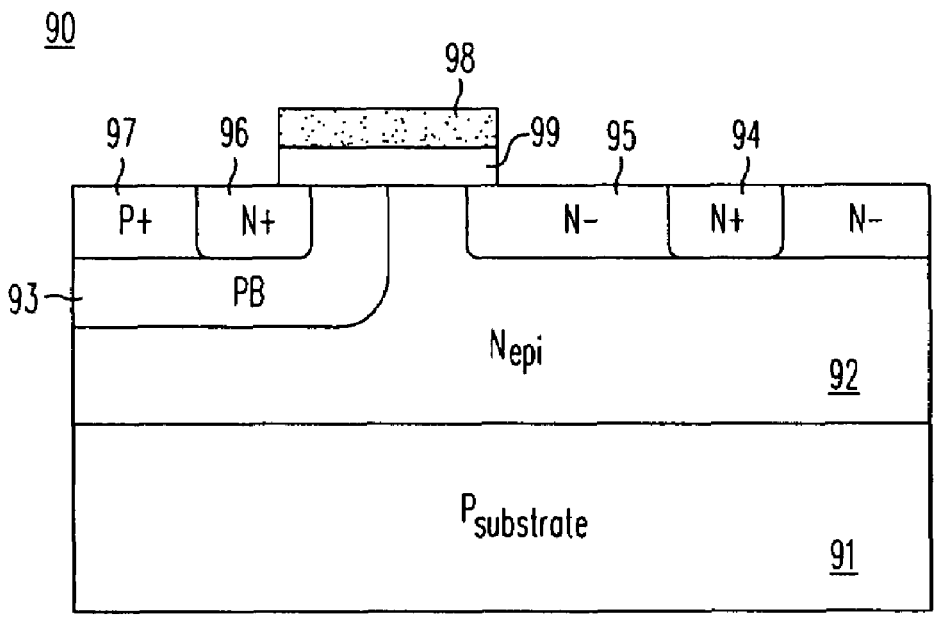
FIGS. 3A-3G illustrate a conventional process for fabricating lateral DMOS devices.
Figure 3B:
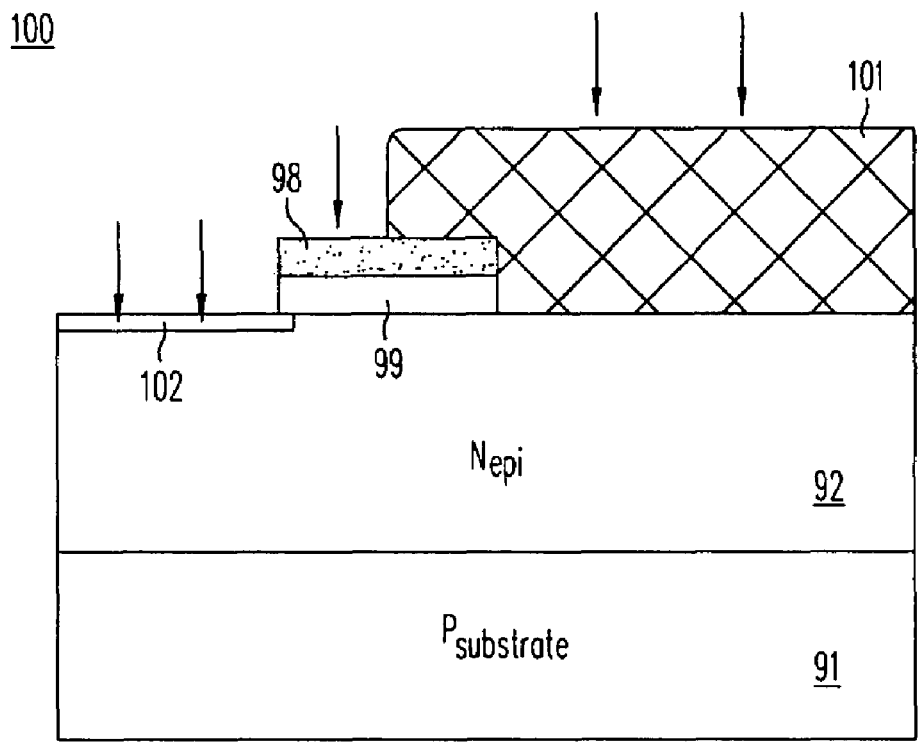
Figure 3C:
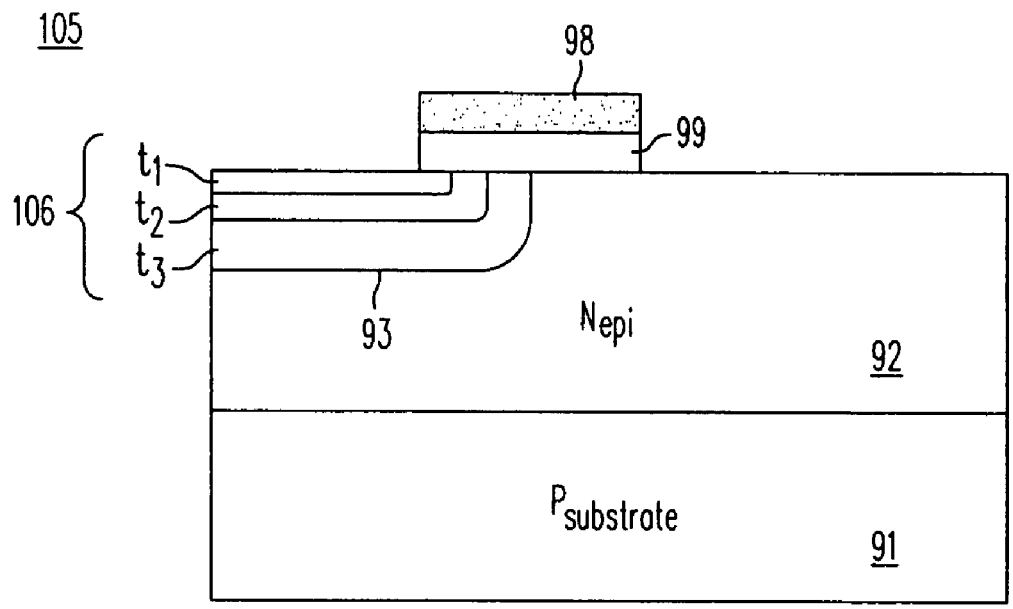
Figure 3D:
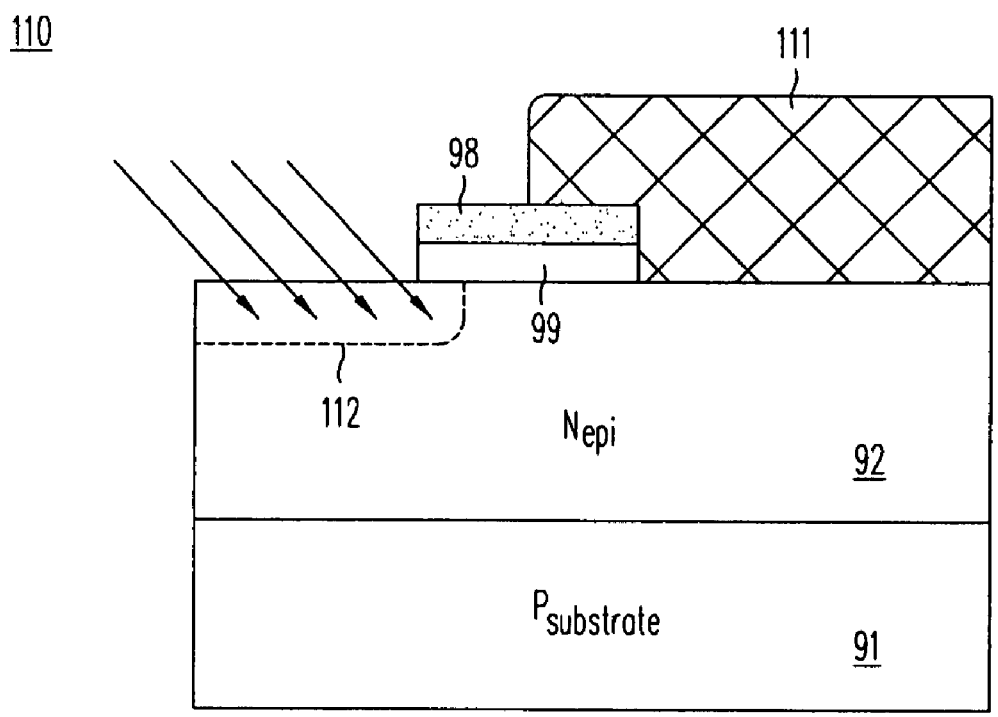
Figure 3E:
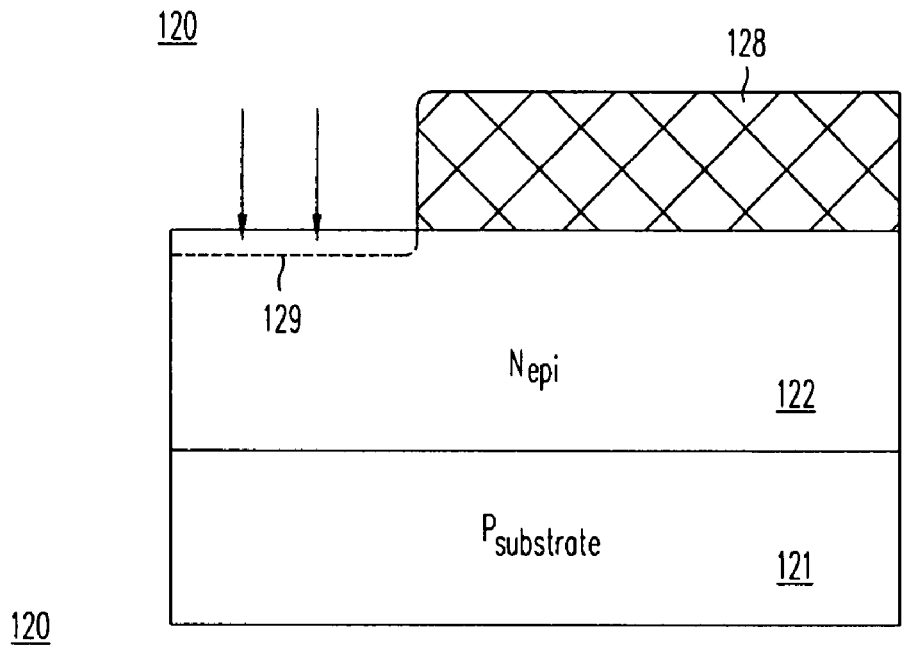
Figure 3F:
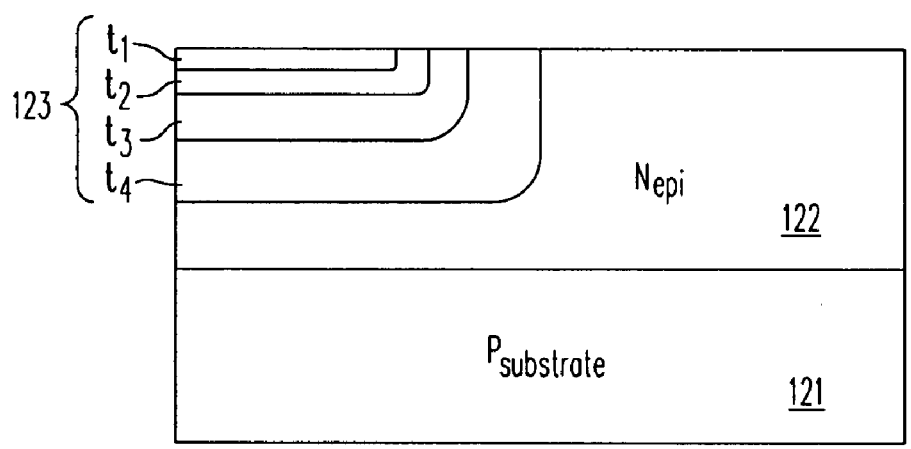
Figure 3G:
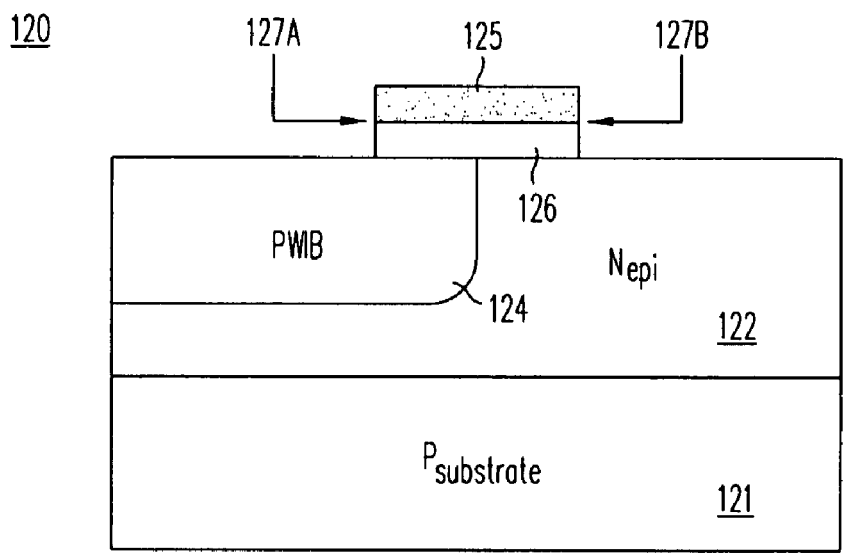
Figure 4A:
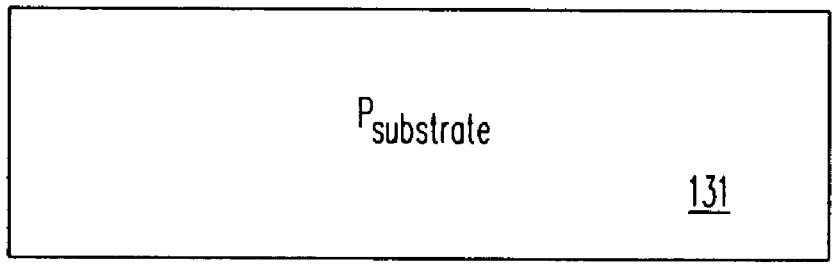
FIGS. 4A-4I are a series of cross-sectional views illustrating a conventional process for a high-temperature junction isolation of an epitaxial layer.
Figure 4B:
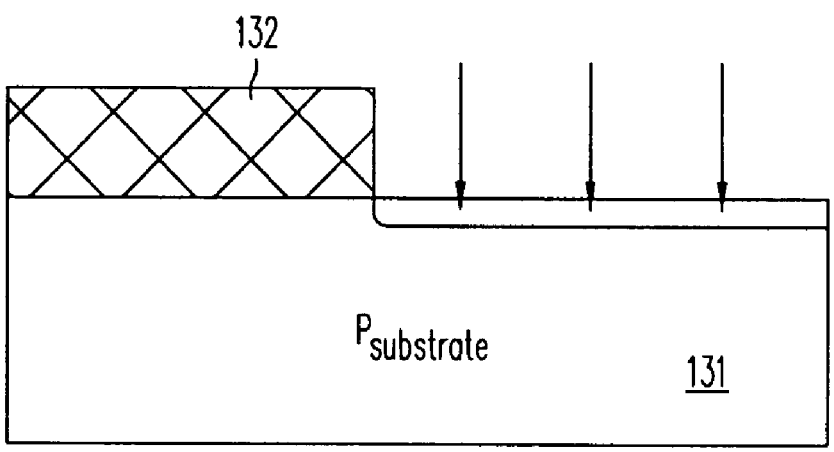
Figure 4C:
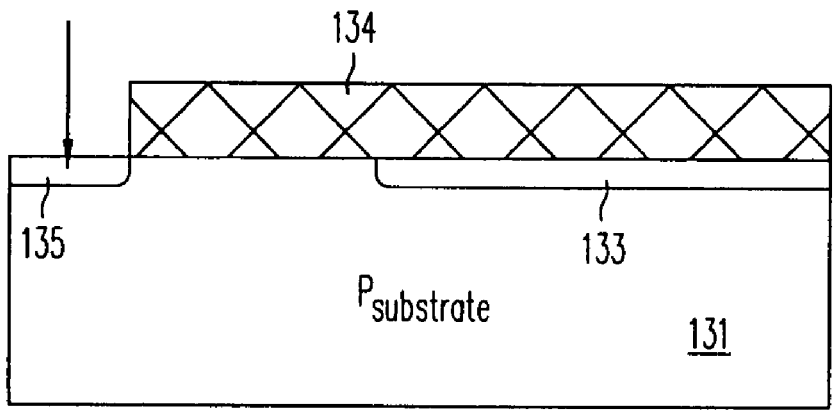
Figure 4D:
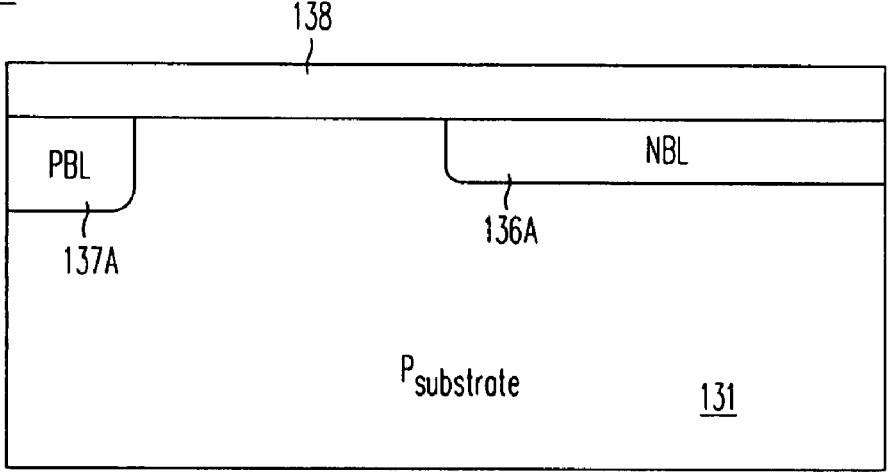
Figure 4E:
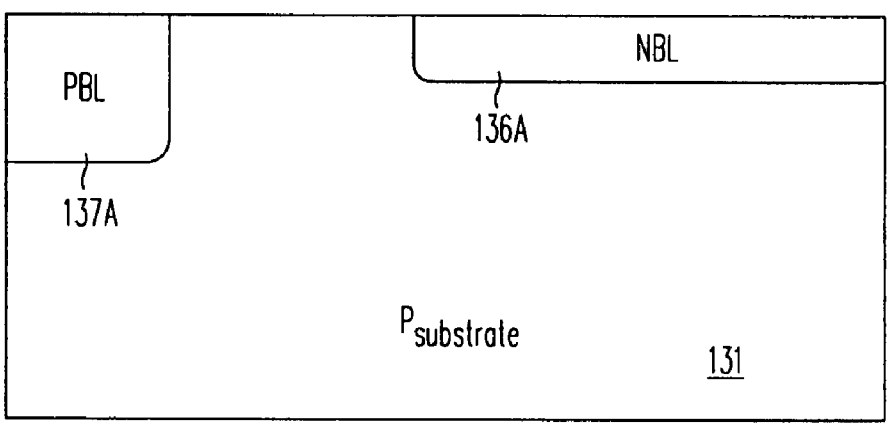
Figure 4F:
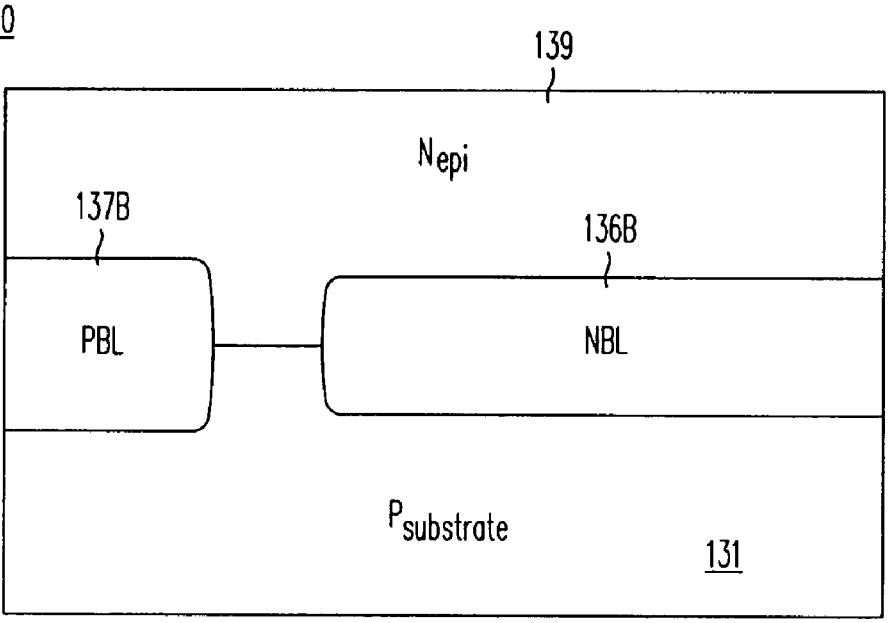
Figure 4G:
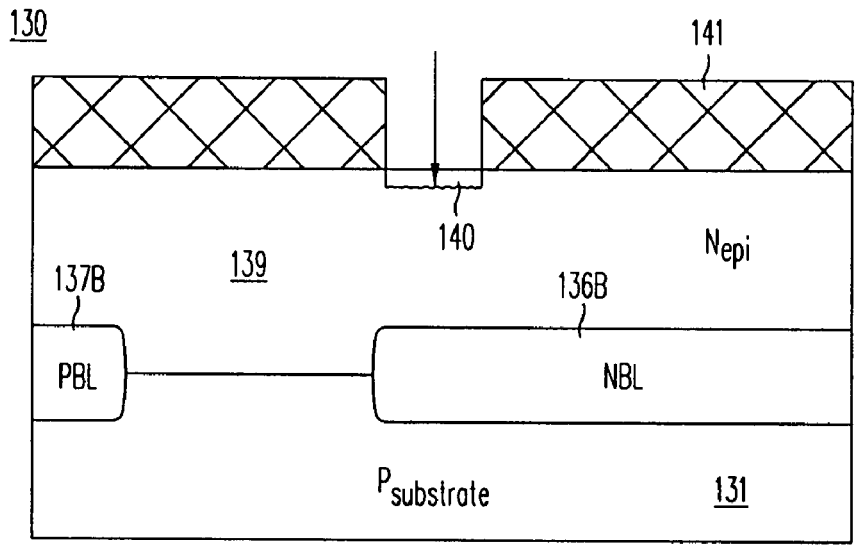
Figure 4H:
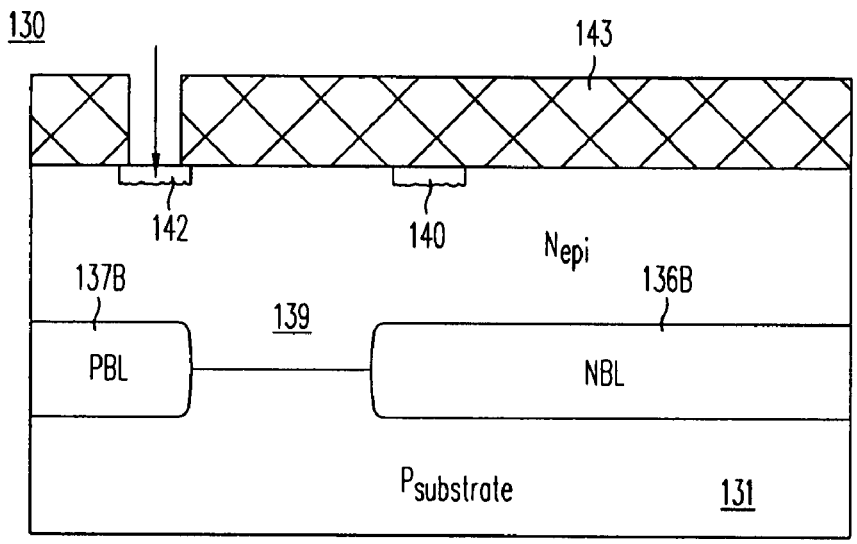
Figure 4I:
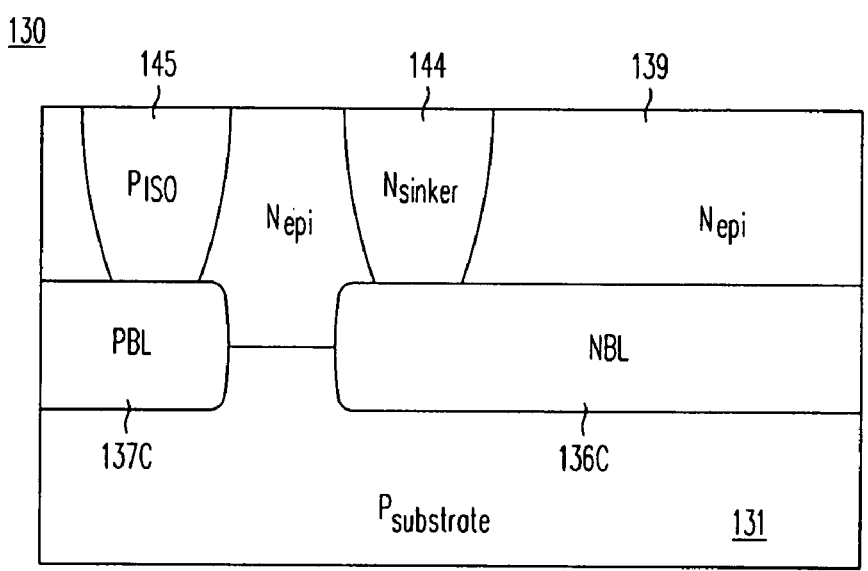

Compared to the conventionally constructed lateral DMOS, the vertical implant of the LTDMOS described herein is simple and expedient, taking only seconds to implant the entire DMOS body without the need for high temperature diffusion. This method is sharply contrasted to the 12- to 24-hour high-temperature diffusion needed by DMOS device 105 in FIG. 3C, or by the exotic tilt implant of lateral DMOS 110 in FIG. 3D, requiring precise wafer rotation during implantation to avoid directional mismatch of the devices with gate orientation. And unlike the conventional DMOS device 120 of FIG. 3G, the LTDMOS of this invention is fully-self aligned to the gate, making breakdown and impact ionization more consistent and reproducible.

Figure 2A:
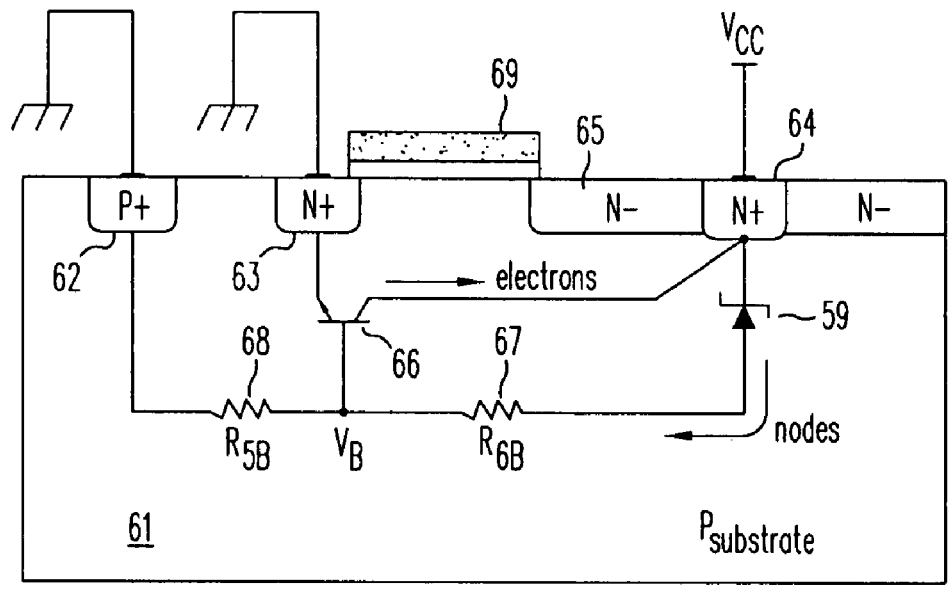
FIGS. 2A-2D illustrate various aspect of snapback in lateral MOS devices.
Figure 2B:
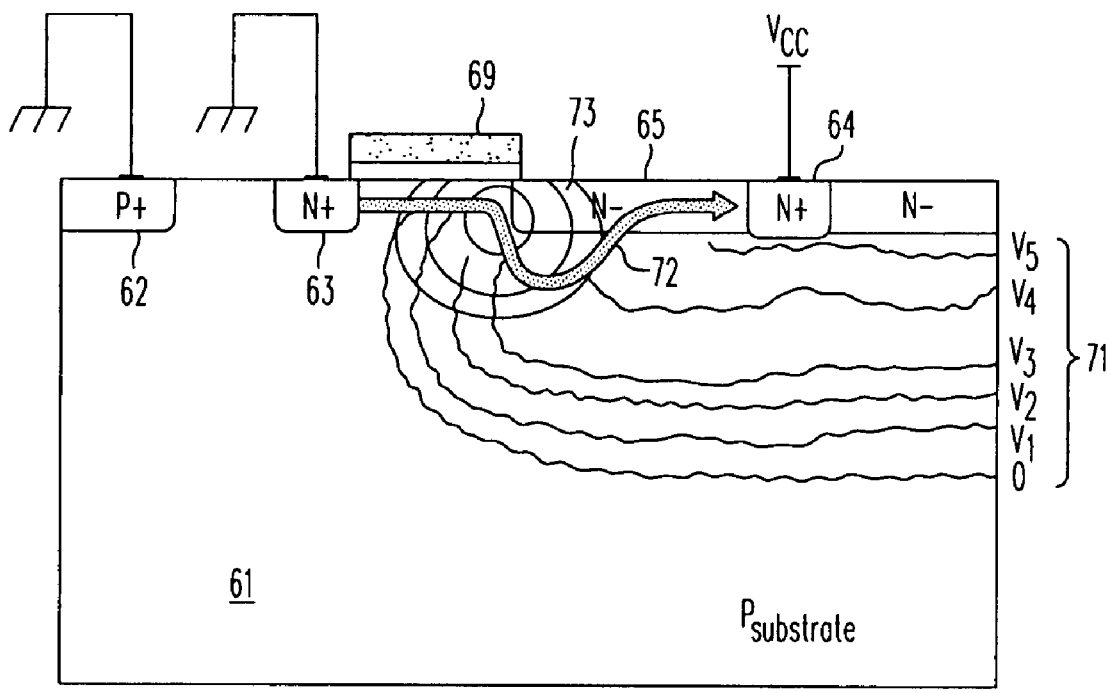
Figure 2C:
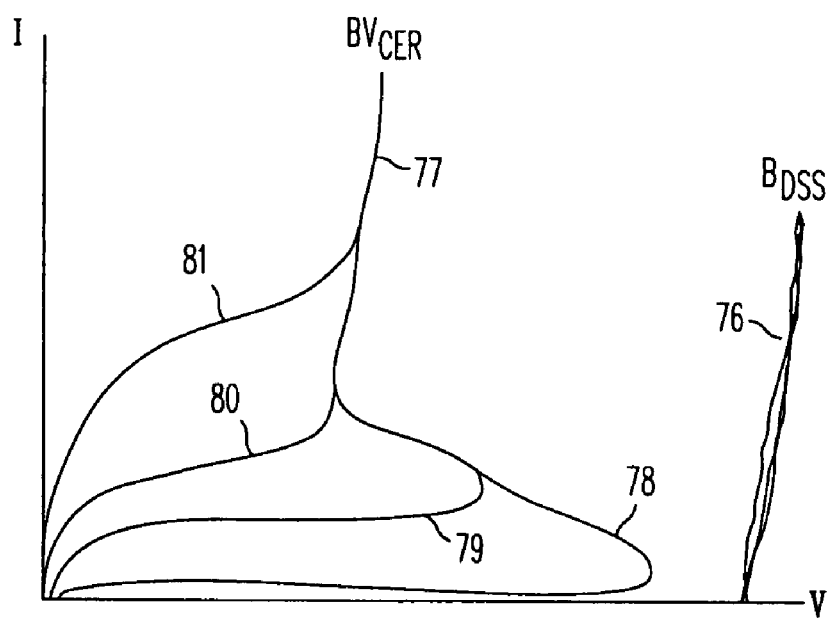
Figure 2D:
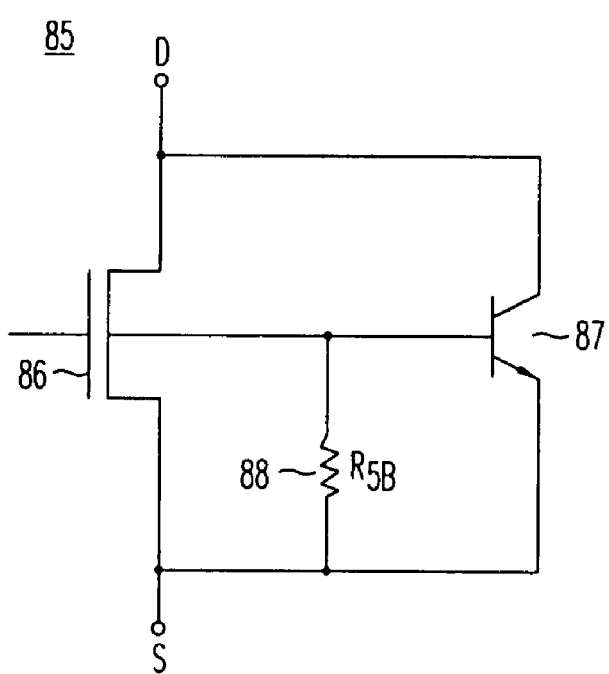

Another benefit of the three-dimensional structure of the LTDMOS is the ability to separate regions of high current density from those of high electric field, thereby suppressing the impact ionization and unwanted drift conductivity modulation effects of device 70 in FIG. 2B. The device can also be engineered to subject the gate oxide to very low electric fields, e.g. where the gate has to support only a couple of volts even when the device is in avalanche breakdown. Low electric fields across the gate allow thinner gate oxides to be utilized in the device's construction, reducing gate voltage drive requirements and maintaining low on-resistance even for high voltage devices.

Because the LTDMOS contains its body region within its drain, and contains its source within its body, it is convenient to utilize a source body short uniformly throughout a device and without necessarily shorting the body to the grounded substrate. The ability to provide "local" body contact reduces the source-body shunting resistance $R_{SB}$ thereby effectively suppressing or even eliminating the snapback phenomena plaguing device 60 in FIG. 2A.

Another advantage is that by using all low-temperature processing, LTDMOS fabrication does not affect or otherwise influence the integration of other bipolar and CMOS devices in the integrated process, and supports the inclusion and exclusion of devices and corresponding process steps in a modular fashion. With all low-temperature processing, fabrication is not limited to small diameter wafers.

Figure 15A:
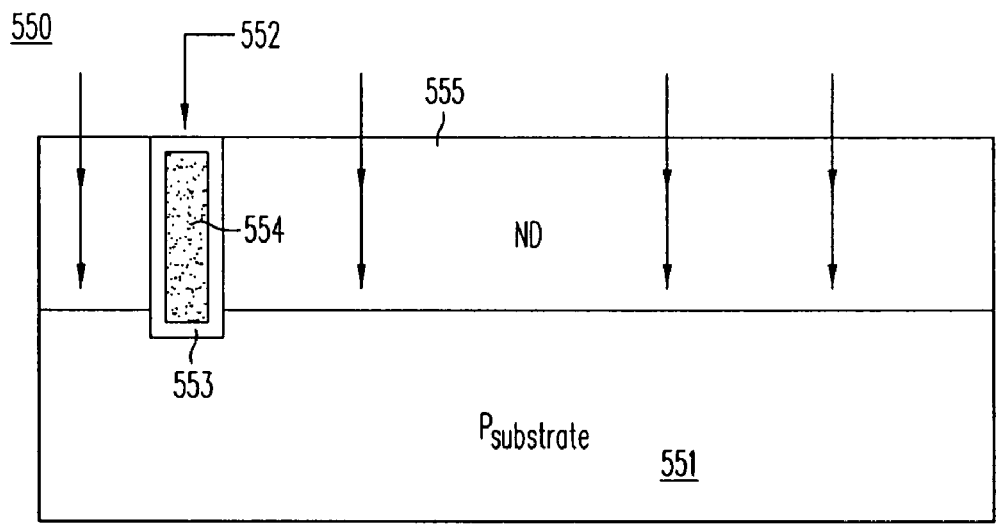
FIGS. 15A-15C are a series of cross-sectional views illustrating the fabrication of a lateral trench DMOS.
Figure 15B:
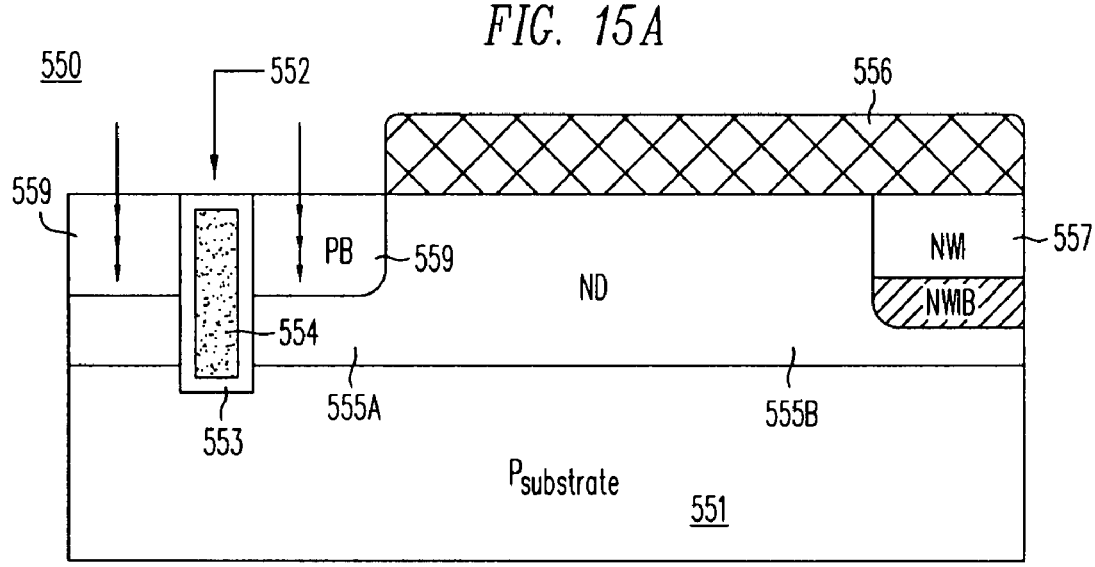
Figure 15C:
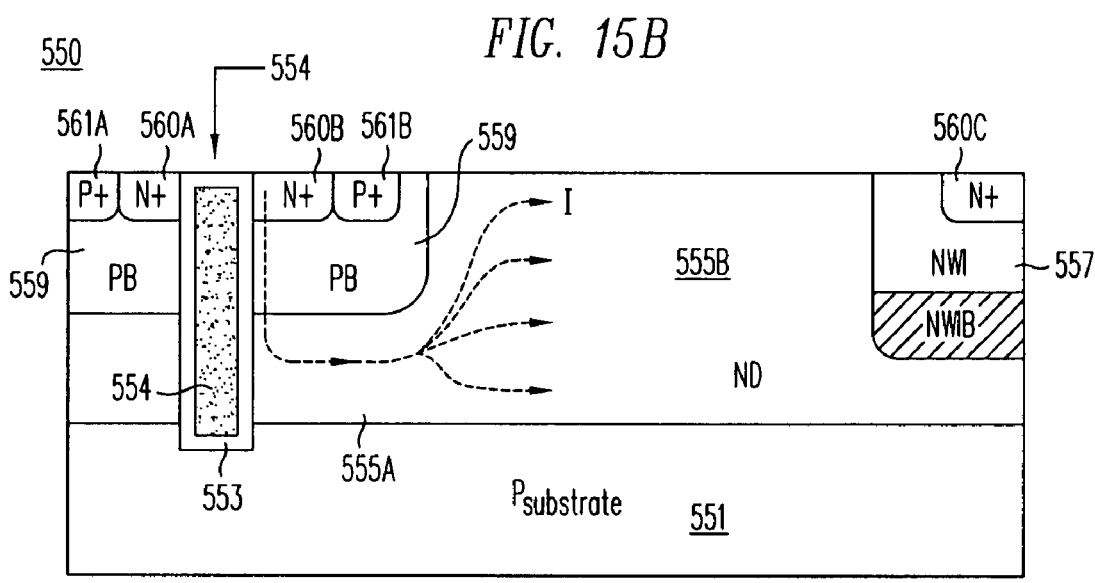

FIGS. 15A through 15C illustrate some key steps in the all low-temperature fabrication of LTDMOS devices according to this invention. Referring to FIG. 15A, the fabrication of LTDMOS 550 starts with the etching, oxidation, polysilicon deposition, and planarization steps to create trench gate 552 with polysilicon gate 554 and gate oxide 553 in substrate 551. Deep drift (ND) region 555 is then introduced by high energy or chain implantation, to a depth typically close to the depth of the bottom of trench 552 although shallower or deeper depths are possible too. Forming the ND region deeper than trench 552 may, for example, be used to further reduce the gate electric field in lateral trench DMOS devices used in high-side switch applications.

In shown in FIG. 15B, the process further includes the formation of as-implanted P-type body 559, preferably using a chain implant of varying boron implant energies and doses, selectively masked by patterned photoresist 556. The body implant may precede or follow the formation of an optional N-well 557 which ideally comprises a chain-implanted non-Gaussian N-well comprising at least a lower portion NW1B and an upper portion NW1, where in a preferred embodiment the lower portion NW1B is more heavily doped than the upper portion, especially if the same N-well is to be included as a structural and electrical element in other devices fabricated along with trench lateral DMOS 550. A second N-well can be substituted for the first N-well as desired, for example, if the second N-well has a higher average doping than the first N-well does.

The presence of the P-type body 559 divides drift region 555 into two regions, a region 555A pinched under the body 559, and a region 555B that is not pinched by the P-type body layer. As shown in FIG. 15C, implantation is used to form N+ source regions 560A and 560B and drain contact 560C. Another implantation is used to form P+ body contacts 561A and 561B. Current I follows a vertical path down the side of the trench 552 and a lateral conduction path first through pinched drift region 555A and then expanding out into unpinched drift region 555B for eventual collection by N+ drain contact 560C. Optional N-well 557 may help to reduce the on-resistance.

Figure 16A:
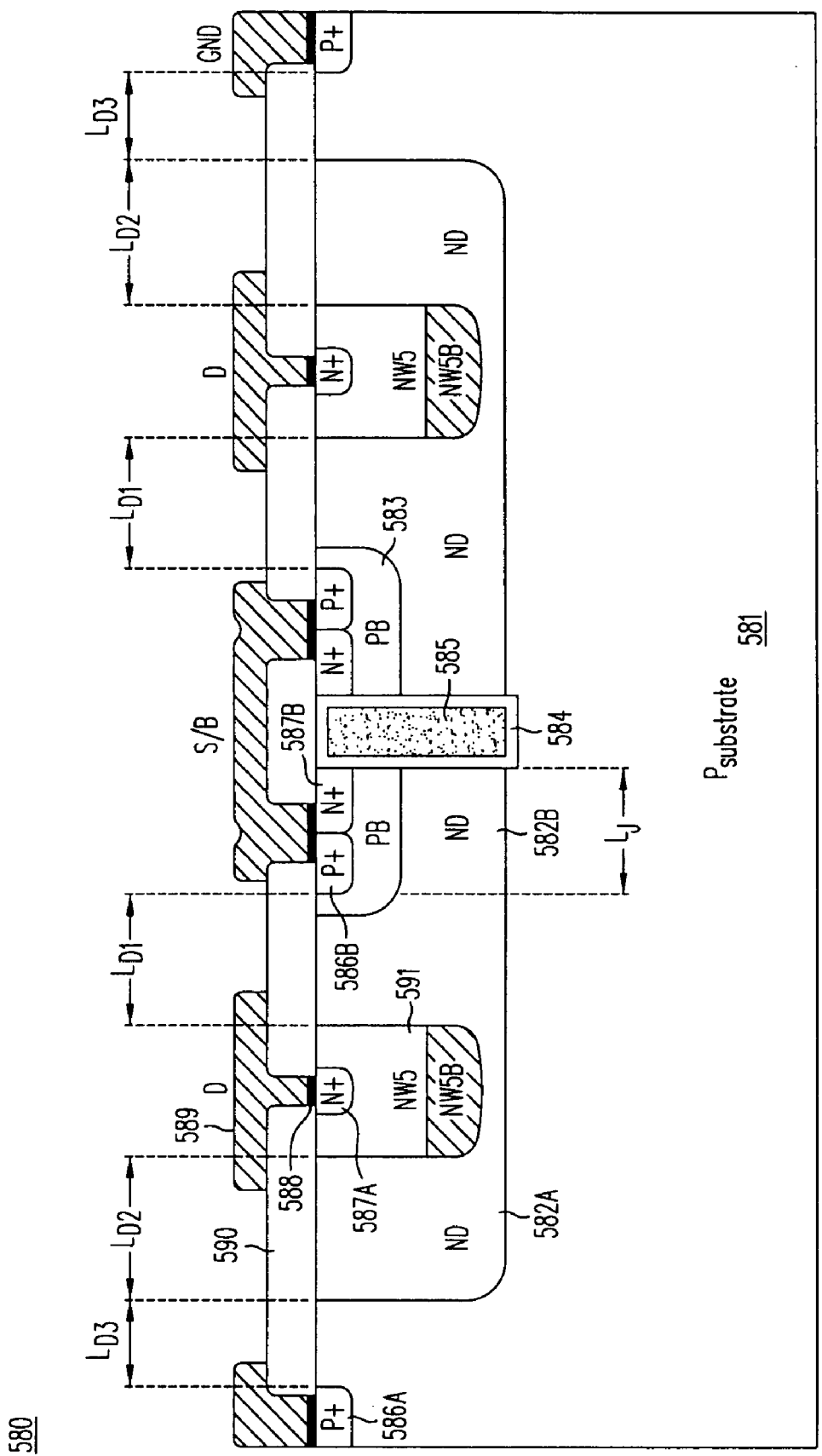
FIGS. 16A and 16B are cross-sectional and top views, respectively, showing the construction of a trench lateral DMOS with a uniform deep N-type drifted drain.
Figure 16B:
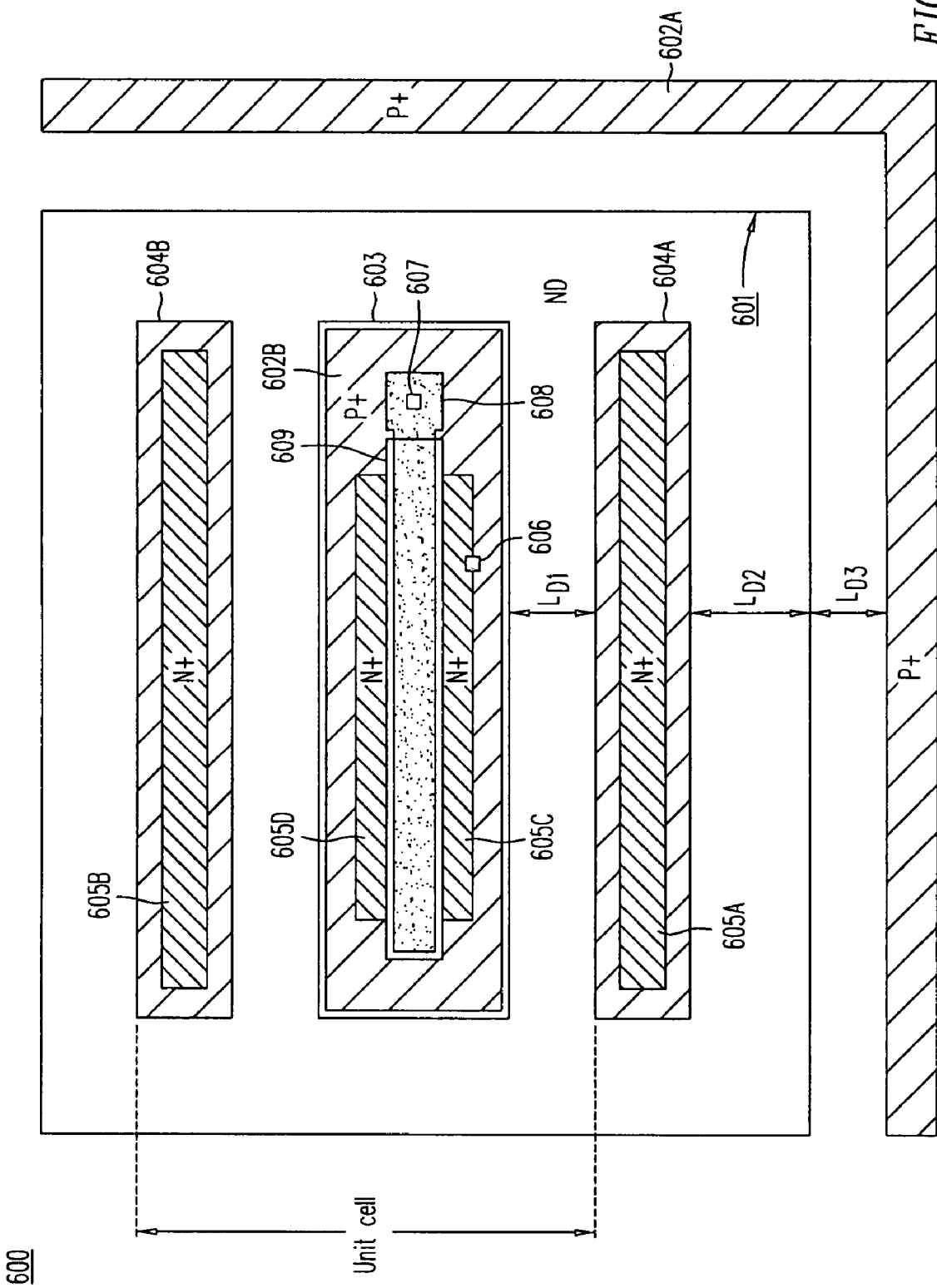

FIGS. 16A and 16B illustrate one possible structure of a lateral trench DMOS 580 comprising a non-conformal, deep N-type drift region 582. FIG. 16A illustrates in cross section a gate-centric design comprising trench gate polysilicon 585 and gate oxide 584 surrounded by N+ source 587B, P+ body contact 586B, chain implanted P-type body 583, ND region 582, N+ drain contact 587A, substrate contact 586A, ILD 590, barrier metal 588, and interconnect metal 589.

Except for the bottom of the trench gate, the entire gate and drain structure is contained vertically within and laterally enclosed by implanted drift region 582 comprising a portion 582A not pinched by the p-body, and portion 582B, pinched by P-type body 583. The pinched portion 582B extending from the edge of gate polysilicon 585 to the edge of the P-body region 583 has a length $L_J$ (denoting a JFET-like region), while the edge of the P-body 583 to the edge of the optional N-well drain 591 is defined as a drift length $L_{D1}$. Lengthening either or both of these drift region lengths $L_J$ and $L_{D1}$ increases BV of LTDMOS 580 but also increases its on-resistance.

The outer termination of LTDMOS 580 between the N-well drain 591 and the P substrate 581 comprises an extension of ND region 582A for a length $L_{D2}$ and a substrate region of length $L_{D3}$ bounded by P+ substrate contact 586A. The outer termination length does not affect device conduction properties the way $L_{D1}$ doping and length do. The entire device is formed in P substrate 581 without the need of epitaxy.

FIG. 16B illustrates a top view of LTDMOS 580 including P+ substrate ring 602A, enclosing ND region 601, optional N-well regions 604A and 604B, N+ drain contacts 605A and 605B, P-body region 603 with N+ source regions 605C and 605D abutting P+ body contact region 602B with trench 609 and trench poly 608 contacted by contact window 607 where the polysilicon is sitting atop the silicon surface outside of trench 609. Source contact 606 is shown as a butting contact straddling both N+ source region 605C and P+ body contact region 602B. Alternatively, the source and body contacts may be separate.

Drift lengths $L_{D1}$, $L_{D2}$, and $L_{D3}$ are identified with respect to the defining dopant regions. A portion defined as a "unit cell" describes a portion which may be repeated to form larger devices as long as the ND region 601 and the P+ substrate ring 602A are also expanded to accommodate the larger device. The N-well drain may also fully enclose the body region 603.

Figure 17A:
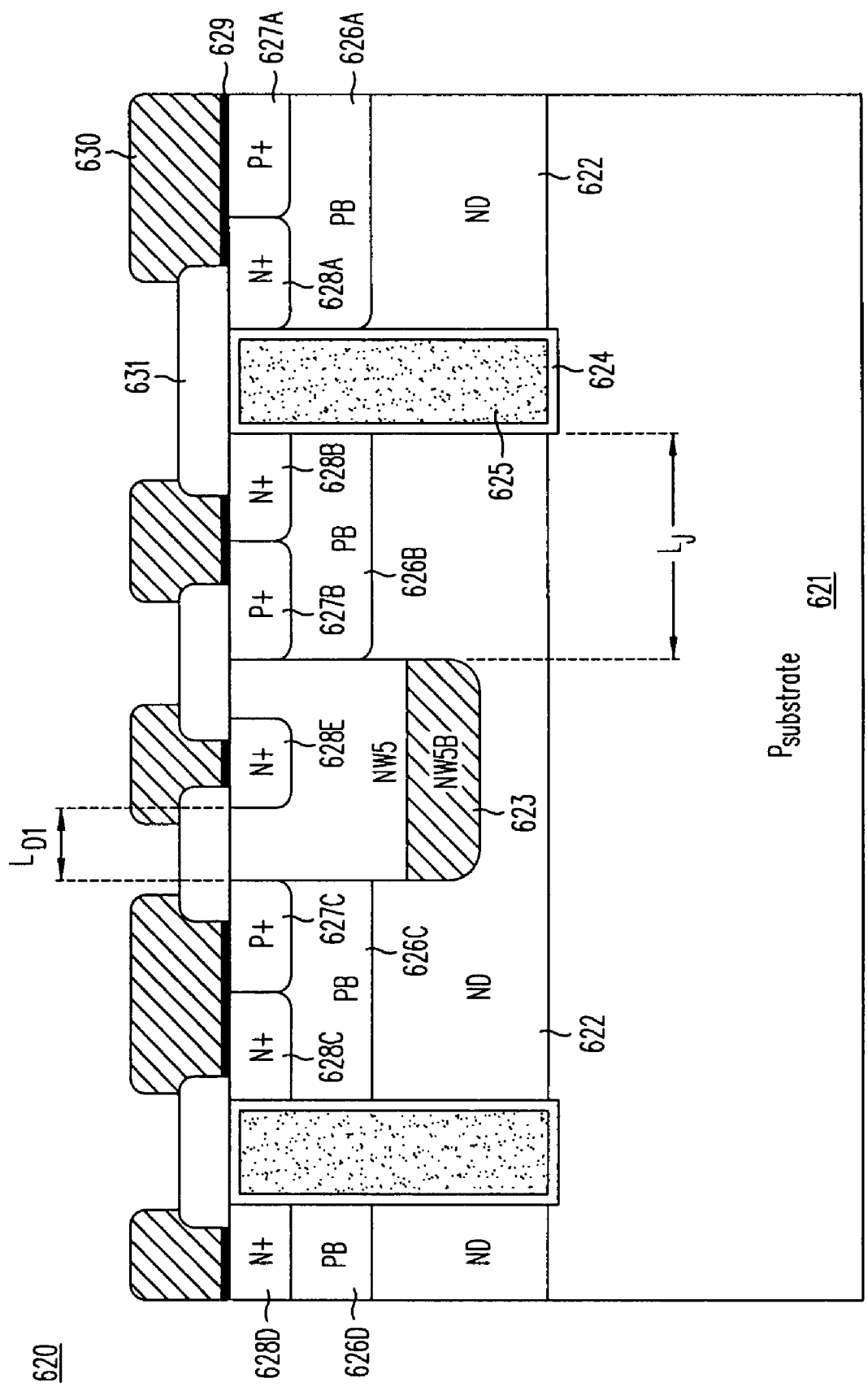
FIGS. 17A-17F illustrate variants of a trench lateral DMOS.
Figure 17B:
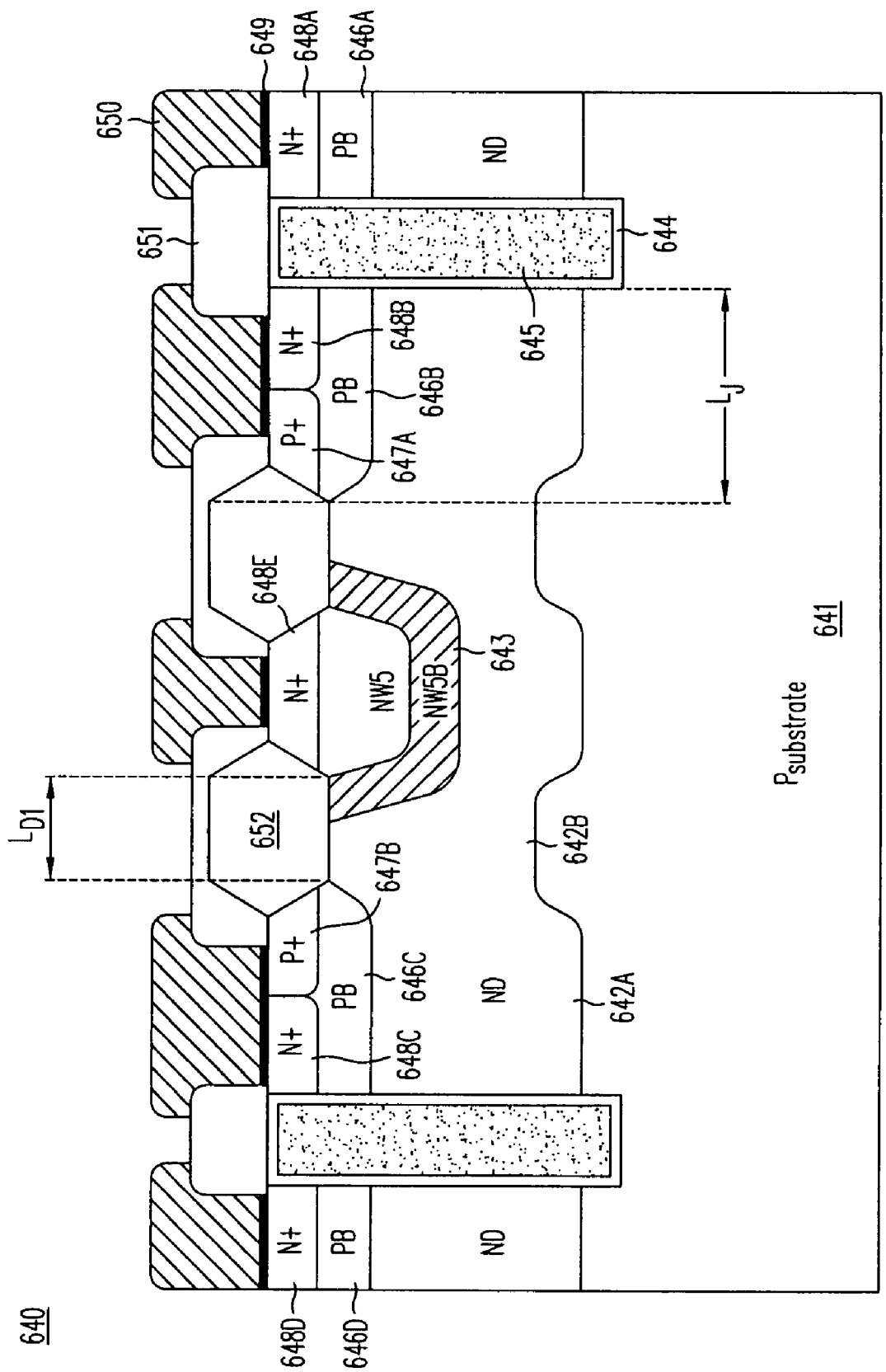

FIGS. 17A and 17B illustrate several drain-centric variants of LTDMOS devices, structurally similar to that of FIG. 16A except that the drain is surrounded by the trench instead of the converse.

FIG. 17A illustrates a drain-centric LTDMOS 620 comprising N-well deep drain region 623 and N+ drain contact region 628E surrounded by P+ body contact regions 627B and 627C, chain-implanted P-type body 626A, 626B, 626C, and 626D, trench gate polysilicon 625 and gate oxide 624, N+ source regions 628A, 628B, 628C, and 628D, ILD 631, barrier metal 629, and interconnect metal 630. The entire device is formed within non-conformal ND region 622 and P-type substrate 621 without the need for epitaxy.

Electrically, N-well 623 forms the drift region of the device, where drift length $L_{D1}$ is defined from the edge of the P-body 626C to the edge of the N+ drain contact region 628E. Lengthening this drift region may increase breakdown somewhat but with the higher doping of the N-well 623 may result in only minimal increases in breakdown despite a nearly linear increase in transistor drain resistance. The substrate contact implant and contact ring and the outer termination of the device are not shown but may be achieved by extending the drift region 622 beyond the outer body regions using a design similar to that of LTDMOS 580 shown in FIGS. 16A and 16B.

FIG. 17B illustrates an LTDMOS 640 with a conformal drift region. This device includes optional deep drain region 643, N+ drain contact region 648E surrounded by field oxide layer 652, P+ body contact regions 647A and 647B, chain-implanted P-type body 646A, 646B, 646C, and 646D, trench gate polysilicon 645 and gate oxide 644, N+ source regions 648A, 648B, 648C, and 648D, ILD 651, barrier metal 649, and interconnect metal 650. The entire device is formed within conformal ND regions 642A and 642B and P-type substrate 641 without the need for epitaxy.

Electrically, regions 642A and 642B form the drift region of the device, where drift length $L_{D1}$ is defined from the edge of the P-body 646C to the edge of the deep drain region 643. This may be approximately the same as the length of field oxide layer 652, as shown, but this is not necessary. The pinched drift region 642A extending from the gate edge to the edge of the P-body region 646B has a length $L_J$ (denoting a JFET-like region). Lengthening either or both of these drift region lengths $L_J$ and $L_{D1}$ may increase the BV of the LTDMOS but will also increase its on-resistance. The substrate contact implant and contact ring and the device's outer termination of the device are not shown but may be achieved by extending the ND region 642 beyond the outer body regions using a design similar to the device of FIG. 16.

Figure 17C:
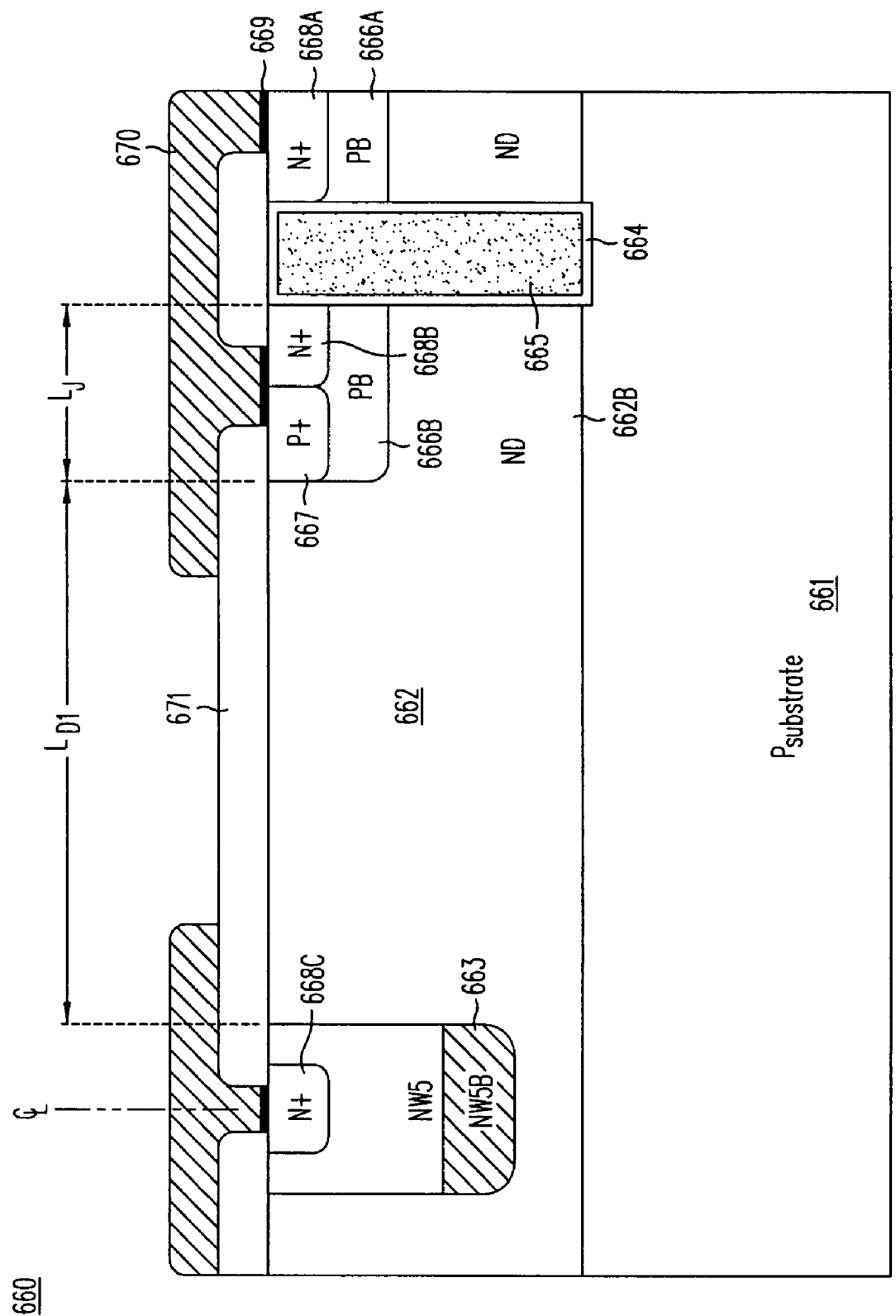

FIG. 17C illustrates an LTDMOS 660 that includes a deep drain region 663 and N+ drain contact 668C surrounded by drift region 662A, P+ body contact 667, chain-implanted P-type body 666A and 666B, trench gate polysilicon 665 and gate oxide 664, N+ source regions 668A and 668B, ILD 671, barrier metal 669, and interconnect metal 670. The entire device is formed within high-energy implanted drift region 662 and P-type substrate 661 without the need for epitaxy. As shown, the center of N+ drain 668C is the center line of the symmetric device.

Electrically, ND region 662 forms the drift region of the device, where the drift length $L_{D1}$ is defined from the edge of the optional N-well 663 to the edge of the P-body 666B without the presence of field oxide. Unlike LTDMOS 640 of FIG. 17B, the drift region 662 in LTDMOS 660 is not implanted through a field oxide layer, so the resulting depth of drift region 662 is substantially constant along its entire length. Increasing $L_{D1}$ may increase the BV of LTDMOS 660, but it will also increase the on-resistance. The substrate contact implant and contact ring and the outer termination of the device are not shown but may be achieved by extending the drift region 662 beyond the outer body regions using a design similar to that of LTDMOS 580 shown in FIGS. 16A and 16B.

Figure 17D:
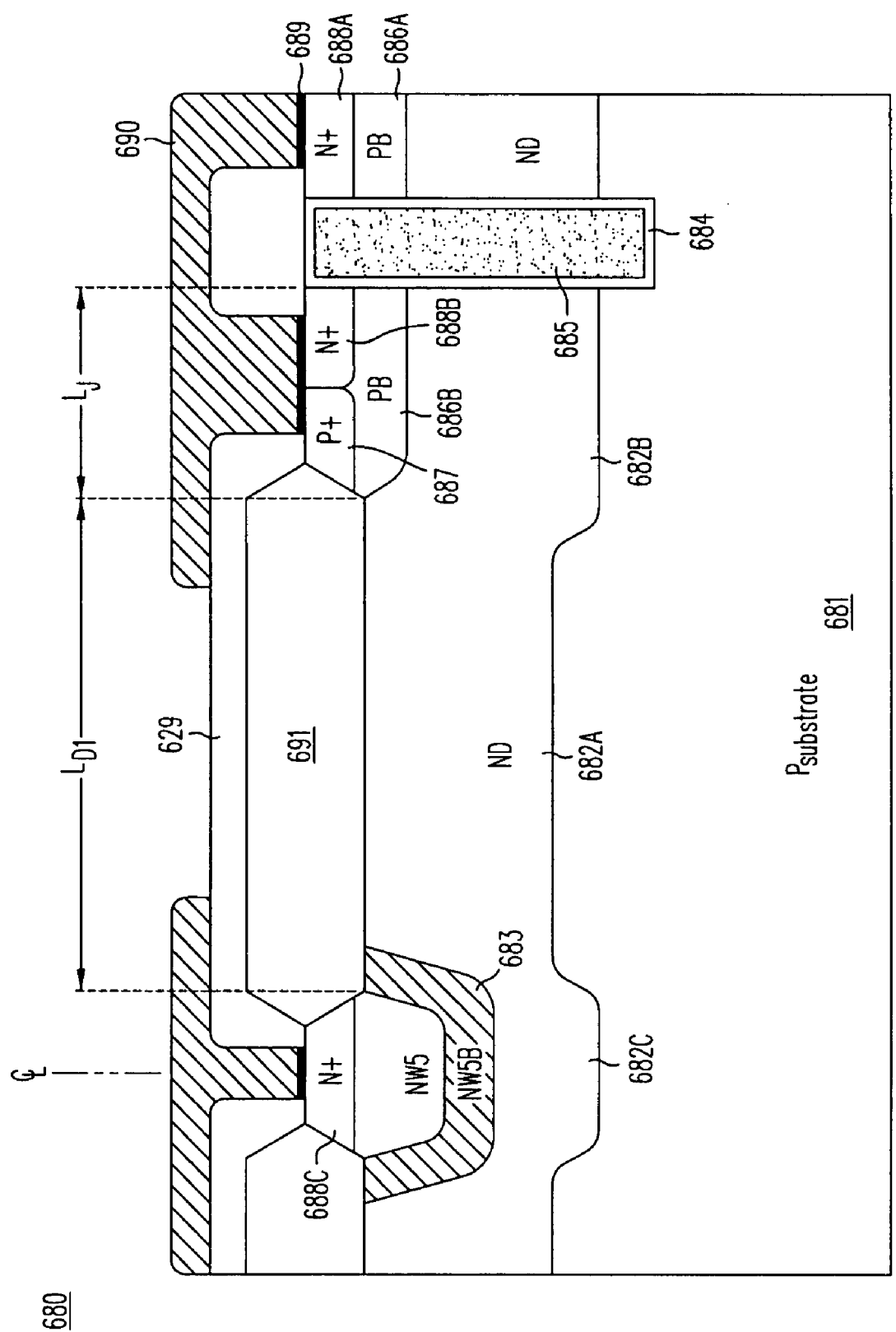

FIG. 17D illustrates an LTDMOS 680 that includes an optional deep drain region 683 and N+ drain contact 688C surrounded by conformal drift region 682, comprising a pinched portion 682B, non-pinched portion 682A under field oxide layer 691, and non-pinched portion 682C under that is not under field oxide layer 691. LTDMOS 680 also includes P+ body contact 687, chain-implanted P-type body 686A and 686B, trench gate polysilicon 685 and gate oxide 684, N+ source regions 688A and 688B, ILD 692, barrier metal 689, and interconnect metal 690. The entire device is formed within conformal implanted drift regions 682A, 682B and 682C and P-type substrate 681 without the need for epitaxy. As shown the center of N+ drain 688C is the center line of the symmetric device.

Electrically, drift region 682A forms the drift region of the device, where the drift length $L_{D1}$ is defined from the edge of the N+ drain contact 688C or optional deep drain 683 to the edge of the P-body 686B. The length of field oxide layer 691 may be the same as $L_{D1}$, as shown, or these lengths may be substantially different. Increasing $L_{D1}$ may increase breakdown but also will increase the on-resistance. The substrate contact implant and contact ring and the device's outer termination of the device are not shown but may be achieved by extending drift region 682A beyond the outer body regions using a design similar to that of LTDMOS 580 shown in FIGS. 16A and 16B.

Figure 17E:
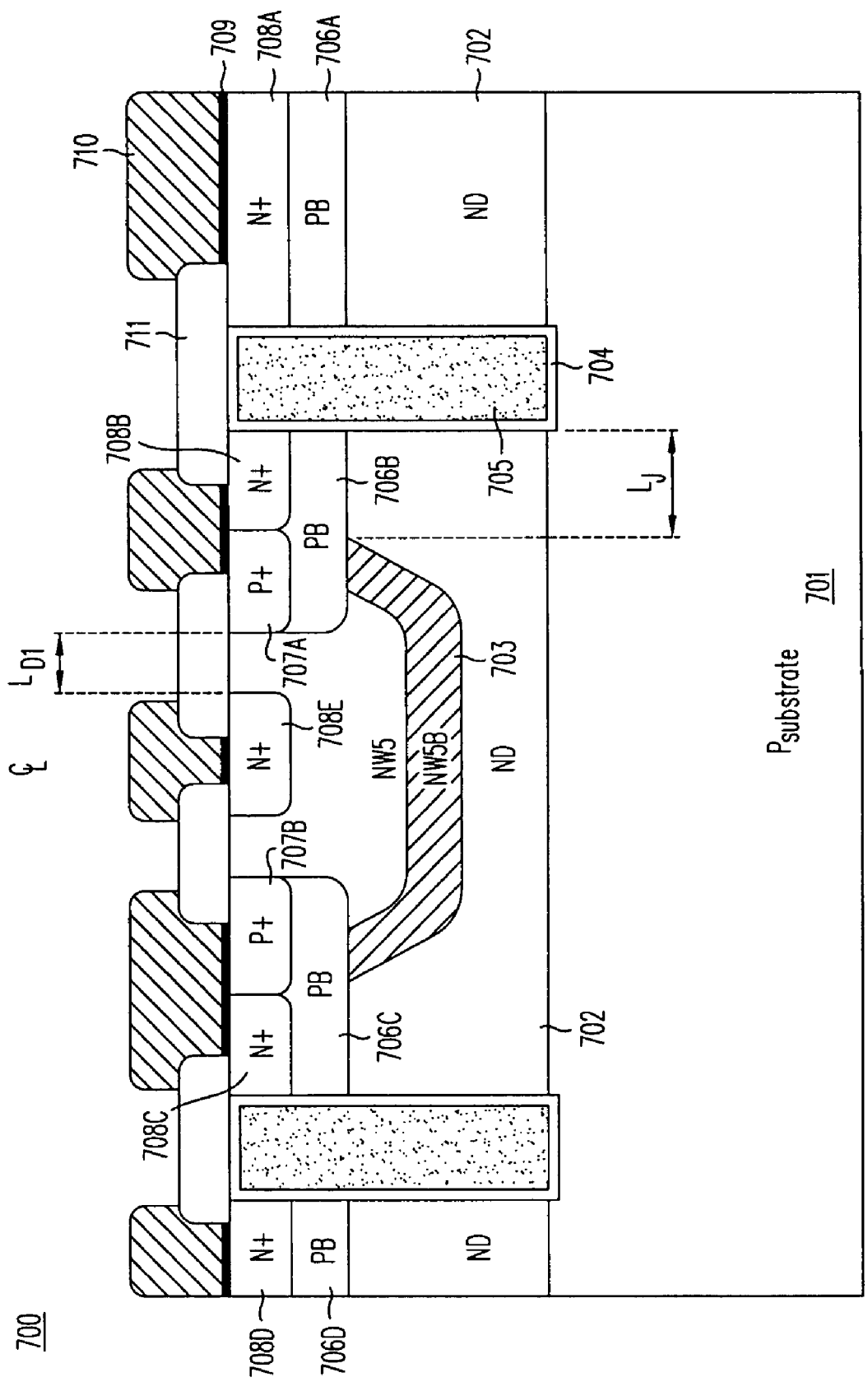

LTDMOS 700, shown in FIG. 17E, includes an N+ drain contact 708E surrounded by N-well 703, P+ body contacts 707A and 707B, chain-implanted P-type body regions 706A, 706B, 706C, and 706D, trench gate polysilicon 705 and gate oxide 704, N+ source regions 708A, 708B, 708C, and 708D, ILD 711, barrier metal 709, and interconnect metal 710. The entire device is formed within high-energy implanted drift region 702 and P-type substrate 701 without the need for epitaxy. As shown the center of N+ drain contact 708E is the center line of the symmetric device.

Electrically, N-well 703 and pinched portion of ND region 702 form the drift region of the device, where drift length $L_{D1}$ is defined from the edge of the N+ drain contact 708E to the edge of the P-body 706B. The pinched portion of ND region 702 extending from the edge of gate polysilicon 705 to the edge of N-well 703 has a length $L_J$. Lengthening either or both of these drift lengths $L_J$ and $L_{D1}$ may increase the BV of LTDMOS 700 but will also increase its on-resistance. Decreasing $L_{D1}$ and/or $L_J$ may cause N-well 703 to interfere with the channel region.

The substrate contact implant and contact ring and the outer termination of the device are not shown but may be achieved by extending the drift region 702 beyond the outer body regions using a design similar to that of LTDMOS 580 shown in FIGS. 16A and 16B.

Figure 17F:
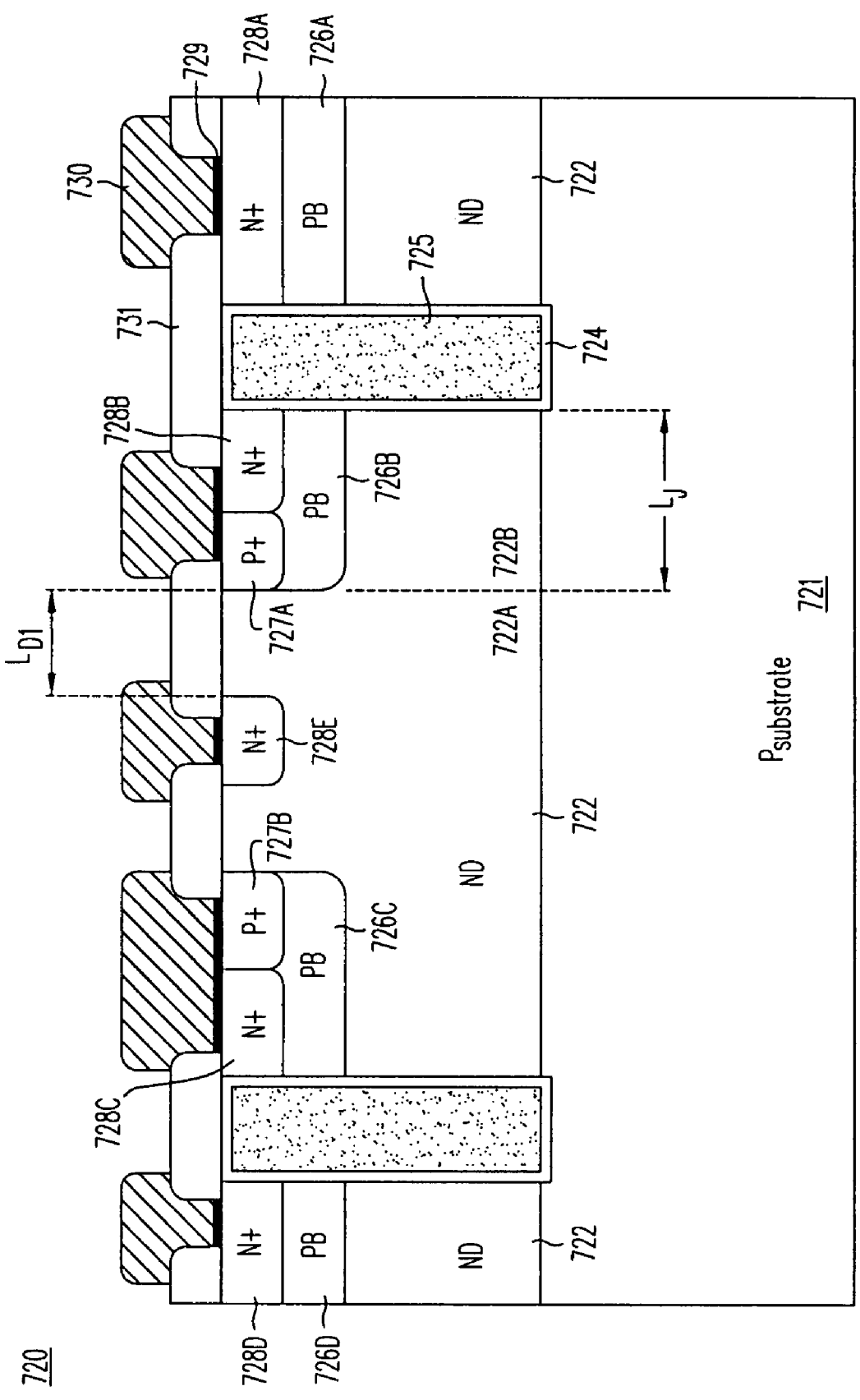

FIG. 17F shows an LTDMOS 720 having an N+ drain contact 728E surrounded by drift region 722 comprising a portion 722A not pinched by P-body 726B, and a portion 722B, pinched by P-type body 726B. The device also includes P+ body contacts 727B and 727C, chain-implanted P-type body regions 726A, 726B, 726C, and 726D, trench gate polysilicon 725 and gate oxide 724, N+ source regions 728A, 728B, 728C, and 728D, ILD 731, barrier metal 729, and interconnect metal 730. Unlike LTDMOS 700 shown in FIG. 17E, LTDMOS 720 includes no N-well deep drain. The entire device is formed within P-type substrate 721 without the need for epitaxy. As shown the center of N+ drain contact 728E is the center line of the symmetric device.

Electrically, the drift region of the device comprises a first section with length $L_{D1}$ defined from the edge of the N+ 728E to the edge of the P-body 726B, and a second section $L_J$ defined from the gate edge to the edge of P-body 726B. Lengthening either or both of these drift region lengths $L_J$ and $L_{D1}$ may increase the BV of the LTDMOS but will also increase its on-resistance. The substrate contact implant and contact ring and the outer termination of the device are not shown but may be achieved by extended the ND region 722 beyond the outer body regions using a design similar to the device of FIG. 16.

Figure 18A:
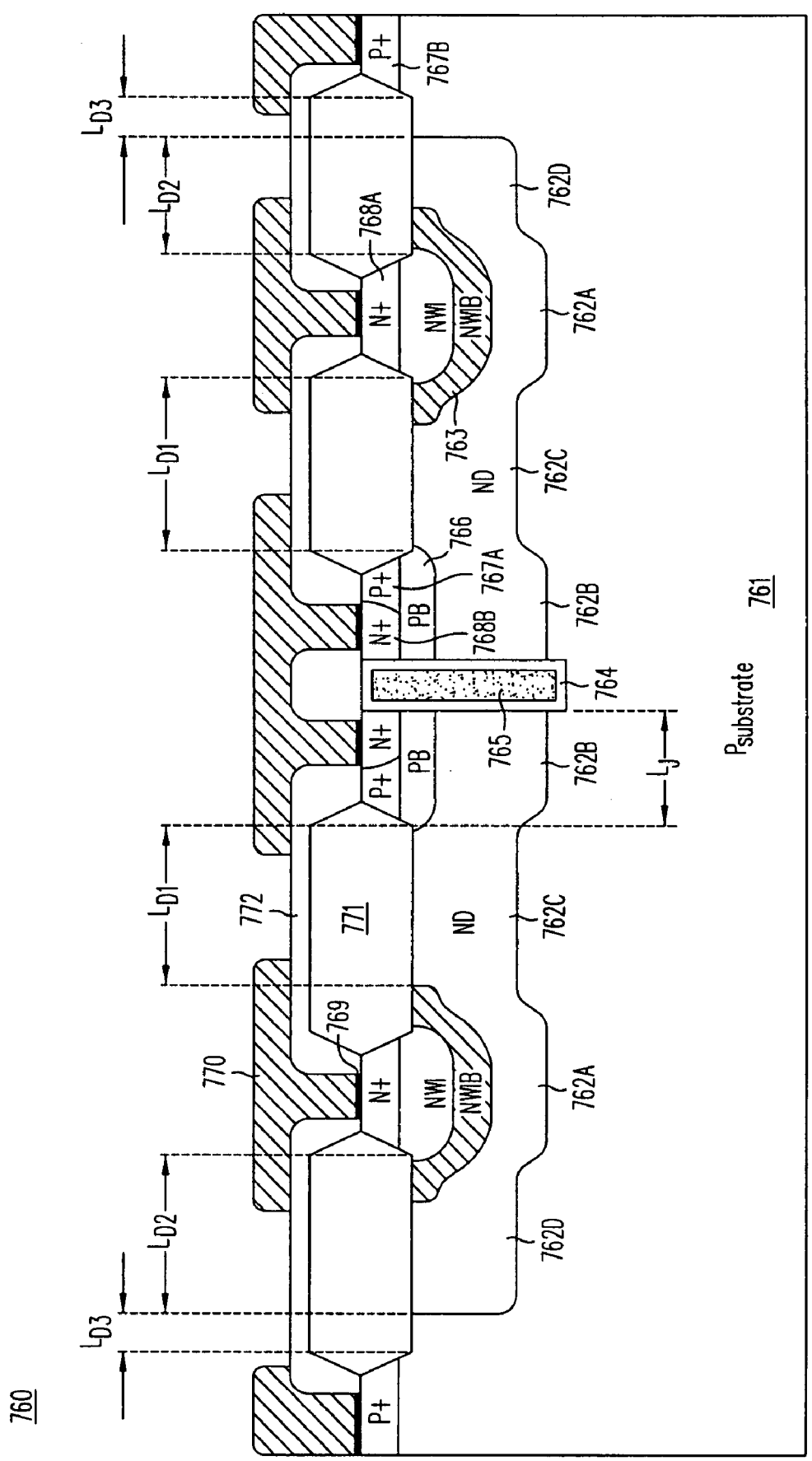
FIGS. 18A-18C illustrate the construction of a trench lateral DMOS surrounded by a drain.
Figure 18B:
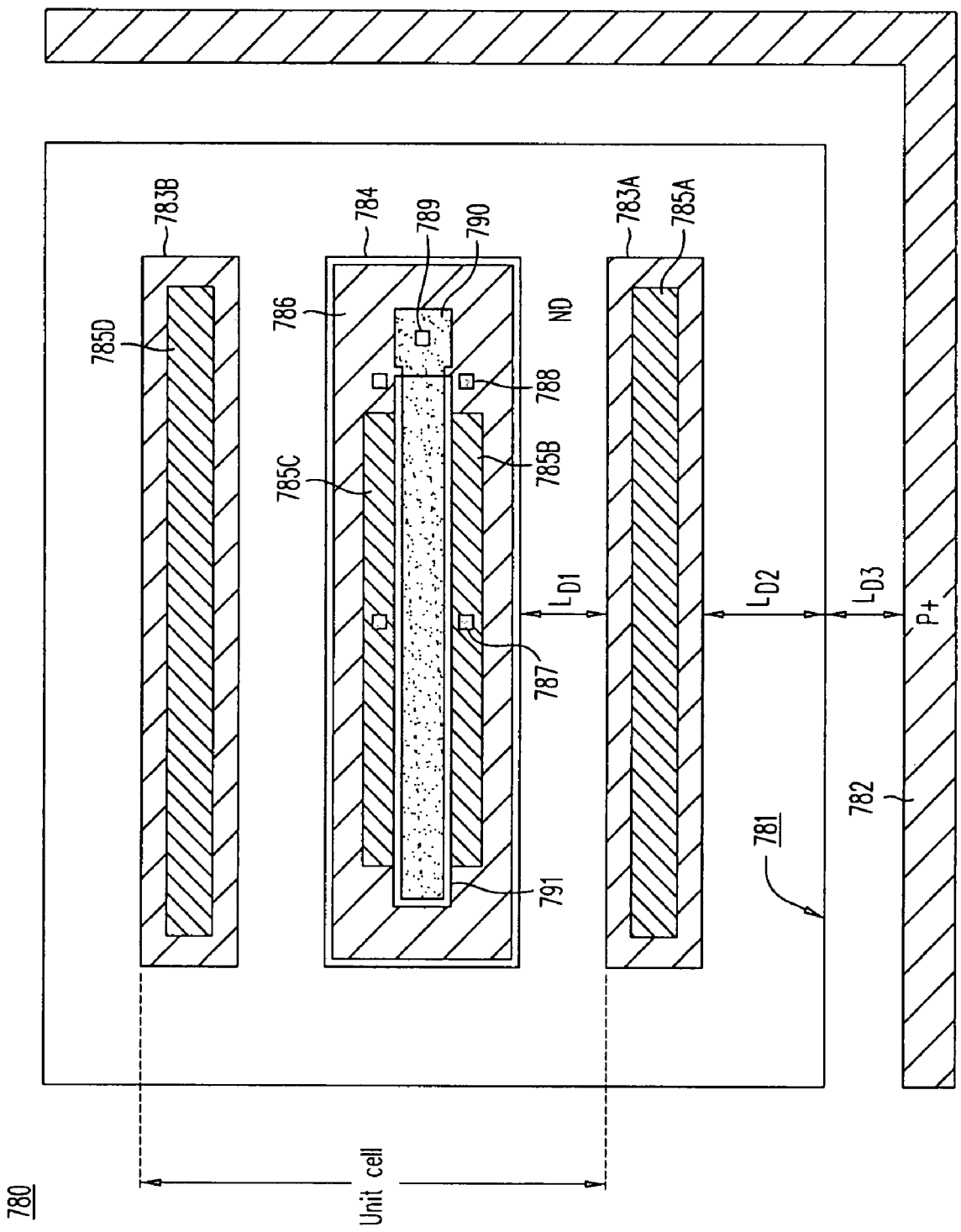
Figure 18C:
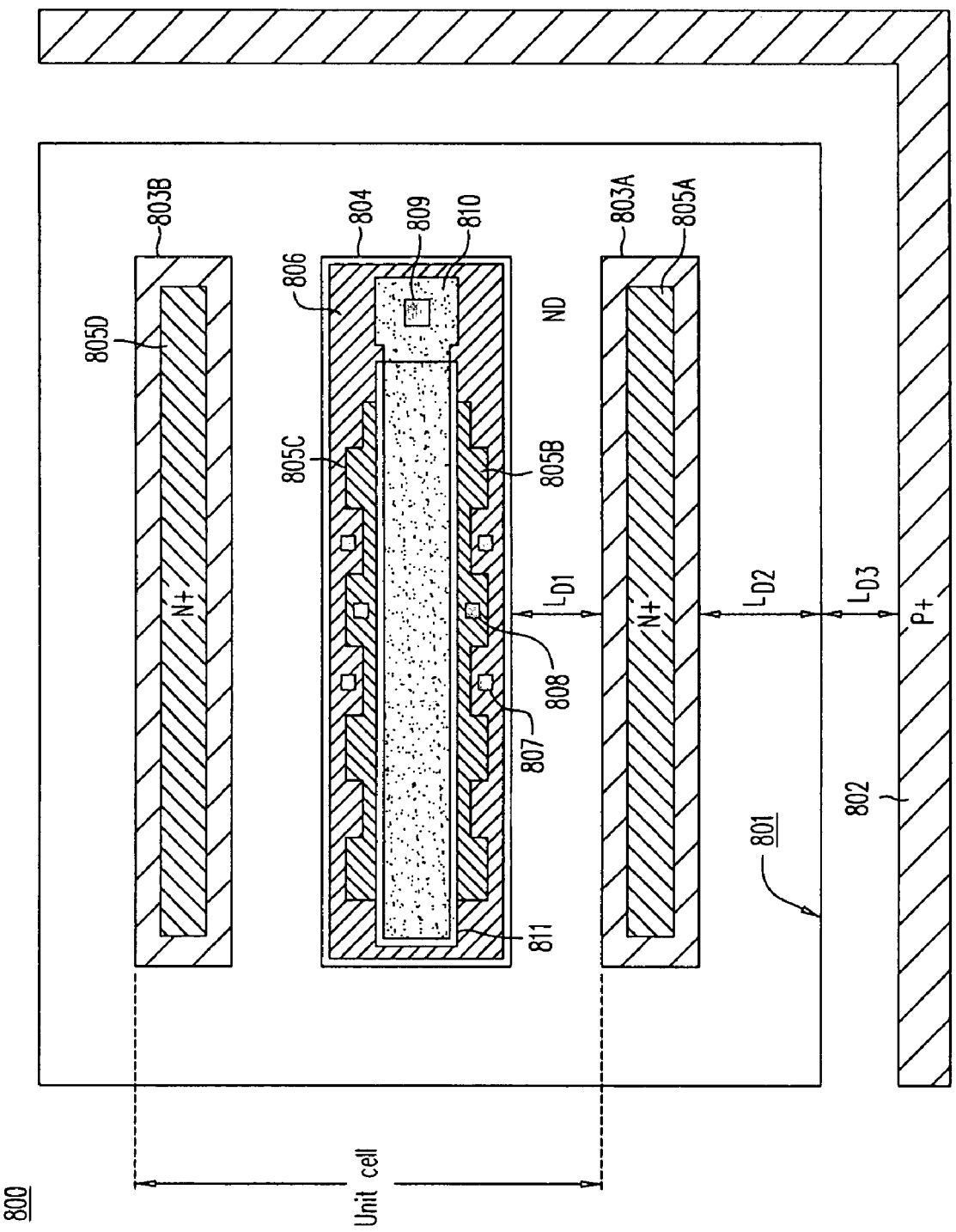

FIGS. 18A-18C illustrate the structure of an LTDMOS 760 including a ND region 762 formed conformal to field oxide layer 771, which is preferably formed by a LOCOS process. As shown in the cross-sectional view of FIG. 18A, LTDMOS 760 has a gate-centric design that includes trench gate polysilicon 765, gate oxide 764, N+ source 768B, P+ body contact 767A, chain implanted P-type body 766, optional N-well deep drain region 763, N+ drain contact 768A, substrate contact 767B, ILD 772, barrier metal 769, and interconnect metal 770.

Except for the bottom of the trench gate, the entire gate and drain structure is contained vertically within and laterally enclosed by implanted region ND region 762, comprising portions 762A, 762C and 762D not pinched by the P-body 766, and portion 762B, pinched by P-type body 766. The pinched portion extending from the gate edge to the edge of the P-type body 766 has a length $L_J$ (denoting a JFET-like region), while the edge of the P-body 766 to the edge of the N+ drain 768A or optional deep N-well drain 763 is defined as a drift length $L_{D1}$. The ND region 762 conforms to field oxide layer 771, thus being formed with a shallower depth and lower charge in regions 762C under field oxide layers 771 and a greater depth in drain region 762A and in body and gate region 762B. Lengthening $L_J$ and $L_{D1}$ increases the BV of LTDMOS 760 but also increases its on-resistance.

The outer termination between the drain and the P substrate 761 comprises an extension of drift region 762D for a length $L_{D2}$ and a substrate region of length $L_{D3}$ bounded by P+ substrate contact 767B. The outer termination length and doping affect the BV of LTDMOS 760, but do not affect its conduction properties. The entire device is formed in substrate 761 without the need of epitaxy.

FIG. 18B illustrates a top view of LTDMOS 780 including P+ substrate contact 782, which is in the form of a ring enclosing ND region 781, N-well regions 783A and 783B, N+ drain contacts 785A and 785B, P-body region 784 with N+ source regions 785B and 785C abutting P+ body contact 786, with trench 791 and trench polysilicon 790 contacted by contact window 789 where the polysilicon is sitting atop the silicon surface outside of trench 791. Source contact window 787 is shown contacting N+ source regions 785B and 785C since P+ body contact region 786 is too narrow along the sides to be contacted. This design reduces the width of P-body region 784 and the corresponding length $L_J$ of the pinched portion 762B of the drift region. The P+ body contact region 786 is contacted at the end of each finger by a separate contact 788. Alternatively the sources may be interrupted periodically along the gate finger to facilitate additional P+ contact regions.

Drift lengths $L_{D1}$, $L_{D2}$, and $L_{D3}$ are identified with respect to the defining dopant regions. A portion defined as a "unit cell" describes a portion which may be repeated to form larger devices as long as the ND region 781 and the P+ substrate contact region 782 are also expanded to accommodate the larger device. The ND region 781 may also fully enclose the P-body 784.

In an alternative embodiment the width of the P+ and N+ regions along the gate may be alternated to support alternating contacts. This approach is illustrated in FIG. 18C where source contact 808 contacts the wider portion of N+ source region 805B, 805C and body contact 807 contacts the wider portion of P+ body contact 806 in alternating periodicity. The entire structure is contained within the lateral footprint of P-body 766. This design reduces the width of P-body 766 and the corresponding length $L_J$ of the pinched portion of the drift region.

The remainder of this alternative embodiment includes P+ substrate contact 802, again in the form of a ring enclosing ND region 801, N-wells 803A and 803B, N+ drain contacts 805A and 805B, trench 811 and trench polysilicon 810 contacted by contact window 809 where the polysilicon is sitting atop the silicon surface outside of trench 811.

Isolated Lateral DMOS

Isolating an N-channel lateral DMOS without epitaxy requires the use of a high-energy implanted deep N-type (DN) layer. The DN layer can be considered a replacement for a conventional epitaxial buried layer, which normally spans the interface between an epitaxial layer and an underlying substrate, although the DN layer has unique properties that differentiate it from its high-temperature predecessor, especially that its formation doesn't require high temperature processing.

Figure 19A:
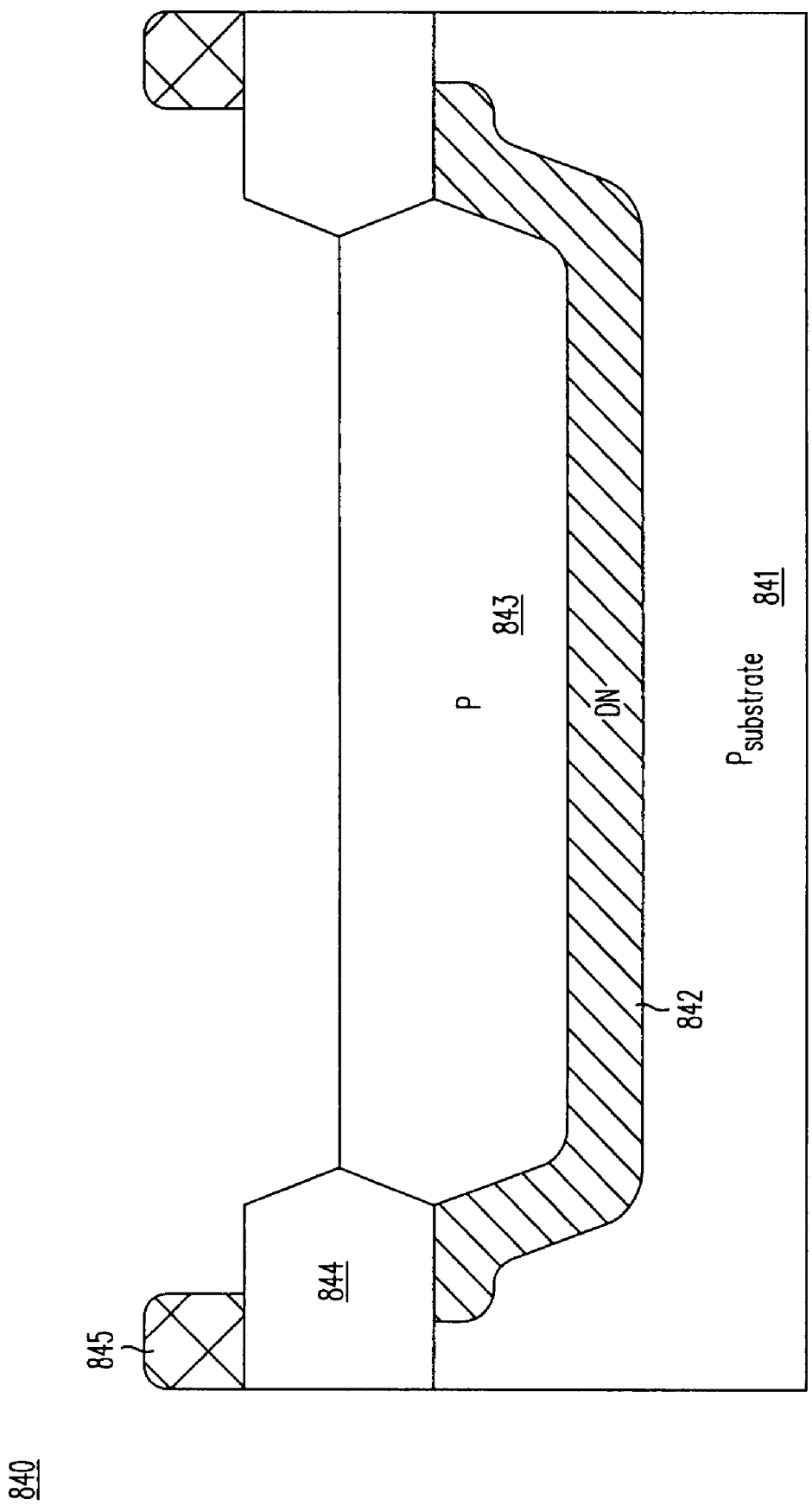
FIGS. 19A-19C are a series of cross-sectional views illustrating the fabrication of an isolated lateral DMOS.
Figure 19B:
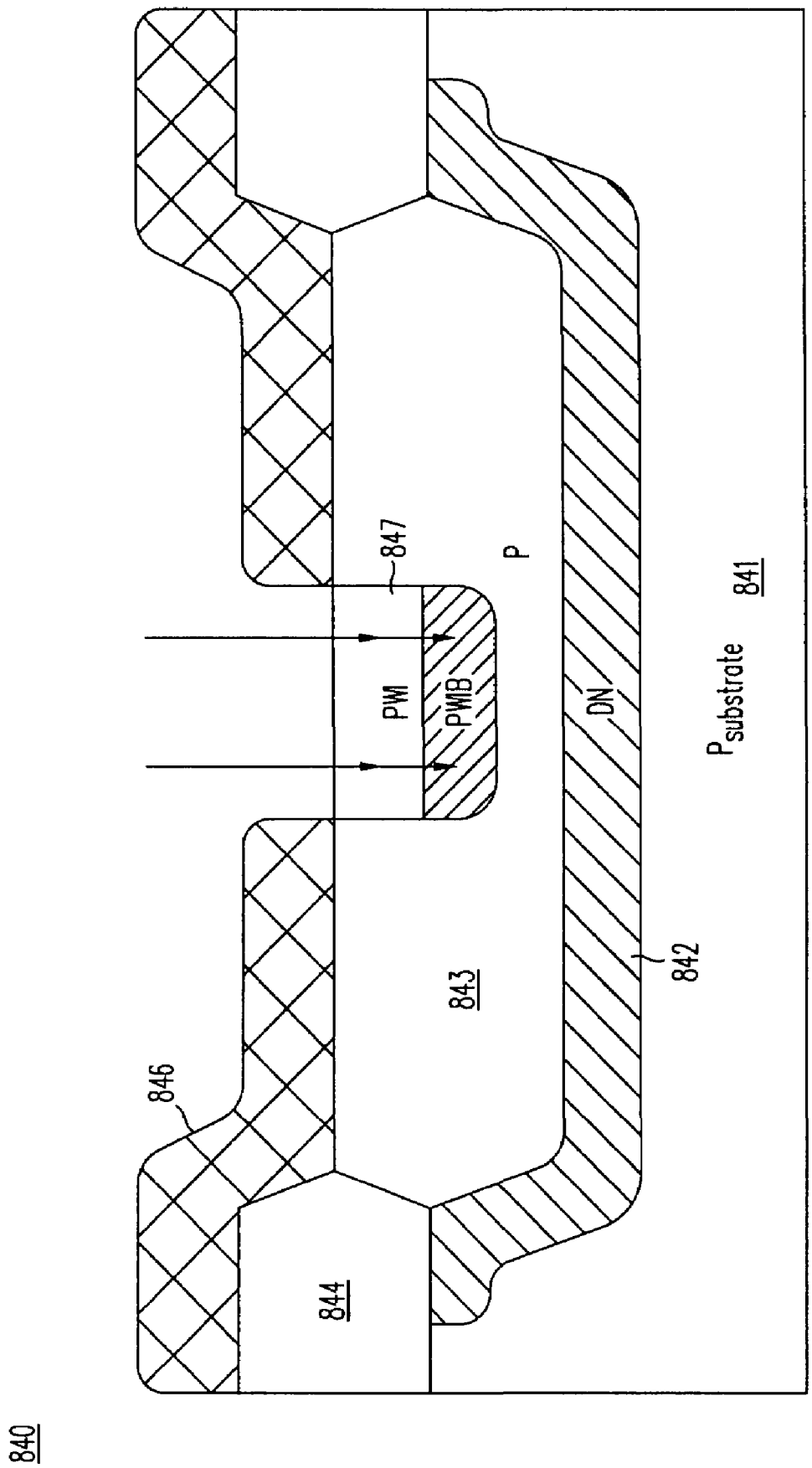
Figure 19C:
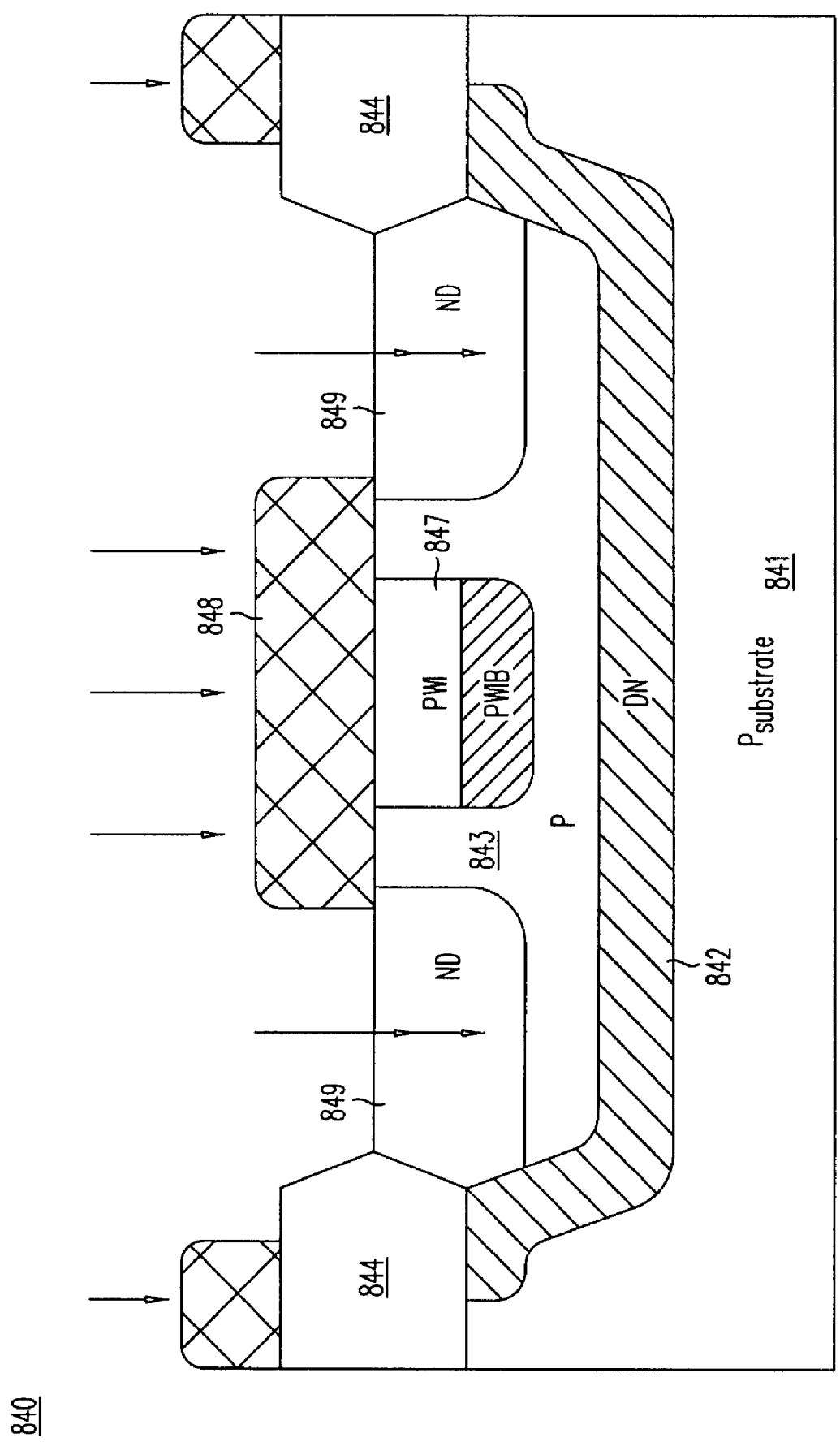

FIGS. 19A through 19C illustrate the use of the implanted DN layer in the fabrication of an isolated lateral DMOS 840, starting with the formation of an implant contouring field oxide layer 844 preferably using a LOCOS process sequence. The DN implant is then selectively masked with photoresist 845 or other appropriate mask and the DN isolation layer 842 is formed by one or more high-energy implantations of an N-type dopant, preferably phosphorous, into P-type substrate 841 to form isolated pocket 843. The DN layer 842 has a shallower junction depth under field oxide layer 844, making a gradual transition from its full depth under active transistor areas to its depth under the LOCOS oxide. In a preferred embodiment the sidewall of the isolation pocket is self forming beneath the LOCOS bird's beak transition region.

As shown in FIG. 19B, a P-type well 847 is introduced into a defined active area by ion implantation through photoresist mask 846. In the final device, this P-well will serve as the body of the lateral DMOS but because it precedes the gate formation, it is not self-aligned to the transistor's gate. Unlike a conventional diffused well which has its peak concentration near the surface and a monotonically decreasing concentration with increasing depth, P-type well 247 is formed by high energy ion implantation of P-type dopant, and preferably by a chain implant comprising a series of boron implants varying in dose and energy. The chain implant, while it may comprise any number of implants, is graphically represented in the drawing by two regions—a surface layer PW1, and a subsurface layer PW1B, formed by ion implantation through a single mask and without the use of epitaxy. In a preferred embodiment the doping concentration of the deeper layer is greater than that of the surface well. P-well 847 may comprise the P-well used for integrating other NMOS transistors or it may comprise a dedicated implant. A second P-well having different doping than the first P-well, e.g. PW2 and PW2B; may be substituted for the first P-well.

In FIG. 19C a deep N-type drift (ND) region 849 is selectively masked by photoresist 848 and implanted at a high energy into regions within isolated pocket 843. If implanted through LOCOS oxide 844, this ND region 849 conforms to the field oxide profile, forming a "conformal" drift. Alternatively the ND region 849 may be formed in only active areas. In another embodiment of this invention, the drift may comprise a shallow N− implant formed after the polysilicon gate, as described above in connection with non-isolated extended-drain MOS devices. A gate oxide, polysilicon gate, N+ source, N+ drain, P+ implant for P-well contacting, and interconnection (not shown) are then added to complete device fabrication. An additional N-well may also be used as a deep drain or to complete sidewall isolation of the P-type pocket as needed.

Figure 20:
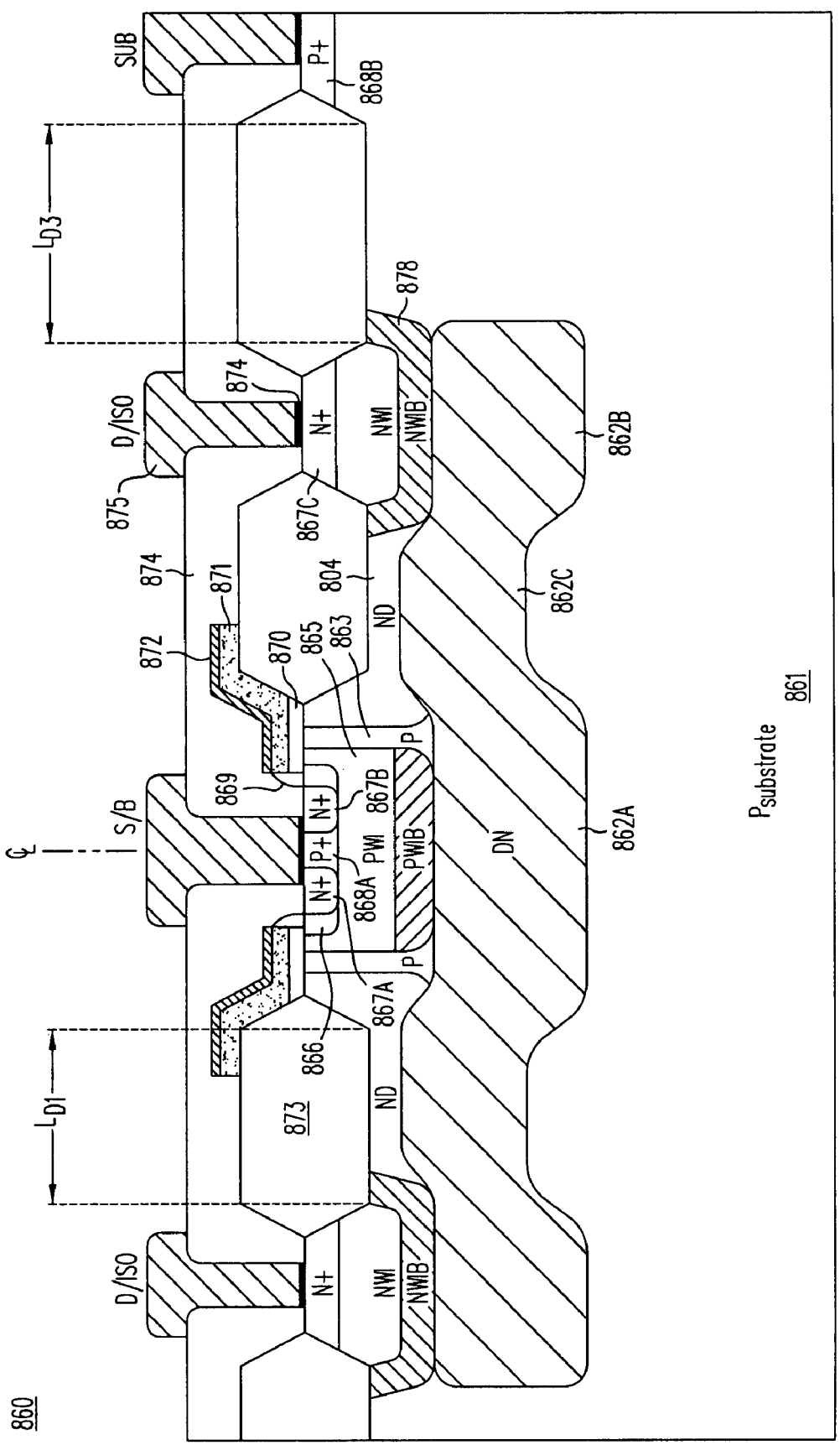
FIG. 20 is a cross-sectional view of an isolated lateral DMOS with a conformal deep drift drain region.

FIG. 20 illustrates an isolated symmetric lateral DMOS 860 with a conformal deep ND region 864 that may be formed using the process flow described above. The device as shown utilizes N-well 878 as a deep drain contact and as sidewall isolation overlapping a deeper portion 862B of DN floor isolation layer 862 in active areas, not under field oxide layer 873. The body of the isolated DMOS 860 comprises chain-implanted P-well 865 as described above, formed in isolated P-type pocket 863, sitting atop a deeper portion 862A of DN floor isolation layer 862 not under field oxide layer 873. Conformal ND region 864 overlaps a shallower portion 862C of DN floor isolation layer 862, having a shallower junction depth in portions beneath field oxide layer 873.

DMOS 860 of FIG. 20 further comprises gate oxide 870, polysilicon gate 871, gate silicide 872, P+ region 868A contacting the P-well and P+ region 868B contacting the substrate, N+ source regions 867A and 867B, N+ drain region 867C, and lightly doped region 866 beneath sidewall spacer oxide 869. Metal 875 with barrier metal 874 contacts the device through ILD 879.

Device 860 as shown is symmetric, with a line of symmetry at the center of the P+ region 868A. Drift length $L_{D1}$, the length of LOCOS oxide 873, influences the breakdown of the isolated junction, i.e. the DMOS drain to body breakdown, and also effects device on-resistance. Increasing the drift length to increase avalanche breakdown, however, is limited to a maximum voltage set by the breakdown between P-well 865 and portion 862A of DN layer 862. Drift length $L_{D3}$, defined as the space from N+ drain region 867C to P+ substrate contact 868B, determines the breakdown of the isolated device to the surrounding substrate 861.

Figure 21:
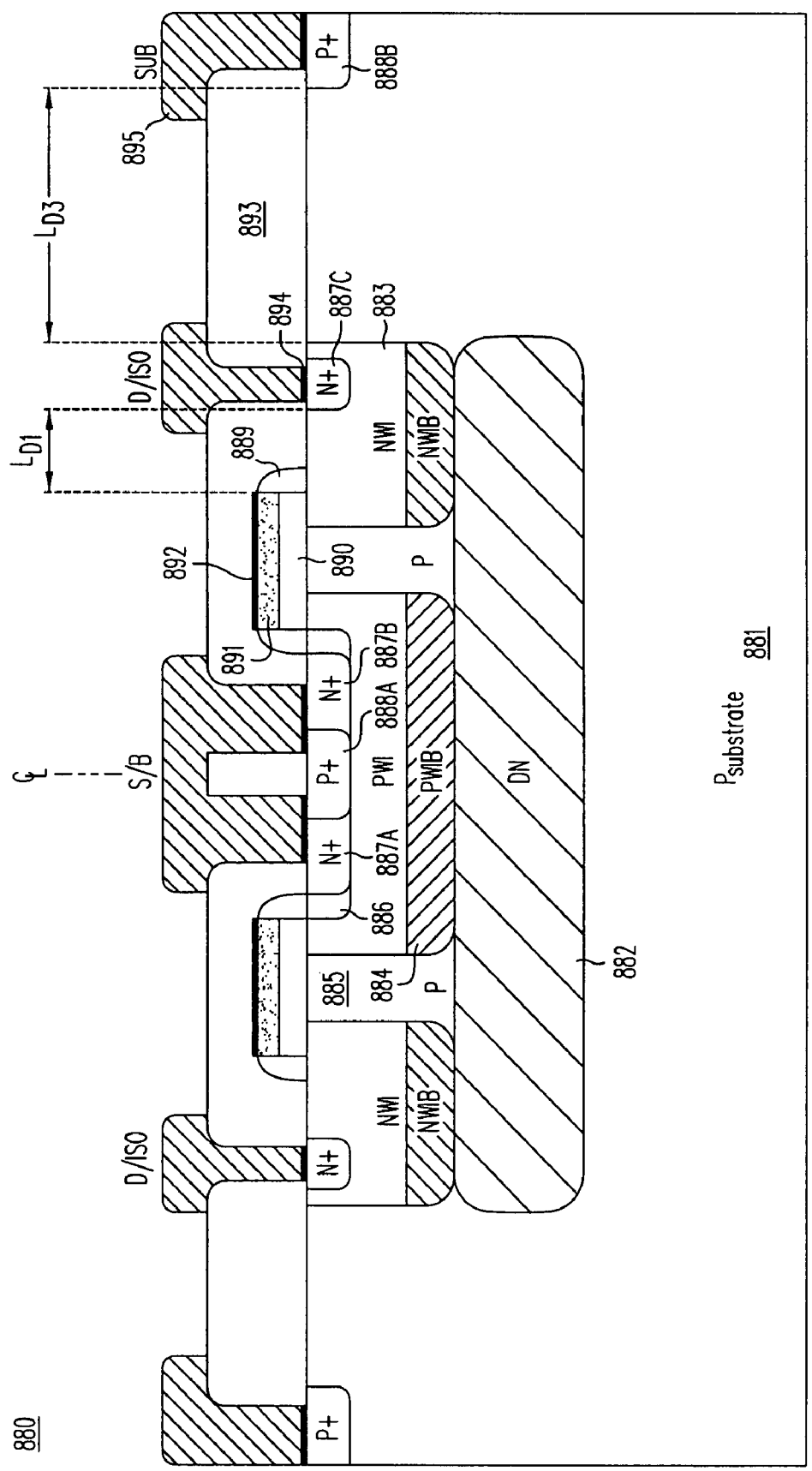
FIG. 21 is a cross-sectional view of an isolated lateral DMOS with a chained implanted N-well as a drifted drain region.

FIG. 21 illustrates an isolated lateral DMOS 880 without a field oxide layer over the drift region. Chain-implanted N-well 883 forms the drift region and serves as the sidewall isolation, overlapping onto DN isolation layer 882. Because the entire device is fabricated in active areas without the presence of field oxide, the device does not utilize any conformal junctions as in the previous example.

The body of the isolated DMOS 880 comprises chain-implanted P-well 884, formed as described above in isolated P-type pocket 885. The device further comprises gate oxide 890, polysilicon gate 891, gate silicide 892, P+ region 888A contacting the P-well 884 and P+ region 888B contacting the substrate 881, N+ source regions 887A and 887B, N+ drain region 887C, and lightly doped N region 886 beneath sidewall spacer oxide 889. Metal 895 with barrier metal 894 contacts the device through ILD 893.

DMOS 880 as shown is symmetric, with a centerline at the center of the P+ region 888A. Drift length $L_{D1}$, the space between N+ drain region 887C and gate 891, influences the breakdown of the isolated junction, i.e. the DMOS drain to body breakdown, and also affects device on-resistance. Increasing the drift length to increase avalanche breakdown, however, is limited to a maximum voltage set by the breakdown between P-well 884 and DN layer 882. Drift length $L_{D3}$, defined as the space from N-well 883 to P+ substrate contact 888B, determines the breakdown of the isolated device to the surrounding substrate 881.

Figure 22:
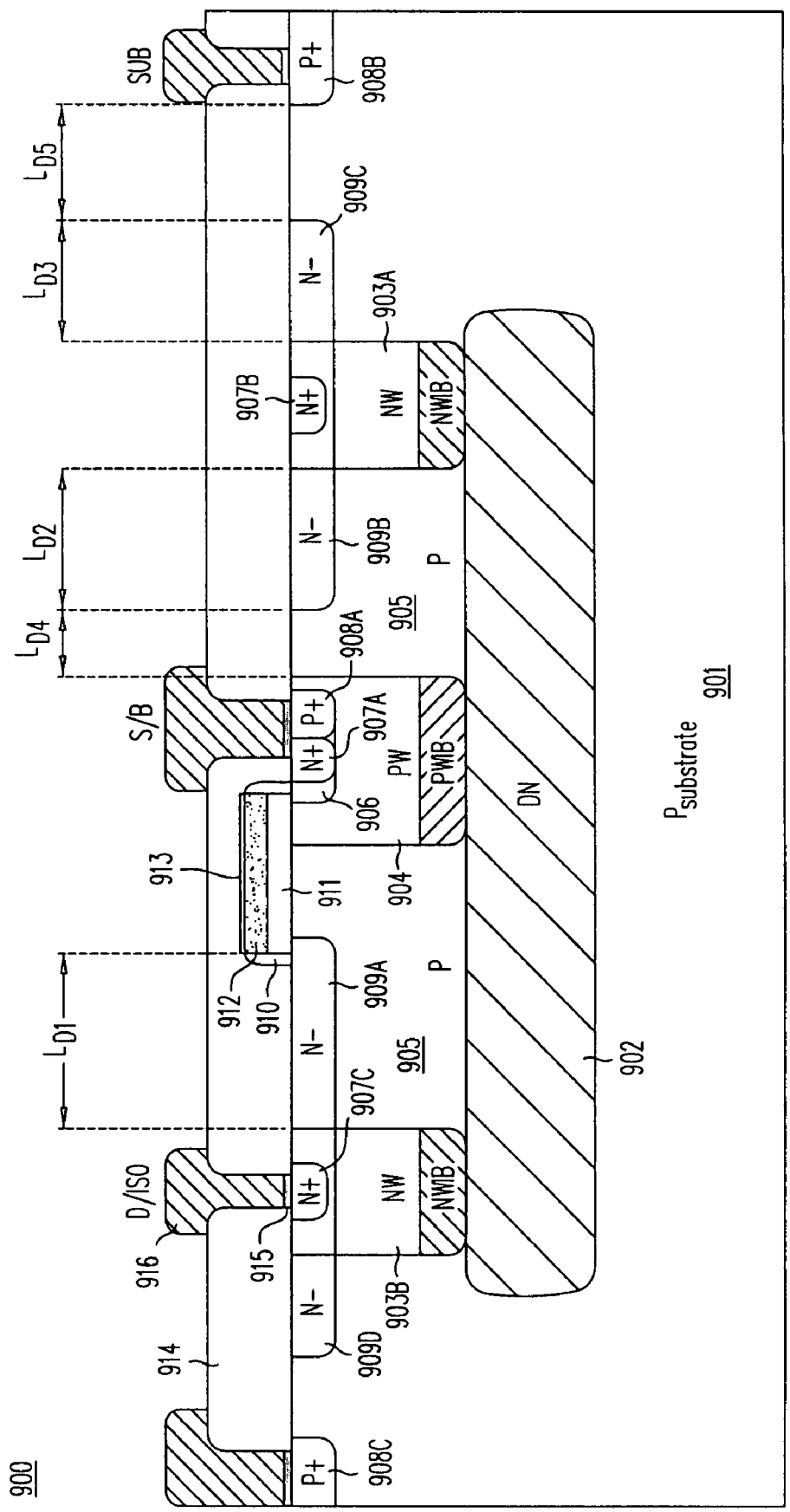
FIG. 22 is a cross-sectional view of an isolated lateral DMOS with a shallow N– drift drain region.

FIG. 22 illustrates an isolated lateral DMOS 900 using a shallow N-type region 909A and 909B to form the drift region. Sidewall isolation is formed using N-well 903A and 903B, overlapping onto DN layer 902. Because the entire device is fabricated in active areas without the presence of field oxide, the device does not utilize any conformal junctions generated by the presence of a discontinuous field oxide layer at the semiconductor surface.

The body of the isolated DMOS comprises chain-implanted P-well 904, formed as described above in isolated P-type pocket 905. The device further comprises gate oxide 911, polysilicon gate 912, gate silicide 913, P+ region 908A contacting the P-well 904, P+ region 908B contacting the substrate 901, N+ source region 907A, N+ drain region 907C, and lightly doped N region 906 beneath sidewall spacer oxide 910. Metal 916 with barrier metal 915 contacts the device through ILD 914.

Device 900 as shown is not symmetric, but instead includes a gate-to-drain drift region of length $L_{D1}$ and a P-well 904 to N-well 903A space equal to the sum of $L_{D2}$ and $L_{D4}$. Drift length $L_{D1}$, the space between N-well 903B and gate 911, influences the breakdown of the isolated junction, i.e. the DMOS drain to body breakdown, and also effects device on-resistance. Increasing the drift length to increase avalanche breakdown, however, is limited to a maximum voltage set by the breakdown between P-well 904 and DN layer 902. Drift length $L_{D2}$, the length of N– drift region 909B, and $L_{D4}$ the space between P-well 904 and N– drift region 909B, affect only the breakdown but not the transistor conduction properties. Drift length $L_{D3}$, defined as length of N– drift region 909C, and $L_{D5}$, the space from N– drift region 909C to substrate contact 908B, determine the breakdown of the isolated device to the surrounding substrate 901.

JFET and Depletion-Mode MOS Devices

Another class of transistors that can be fabricated by the process of this invention are normally-on or depletion-mode field effect transistors. Unlike enhancement-mode or normally-off transistors which do not conduct with their gate biased to the source (i.e. when $V_{GS}=0$), normally-on transistors conduct drain current substantially greater than leakage current even for zero gate drive, i.e. $I_{DSS}>>0$. Depletion-mode devices are beneficial in startup circuits or to implement constant current sources, especially for the high-voltage input supplying bias current to switching power supply control circuitry. Once start-up is achieved and a switching regulator is self-powering, a normally-on transistor can be shut off to save power and improve efficiency.

The normally-on transistors fabricated in this process architecture include N-channel depletion-mode MOS field effect transistors (or MOSFETs) and N-channel junction field effect transistors (or JFETs). N-channel normally-on devices exhibit a negative threshold ($V_{TN}<0$) and require an even greater negative gate-to-source bias to shut off or reduce the magnitude of drain current. Applying a positive gate potential can within limits increases drain current.

The gate of a depletion-mode MOS transistor reduces channel current by depleting the channel material of free carriers, using electrostatic control to form a depletion region, hence the term "field effect transistor". Provided that the gate can fully deplete the channel region, channel current of the device can be completely suppressed or "pinched-off". If the depletion region is not deep enough, however, to completely deplete the channel, the device will always conduct some current, a feature generally not desirable in power circuit applications. In the steady state, the maximum depth of the depletion region is limited by the formation of a surface inversion layer. Increasing the gate bias beyond this voltage does not increase the depth of the depletion region.

Because an MOS transistor has an insulated gate, its gate may be biased to enhance or suppress drain current. For either positive or negative gate biases, the maximum safe gate voltage of an MOS depletion-mode transistor is limited to the gate oxide rupture voltage, derated for reliability purposes to around 4 MV/cm. Though the gate may be biased to either polarity without conducting current, enhancing channel conduction by biasing the gate to accumulate rather than deplete channel carriers exhibits an asymptotic improvement in conductivity, and therefore is of limited benefit.

In contrast to the insulated gate of a depletion-mode MOS transistor, a JFET utilizes a reversed biased P-N junction as a gate to electrostatically induce a depletion region. Like the MOS-gated device, the reverse-biased gate to body (channel) depletes the channel of carriers to suppress drain current. Provided the depletion region can fully deplete the channel region, channel current of the device can be completely suppressed or "pinched-off". If the depletion region is not deep enough, however, to completely deplete the channel, the device will always conduct some current, a feature generally not desirable in power circuit applications.

The maximum gate voltage to suppress drain current or shut off a JFET is limited by its drain-to-gate junction breakdown $BV_{DG}$ or gate-to-source junction breakdown voltage or $BV_{GS}$. In contrast, the maximum voltage to enhance conduction is limited to the forward biasing of the JFET gate, namely 0.6V for a silicon P-N junction gate. Enhancing conduction by biasing the gate to accumulate rather than deplete channel carriers is asymptotic, and of limited benefit, especially considering the limited range in enhancing gate bias possible.

The integration of depletion-mode or JFET devices is not commonly possible in conventional integrated circuit processes, especially for operation at high voltage. Their fabrication often involves high temperature processes and diffusion, offering poor control of the MOS threshold or JFET pinch-off voltage. The devices of this invention, however, do not rely on high temperature processes and thereby offer superior pinch-off control with low off-state leakage capability.

Figure 23:
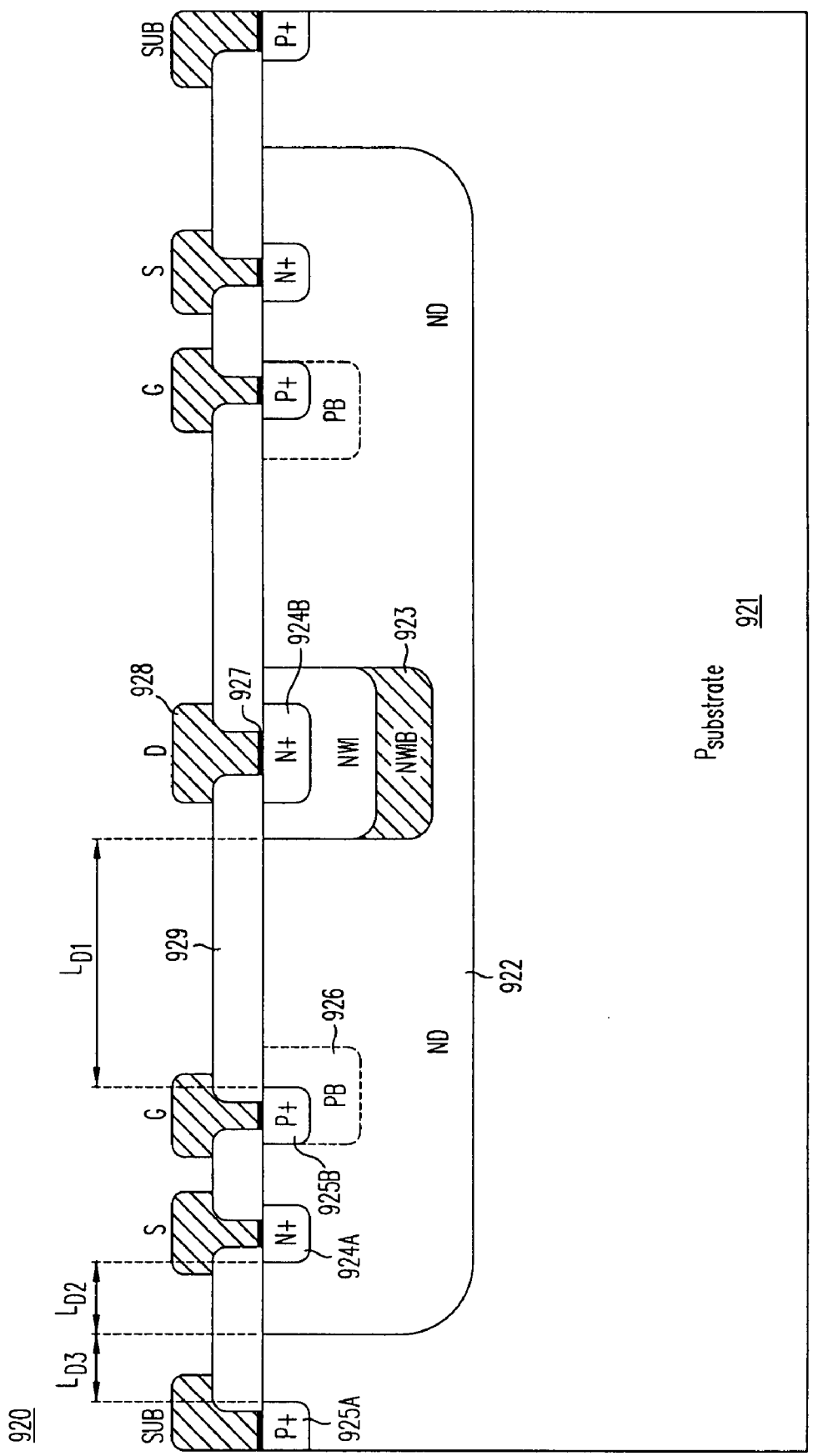
FIG. 23 is a cross-sectional view of a high voltage JFET with a uniform deep drifted drain region.

FIG. 23 illustrates a high voltage JFET 920 with ND region 922 fabricated using the disclosed low-temperature process and preferably formed using one or more high-energy implantation steps. In this device, N+ region 924A forms the JFET source, N+ region 924B and optional N-well 923 forms the JFET drain, and P+ region 925B forms the JFET gate via the PN junction formed with the ND region 922. The portion of ND region 922 that is pinched under P+ region 925B serves as the channel of the JFET, and the portion of ND region 922 extending from P+ region 925B to N+ region 924B or optional N-well 923 forms a high voltage drift region of length $L_{D1}$. Some channel pinching occurs from the P-N junction formed between ND region 922 and P-type substrate 921, but this back-gate effect is substantially less than the influence of the bias on P+ gate region 925B. The pinch-off can be further adjusted by including an optional P-body or P-base layer 926 as part of the JFET gate. The gate, source, and drain are contacted with interconnect metal 928 and barrier metal 927 extending through ILD 929.

The source voltage of JFET 920 may be floated to a potential above the substrate, e.g. as a high side device, by properly spacing P+substrate contact region 925A from N+ source region 924A. This distance includes a portion of ND region 922 of length $L_{D2}$ and a distance $L_{D3}$ from ND region 922 to the P+ substrate contact region 925A. As shown, the device is symmetric with the line of symmetry centered on drain N+ 924B.

Figure 24:
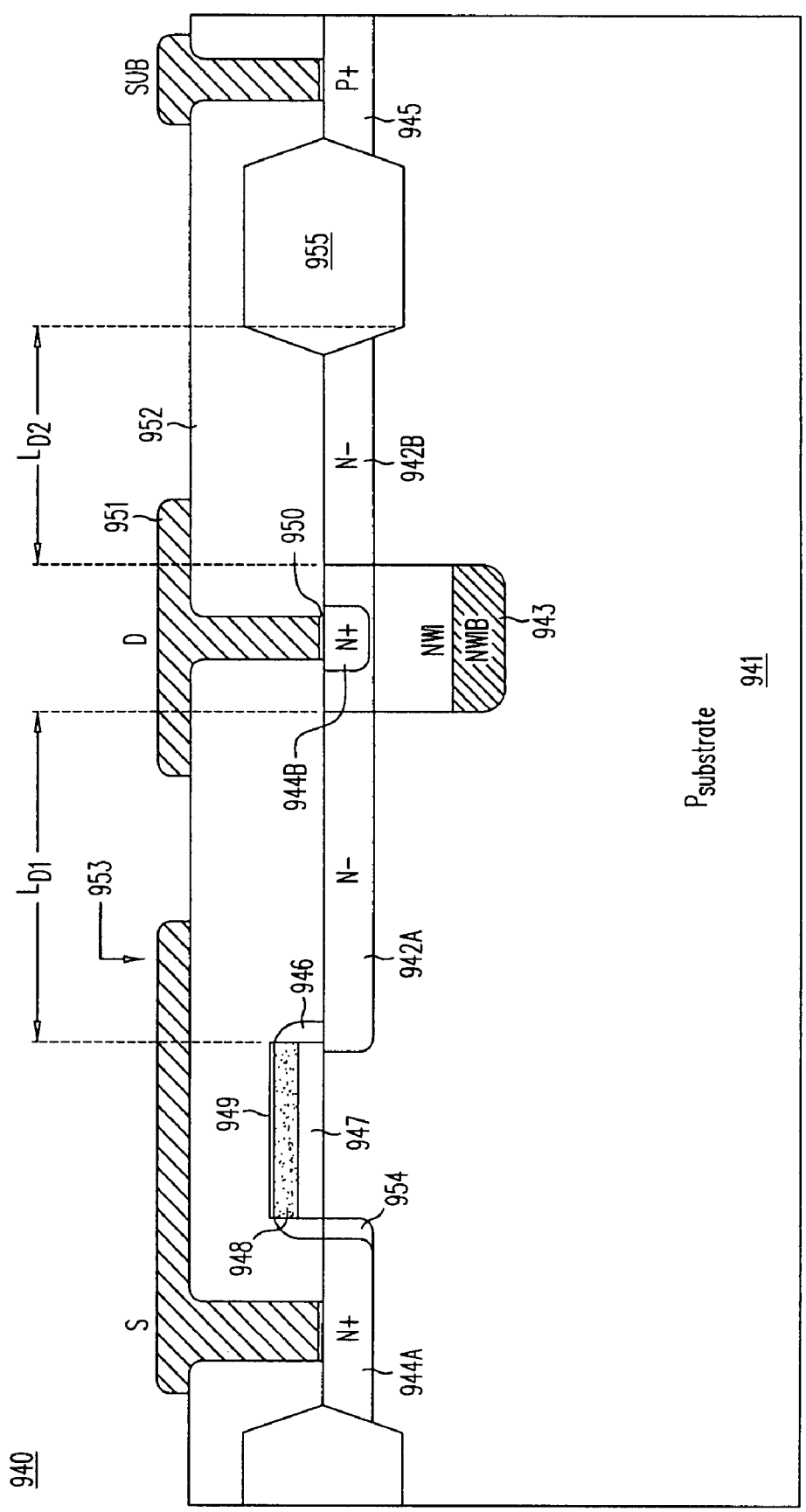
FIG. 24 is a cross-sectional view of a depletion-mode NMOS with a shallow LDD.

FIG. 24 illustrates a depletion-mode NMOS 940 with a lightly doped drain (LDD) drift region 942A. Unlike a conventional enhancement mode NMOS or lateral DMOS, NMOS 940 has no P-well surrounding the source or otherwise enclosing the device. The low threshold is set by the doping of lightly doped substrate 941, the thickness of gate oxide 947, and gate material 948. With proper adjustment of these parameters, a device threshold voltage of 0V to −1V is possible.

Depletion-mode NMOS 940 also includes N+ source 944A, N+ drain 944B, optional N-well deep drain 943, gate oxide 947 which may comprise a first or second gate oxide, gate 948 with optional silicide 949, sidewall spacer 946, source extension 954, P+ substrate contact region 945, field oxide layer 955, ILD 952, metal interconnect 951, and barrier metal 950.

Drift region 942, introduced subsequent to and self-aligned to gate 948 and field oxide layer 955 surrounds and encloses drain 944B, laterally extending to gate 948 as N-drift region 942A with a length of $L_{D1}$, and laterally extending to the field oxide layer 955 as N− drift region 942B of length $L_{D2}$. To reduce the electric field at the edge of drift region 942A abutting gate 948, metal field plate 953 may optionally extend above and beyond the gate 948 and into the region above the drift region 942A.

With a low concentration P-type substrate 941, preventing punch-through breakdown between drifted drain 942A and N+ source 944A requires a gate length of polysilicon gate 948 exceeding minimum dimensions. Optional high-energy implanted deep P-type (DP) layer 956 may also be used to prevent punch-through. This layer may overlap a portion of gate 948, as shown, or may extend more (overlapping a portion of 942A) or less (not extending beyond 954), depending on the doping levels and device construction. Depending on implant conditions, a tail of DP doping may extend up to the channel area under gate 948 and influence the VT of the depletion-mode device.

Figure 25:
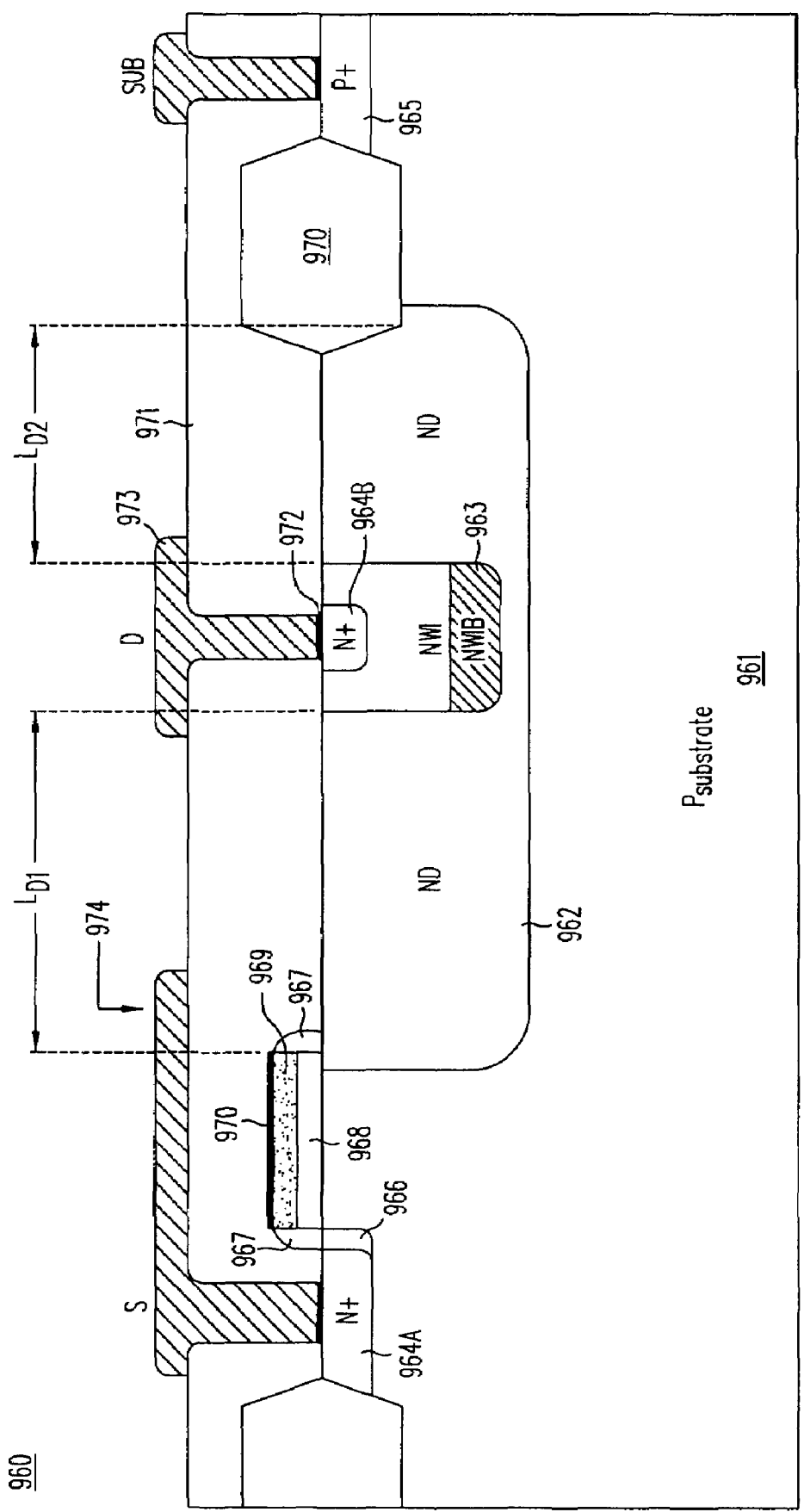
FIG. 25 is a cross-sectional view of a depletion-mode NMOS with a uniform deep drifted drain region.

FIG. 25 illustrates a depletion-mode NMOS 960 with ND region 962 implanted prior to gate formation. Unlike a conventional enhancement mode NMOS or lateral DMOS, NMOS 960 has no P-well surrounding the source or otherwise enclosing the device. The low threshold is set by the doping of lightly doped substrate 961, the thickness of gate oxide 968, and gate material 969. With proper adjustment of these parameters, a device threshold voltage of 0V to −1V is possible.

Depletion-mode NMOS 960 also includes N+ source region 964A, N+ drain region 964B, optional deep drain N-well 963, gate oxide 968 which may comprise a first or second gate oxide, gate 969, optional gate silicide 970, sidewall spacer 967, N source extension 966, P+ substrate contact 965, field oxide layer 970, ILD 971, metal interconnect 973, and barrier metal 972.

Deep implanted ND region 962 is introduced prior to and therefore not self-aligned to gate 969. Field oxide layer 970 surrounds and encloses drain 964B. ND region 962 laterally extends to gate 969 with a length of $L_{D1}$, and laterally extends to field oxide layer 970 with a length $L_{D2}$. To reduce the electric field at the edge of drift region 962 abutting gate 969, metal field plate 974 may extend above and beyond the gate 964 and into the region above ND region 962. With low concentration P-type substrate 961, preventing punch-through breakdown between ND region 962 and N+ source region 964A requires a gate length of polysilicon gate 969 equal to or exceeding a minimum dimension. A deep P layer similar to DP layer 956, described above, could also be included in NMOS 960.

Figure 26:
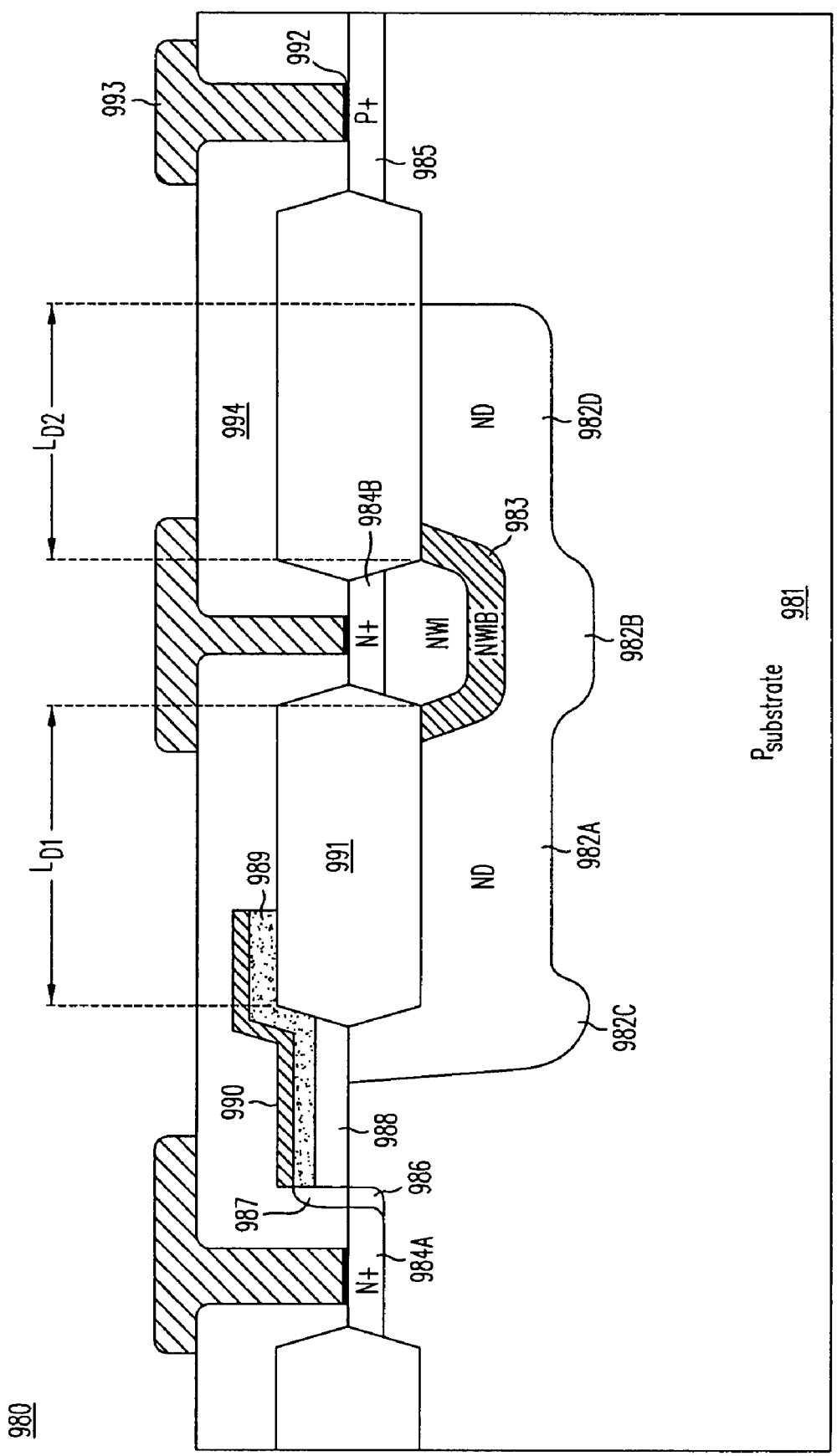
FIG. 26 is a cross-sectional view of a depletion-mode NMOS with a conformal deep drifted drain region.

FIG. 26 illustrates a depletion-mode NMOS 980 with a deep conformal N-type drift region 982 implanted prior to gate formation. The low threshold is set by the lightly doped substrate 981 and thin gate 989. As described above, DMOS 980 has no P-well surrounding the source or otherwise enclosing the device, so a device threshold of 0V to −1V is possible.

DMOS 980 also includes N+ source region 984A, N+ drain region 984B, optional deep drain N-well 983, gate oxide 988 which may comprise a first or second gate oxide, gate 989, optional gate silicide 990, sidewall spacer 987, N source extension 986, P+substrate contact 985, field oxide layer 991, ILD 994, metal interconnect 993, and barrier metal 992.

Deep implanted conformal ND region 982, introduced prior to and therefore not self-aligned to gate 989, surrounds and encloses drain 984B, laterally extends to active gate 989 as drift region 982A with a length of $L_{D1}$, corresponding to the length of field oxide layer 991. A portion 982D of ND region 982 laterally extends under field oxide on the side not facing the gate with a length $L_{D2}$. The depth of the conformal ND region 982 under field oxide layer 991, as shown by portions 982A and 982D of ND region 982, is shallower than the portions 982B and 982C of ND region 982 that are located under the drain 984B and the gate 989. With low concentration P-type substrate 981, preventing punch-through breakdown between deep portion 982C of ND region 982 and N+ source region 984A requires a gate length of polysilicon gate 989 equal to or exceeding a minimum dimension. A DP layer similar to DP layer 956, described above, could also be included in NMOS 980.

Figure 27A:
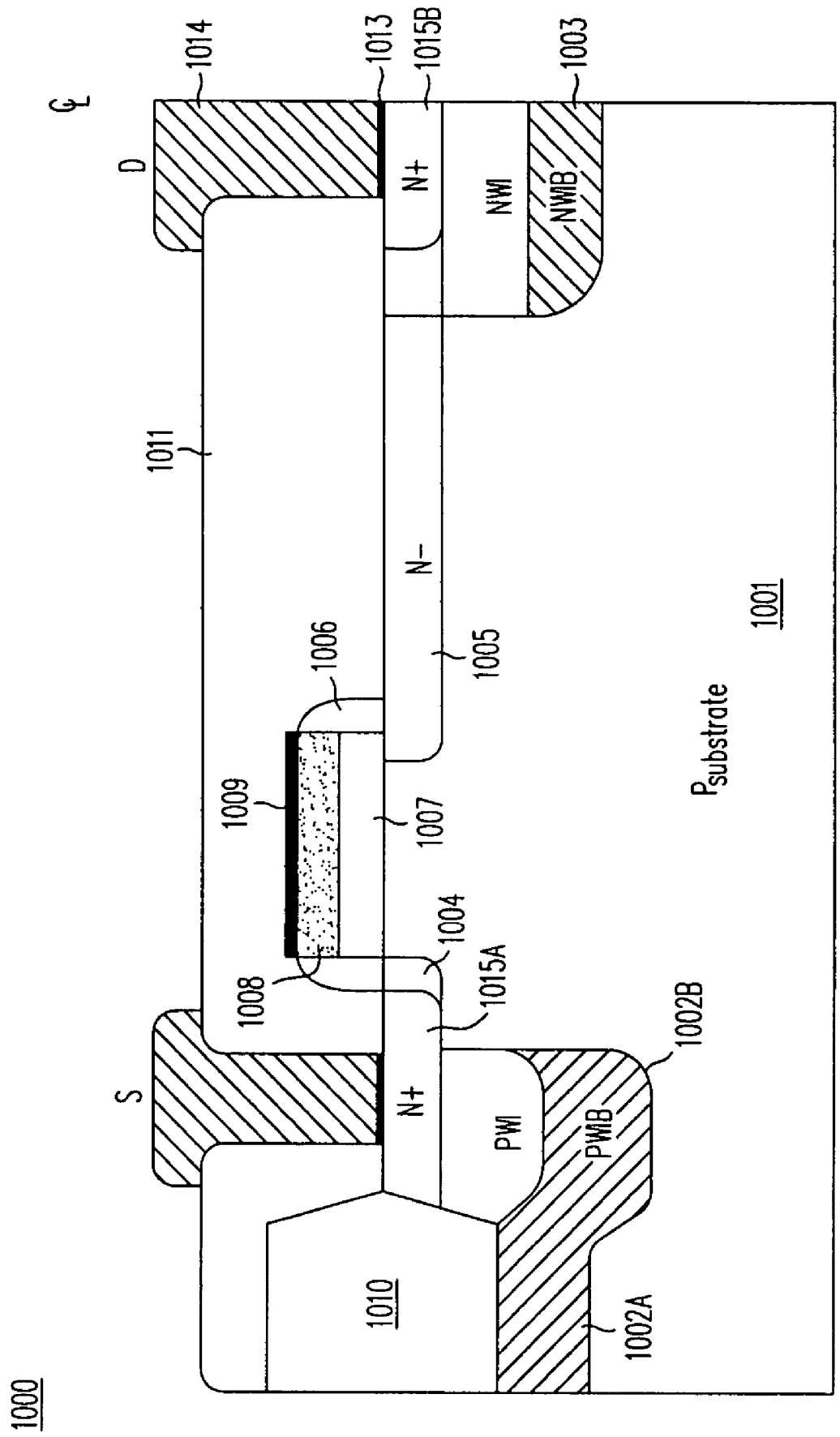
FIGS. 27A-27C are cross-sectional views of variants of a depletion-mode NMOS with a subsurface source shield.
Figure 27B:
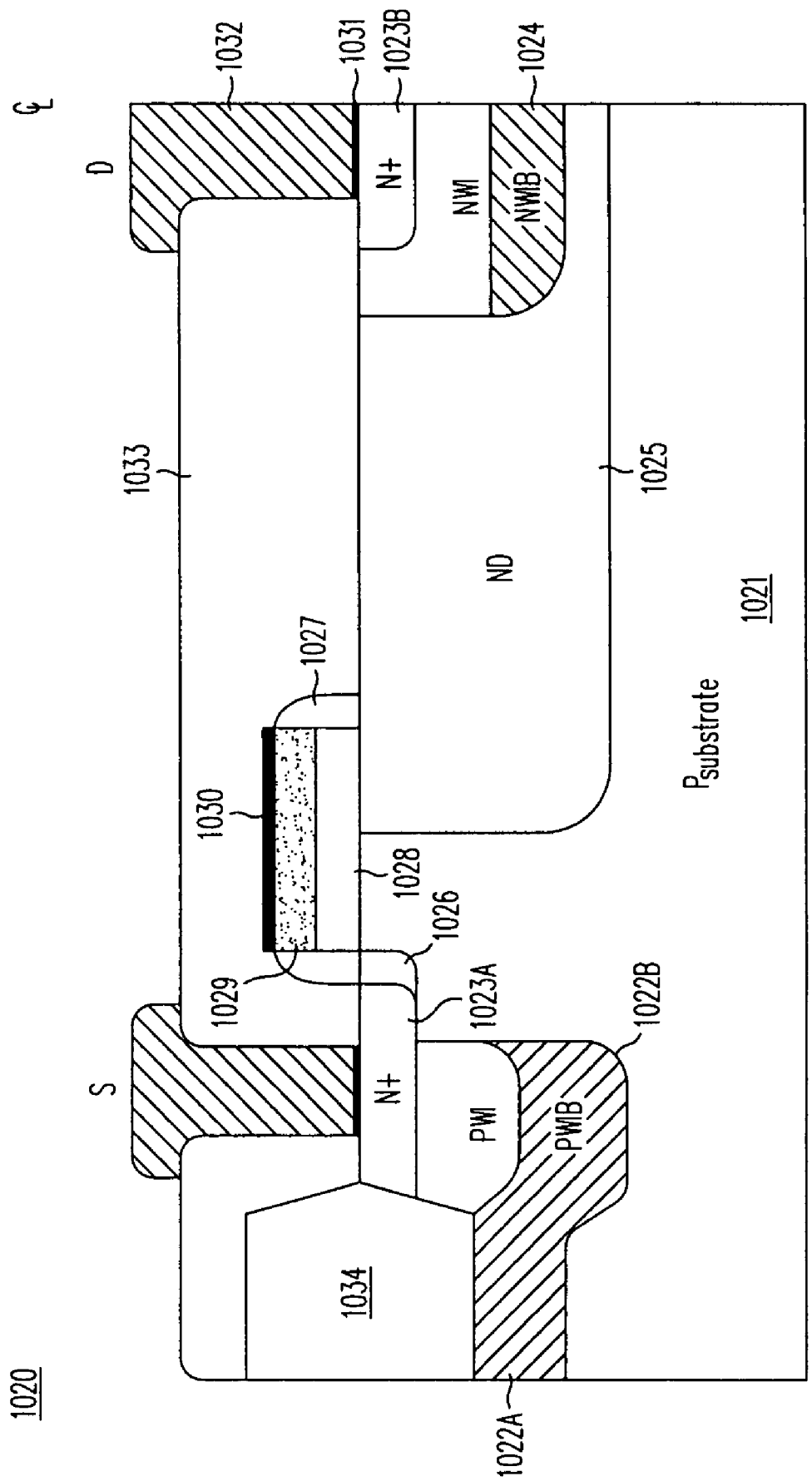
Figure 27C:
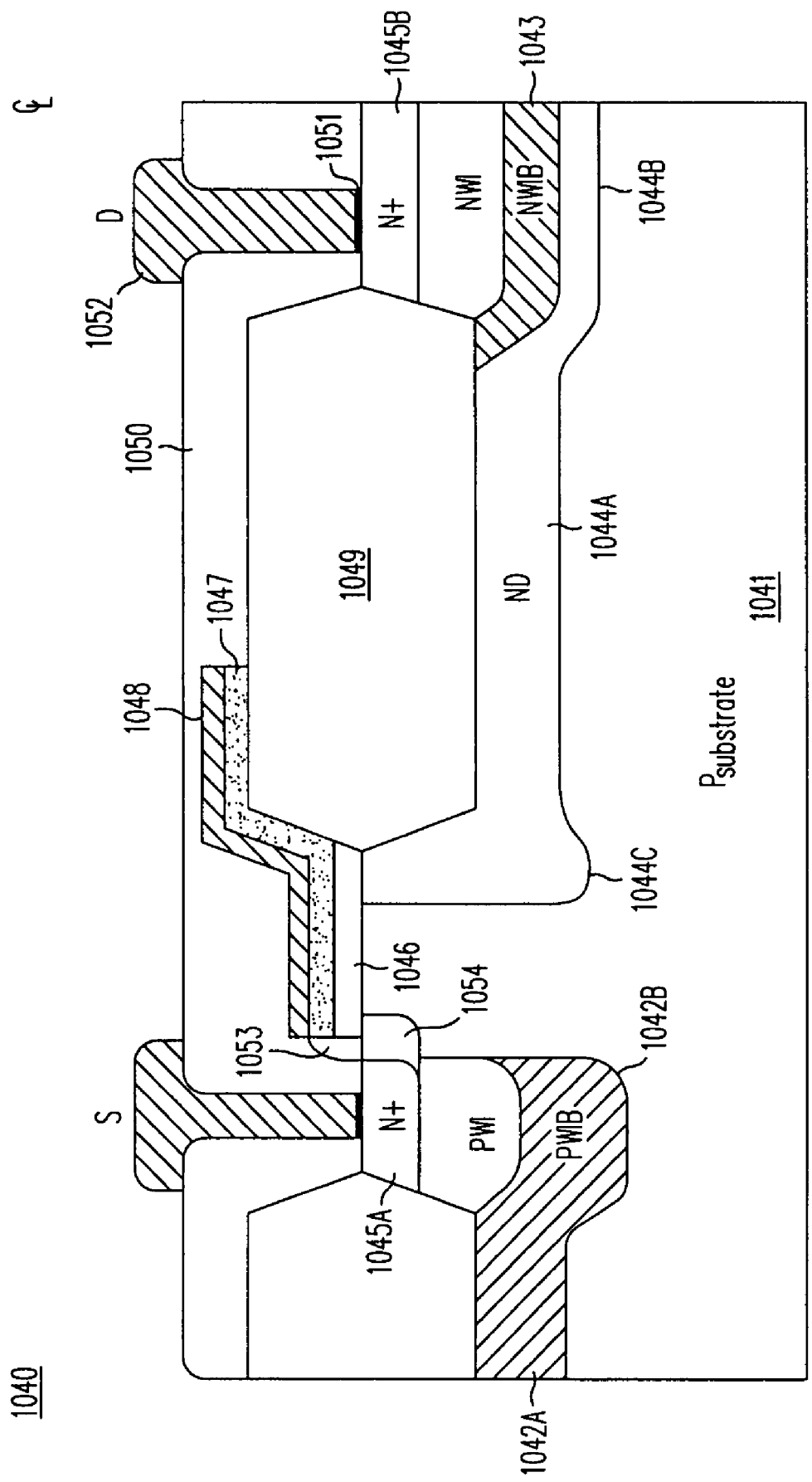

FIGS. 27A-27C illustrate the three depletion-mode NMOS devices shown in FIGS. 24 through 26, modified to include a P-type subsurface shield. This shield is included to reduce the onset on NPN parasitic bipolar conduction and to suppress snapback effects.

As an example similar to NMOS 940 of FIG. 24, FIG. 27A illustrates a depletion-mode NMOS 1000 with a shallow N− lightly doped drain (LDD) and a subsurface shield 1002. The low threshold is set by the lightly doped substrate 1001 and thin gate oxide 1007. Unlike a conventional enhancement mode NMOS or lateral DMOS, NMOS 940 has no P-well extending beyond the source or into the channel under the gate, but it does include chain-implanted P-well 1002A and 1002B extending from under LOCOS field oxide layer 1010 to beneath N+ source region 1015A. Depending on the doping concentration of P substrate 1001 and the thickness of gate oxide 1007, a device threshold of 0V to −1V will result.

NMOS 940 also includes N+ drain 1015B, optional N-well deep drain 1003, gate oxide 1007 which may comprise a first or second gate oxide, gate polysilicon 1008, gate silicide 1009, sidewall oxide 1006, a short lightly-doped N source extension 1004 (an artifact of the sidewall spacer manufacturing process), shallow LDD drift region 1005, ILD 1011, metal interconnect 1014, and barrier metal 1013.

FIG. 27B illustrates a depletion-mode NMOS 1020 that is similar to the NMOS 960 shown in FIG. 25, with a deep N-type drift 1025 implanted prior to gate formation. The low threshold is set by the lightly-doped substrate 1021 and thin gate oxide 1028 but with the addition of a subsurface shield 1022. Unlike a conventional enhancement mode NMOS or lateral DMOS, depletion-mode NMOS 1020 has no P-well extending beyond the source or into the channel under the gate, but it does include chain-implanted P-well 1022A and 1022B extending from under field oxide layer 1034 to beneath N+ source region 1023A. Depending on the doping concentration of P substrate 1021 and the thickness of gate oxide 1028, a device threshold of 0V to −1V will result.

NMOS 1020 also includes N+ drain 1023B, chain-implanted deep drain N-well 1024, gate oxide layer 1028, gate 1029, gate silicide 1030, sidewall spacer 1027, N source extension 1026 (an artifact of the sidewall spacer manufacturing process), deep implanted uniform ND region 1025, field oxide layer 1034, ILD 1033, metal interconnect 1032, and barrier metal 1031.

In another variant similar to NMOS 980 of FIG. 26, NMOS 1040 in FIG. 27C illustrates a depletion-mode NMOS 1040 with a deep conformal ND regions 1044A through 1044C implanted prior to gate formation. A subsurface shield 1042 comprises a P-well 1042A under LOCOS field oxide layer 1049, and a deeper portion 1042B extending laterally beneath N+ source region 1045A. The low threshold is set by the lightly-doped P substrate 1041 and thin gate oxide 1046. Depending on the doping concentration of P substrate 1041 and the thickness of gate oxide 1046, a device threshold of 0V to −1V will result.

NMOS 1040 also includes N+ drain region 1045B, chain-implanted deep drain N-well 1043, gate 1047, optional gate silicide 1048, sidewall spacer 1053, N source extension 1054, deep implanted conformal ND regions 1044A through 1044C, field oxide layer 1044, ILD 1050, metal interconnect 1052, and barrier metal 1051.

Figure 28:
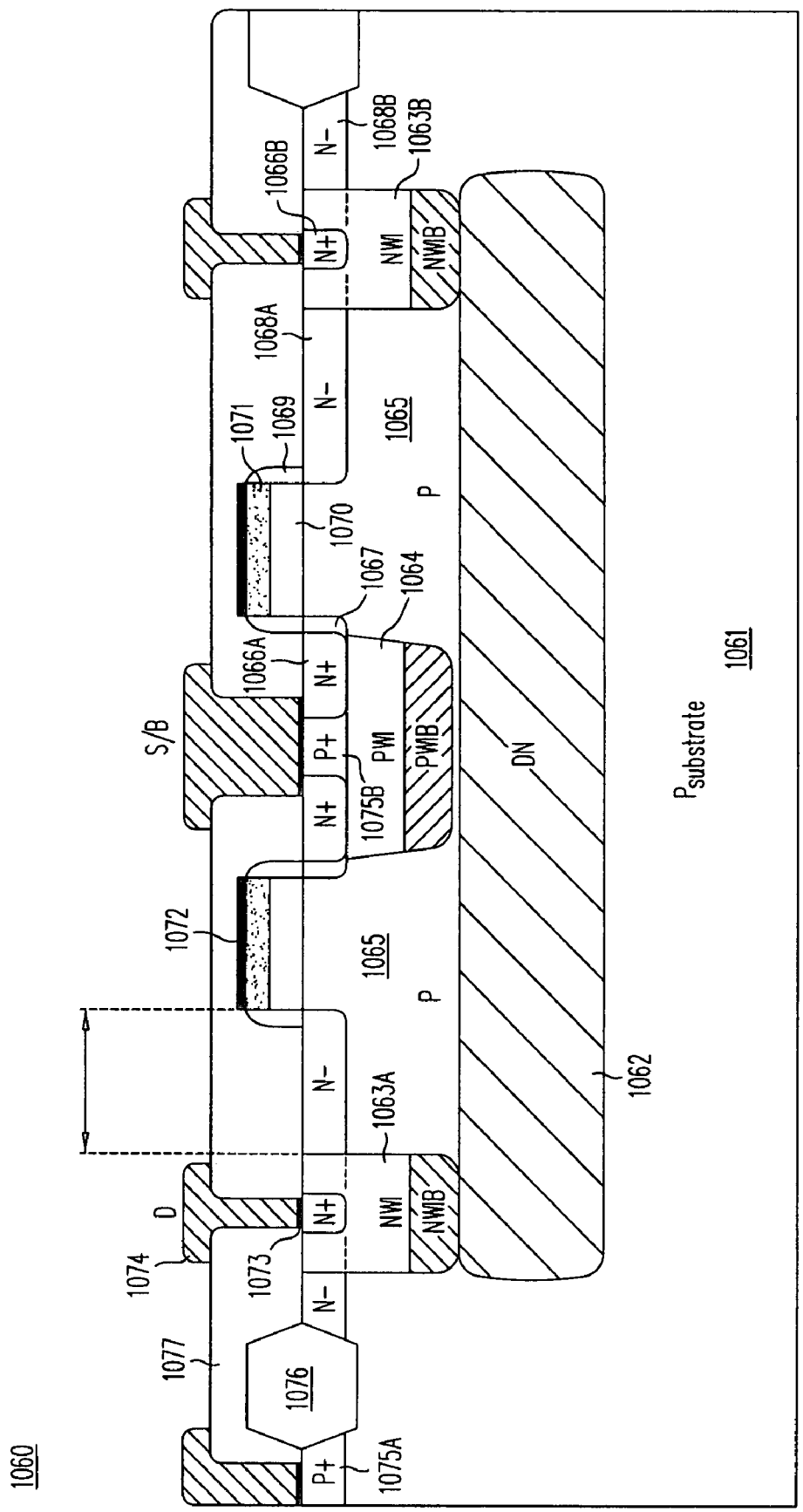
FIG. 28 is a cross-sectional view of and isolated depletion-mode NMOS with a shallow LDD.

As another embodiment of this invention, FIG. 28 illustrates a fully isolated depletion-mode NMOS 1060 with a shallow LDD formed without high temperature processing or diffusions. In this device, DN floor isolation layer 1062 is overlapped by an annular sidewall isolation and deep drain comprising N-wells 1063A and 1063B with shallow ND region 1068A self-aligned to gate 1071 and ND region 1068B self-aligned to LOCOS field oxide layer 1076. The drains are contacted through N+ region 1066B, metal 1074, and barrier metal 1073.

N+ source region 1066A abuts sidewall spacer 1069, while N source extension 1067 is self aligned to gate 1071 sitting atop gate oxide 1070 and shunted by silicide 1072. P-well 1064, comprising a chain-implanted P-type region extends laterally beneath N+ source region 1066A to suppress NPN parasitic conduction and snapback but does not extend sufficiently laterally to overlap beneath gate 1071 as it does in the case of isolated enhancement-mode lateral DMOS. The threshold of the isolated device is set by the doping concentration of isolated pocket 1065, which is preferably the same as the doping concentration of P substrate 1061.

P-N Diodes and Junction Terminations

Another important function in power circuitry is the need to clamp the voltage on sensitive MOS circuitry to avoid the risk of accidentally damaging thin gate oxides from noise spikes and limited duration voltage transients. This may be done with the use of diodes, which may be referenced to ground or may "float" in an isolated tub and have a breakdown voltage lower than whatever circuitry or component being protected. These voltage clamps are commonly called Zener diodes even though the actual breakdown conduction mechanism is an avalanche process, and not quantum mechanical tunneling. We herein use the term Zener and voltage clamp interchangeably without regard to the junction breakdown's physical mechanism.

Because diodes available in conventional integrated circuit processes are formed using high temperature diffusions, the resulting high surface concentration forces breakdown near the surface where avalanche carrier multiplication can damage sensitive oxide and adversely impact device reliability or voltage stability. In contrast the diodes of this invention use as-implanted dopant profiles formed using high energy and chained implants without the need for high-temperature diffusions, and exhibit avalanche breakdown buried below the surface in the bulk silicon where damage is less likely.

Figure 29A:
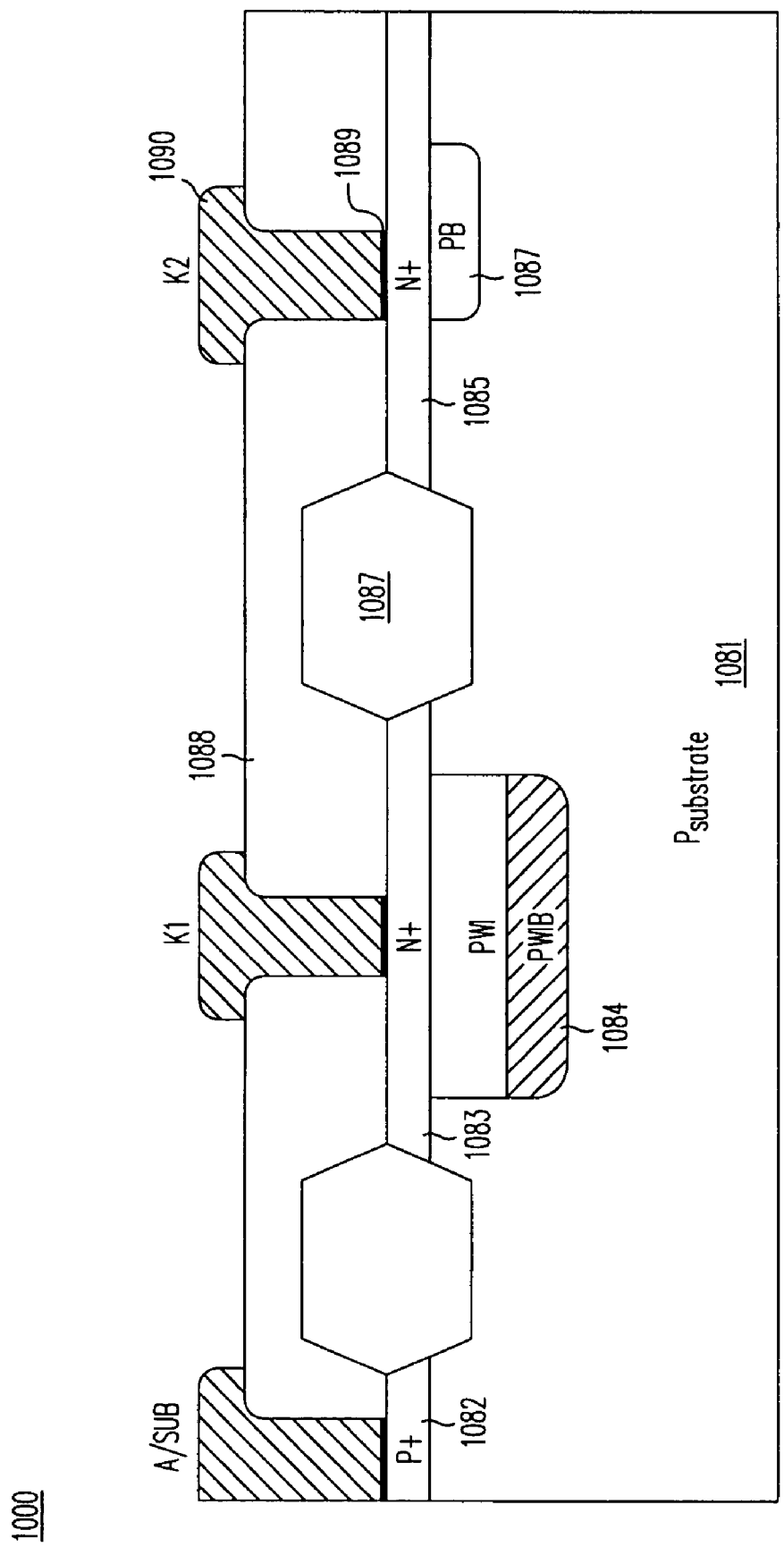
FIGS. 29A-29E are cross-sectional views of various Zener clamping diodes.
Figure 29B:
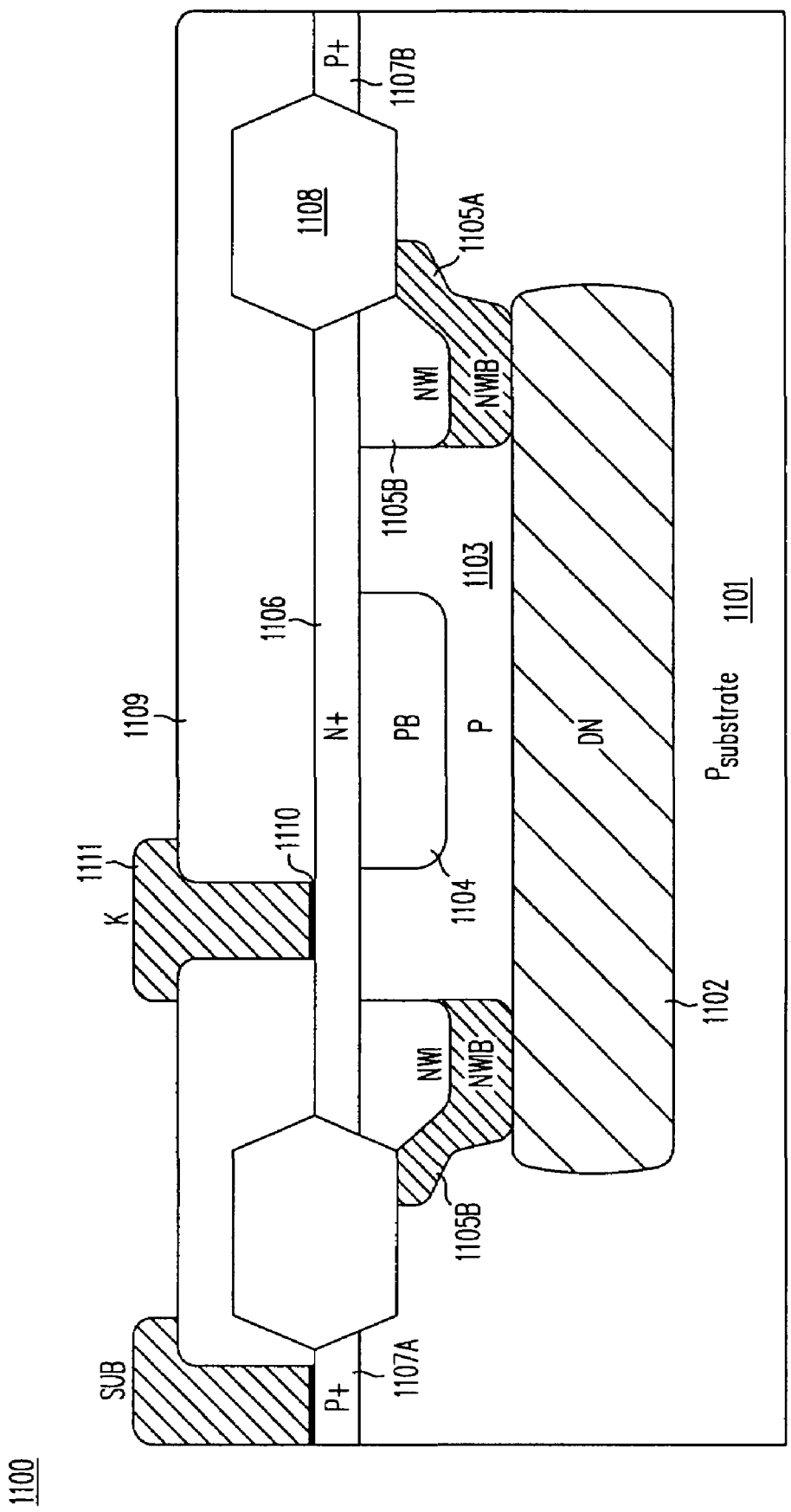
Figure 29C:
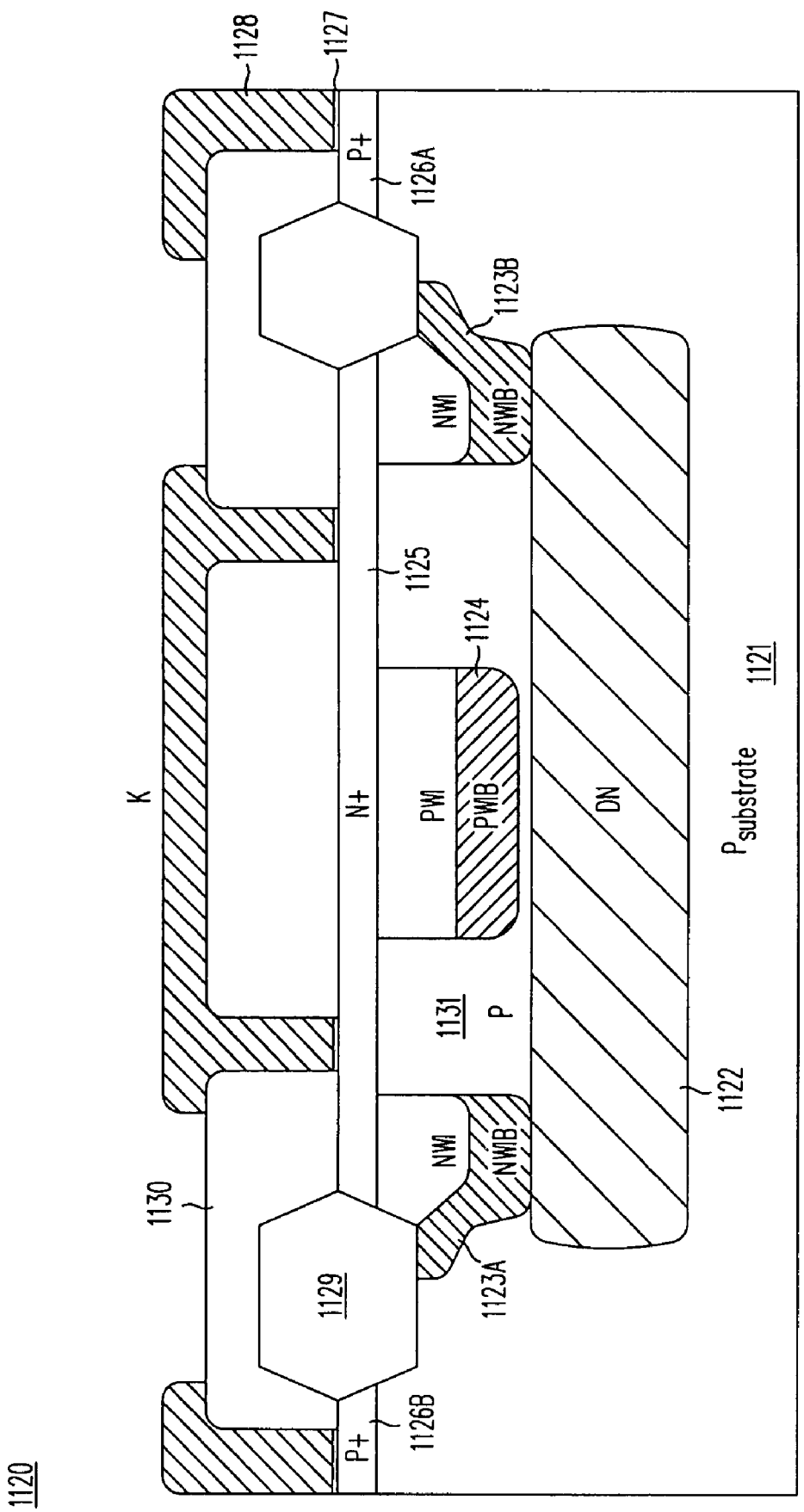

FIGS. 29A-29C illustrate a variety of Zener diodes that can be made with a process according to this invention. For example, FIG. 29A illustrates N+ buried clamp diodes K1 and K2 with grounded anode connections. Diode K1 uses a P-well as an anode; diode K2 uses a P-base or P-body region as the anode. The cathode of diode K1 comprises an N+ region 1083 self-aligned to a LOCOS field oxide layer 1087. The anode of the diode K1 comprises a P-well 1084, which has a lateral dimension smaller than and is laterally enclosed within N+ cathode 1083. P-well 1084 is connected by P+ contact 1082 through an opening in ILD 1088 to electrode "A" formed of metal interconnect 1090 and barrier metal 1089.

Unlike a conventional diffused well which has its peak concentration near the surface and a monotonically decreasing concentration with increasing depth, P-well 1084 is formed by high energy ion implantation of boron, and preferably by a boron chain implant comprising a series of boron implants varying in dose and energy. The chain implant, while it may comprise any number of implants, is graphically represented in the drawing by two regions—a surface layer PW1, and a subsurface layer PW1B, formed by ion implantation through a single mask and without the use of epitaxy. For example, P-well 1084 may comprise either the first or second P-well described in Table 1.

In diode K2, an implanted P-type anode 1087 is formed beneath and laterally contained within N+ cathode 1087, having cathode connection 1090 and anode connection A. The P-body type implant may comprise a single high-energy boron implant or a chain implant. For example, P-well 1087 may comprise either the P-body or P-base region described in Table 1. Typically, the main difference between P-body or P-base regions and P-well regions is the specific doping profile, with the latter having a more heavily-doped subsurface layer than the former.

An isolated version of a buried Zener diode using a P-base or P-body region as the anode is illustrated in FIG. 29B. Diode 1100 comprises isolated P-type region 1103 containing and isolating diode 1100 from P substrate 1101. Floating P-type region 1103 is isolated by high-energy implanted DN floor isolation layer 1102 and sidewall isolation N-wells 1105A and 1105B having an annular shape and overlapping vertically onto DN layer 1102. N+ cathode 1106 extends across the surface between LOCOS field oxide regions 1108 and forms an electrical contact with the isolation structure of DN layer 1102, and N-wells 1105A and 1105B through its contact with N-wells 1105A and 1105B. The N+ cathode region 1106 is contacted through ILD 1109 and electrically connected by metal 1111 with barrier metal 1110, labeled K. P-body or P-base anode 1104 is contained within isolated P-type region 1103 and contacted by a P+ region within isolated P-type region 1103. This P+ contact region is typically located in the third dimension extending into the page, so it is not shown. Contact to non-isolated P-type substrate 1101 is facilitated by P+ regions 1107A and 1107B, which in a preferred embodiment form a ring circumscribing diode 1100.

An isolated version of the a buried Zener diode using a P-well region as the anode is illustrated in cross section 1120 of FIG. 29C. Zener diode 1120 is formed in an isolated P-type region 1131 which contains and isolates Zener diode 1120 from P-type substrate 1121. Floating P-type region 1131 is isolated by high-energy implanted DN floor isolation layer 1122 and sidewall isolation N-well 1123A and 1124B having an annular shape and overlapping vertically onto DN layer 1122. N+ cathode region 1125 extends across the surface between LOCOS oxide regions 1129 and forms electrical contact with the isolation structure of DN layer 112 and N-wells 1123A and 1123B through its contact with N-wells 1123A and 1123B. The N+ cathode region is contacted through ILD 1130 and electrically connected by metal 1128 with barrier metal 1127. P-well anode 1124 is contained within isolated P-type region 1131 and contacted by a P+ region within isolated P-type region 1131, typically in the third dimension (not shown). Contact to non-isolated portion of P substrate 1121 is facilitated by P+ regions 1126A and 1126B, which in a preferred embodiment form a ring circumscribing diode 1120.

Unlike a conventional diffused well which has its peak concentration near the surface and a monotonically decreasing concentration with increasing depth, P-well 1124 is formed by high energy ion implantation of boron, and preferably by a boron chain-implant comprising a series of boron implants varying in dose and energy. The chain implant, while it may comprise any number of implants, is graphically represented in the drawing by two regions—a surface layer PW1, and a subsurface layer PW1B, formed by ion implantation through a single mask and without the use of epitaxy. In a preferred embodiment the deeper layer is more highly concentrated than the surface well. Alternatively, P-well 1124 may have a different dopant profile to achieve a different breakdown voltage.

Figure 29D:
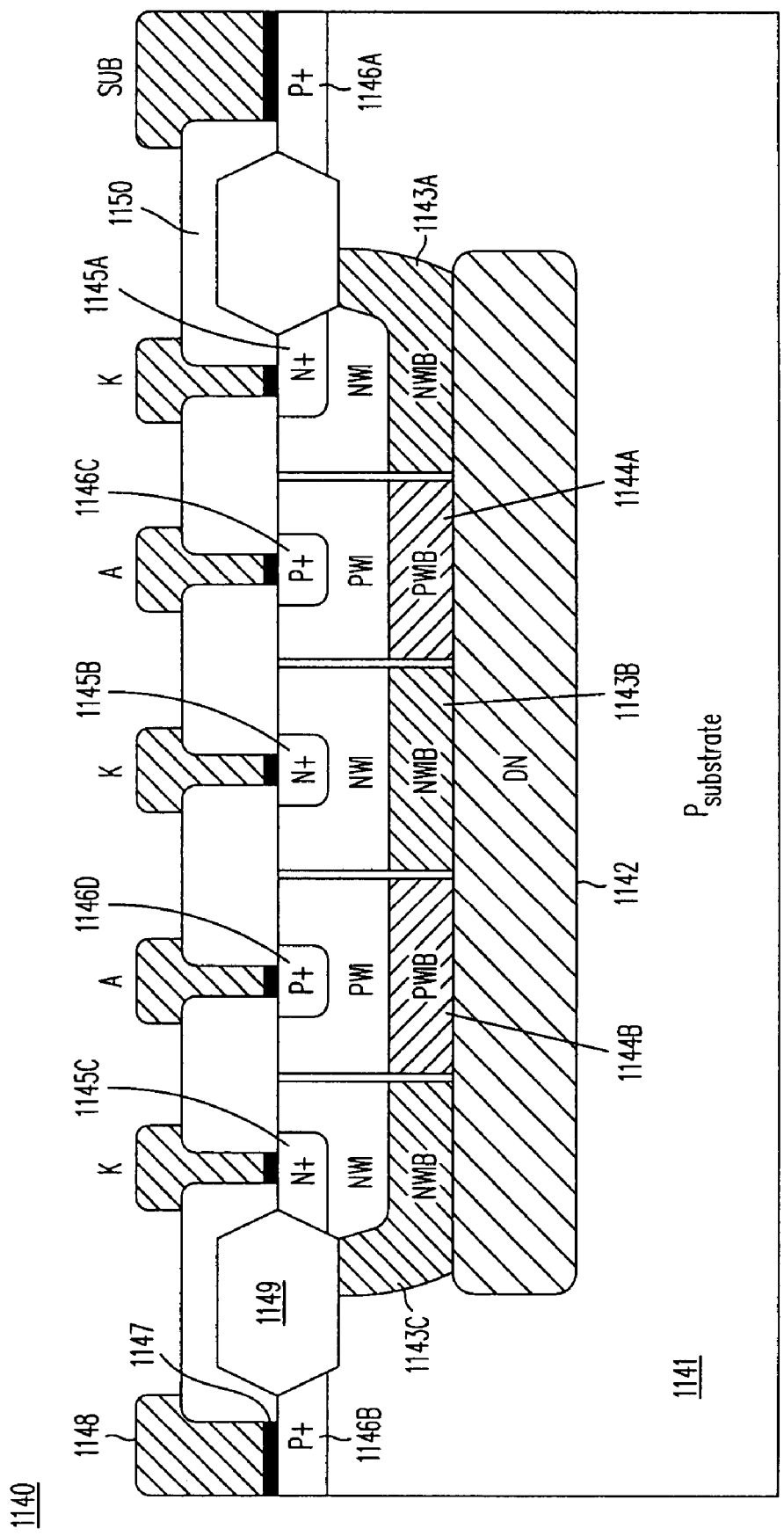

Another isolated buried Zener available in the disclosed process as shown in cross section 1140 of FIG. 29D comprises the parallel combination of stripes of N-well to P-well junctions all contained in a floating island isolated from the substrate. The diode comprises multiple isolated P-wells 1144A and 144B contacted by P+ regions 1146D and 1446C, and multiple N-wells 1143A, 1143B and 1143C contacted by N+ regions 1145A, 1145B, and 1145C, all sitting atop high energy implanted DN floor isolation layer 1142. N-wells 1143A and 1143C form an annular structure isolating the entire Zener from substrate 1141. The device is circumscribed by LOCOS 1149 and P+ substrate ring 1146A and 1146B. Interconnection of the various stripes of Zener diodes is facilitated through metal 1148 with barrier metal 1147.

Unlike a conventional diffused well which has its peak concentration near the surface and a monotonically decreasing concentration with increasing depth, the first P-type wells 1144A and 1144B, along with first N-wells 1143A, 1143B and 1143C are formed by high energy ion implantation, and preferably by a chain-implant comprising a series of implants varying in dose and energy. While the chain implants may comprise any number of implant steps, they are graphically represented in the drawing by two regions—surface layers PW1 and NW1, and a subsurface layers PW1B and NW1B. In a preferred embodiment the deeper layers NW1B and PW1B are more highly concentrated than the surface well, causing the breakdown of the Zener to occur at a location well below the surface. Alternatively a second P-well and a second N-well having a different dopant profile can be substituted for either the first P-well or the first N-well or both to achieve a different breakdown.

Figure 29E:
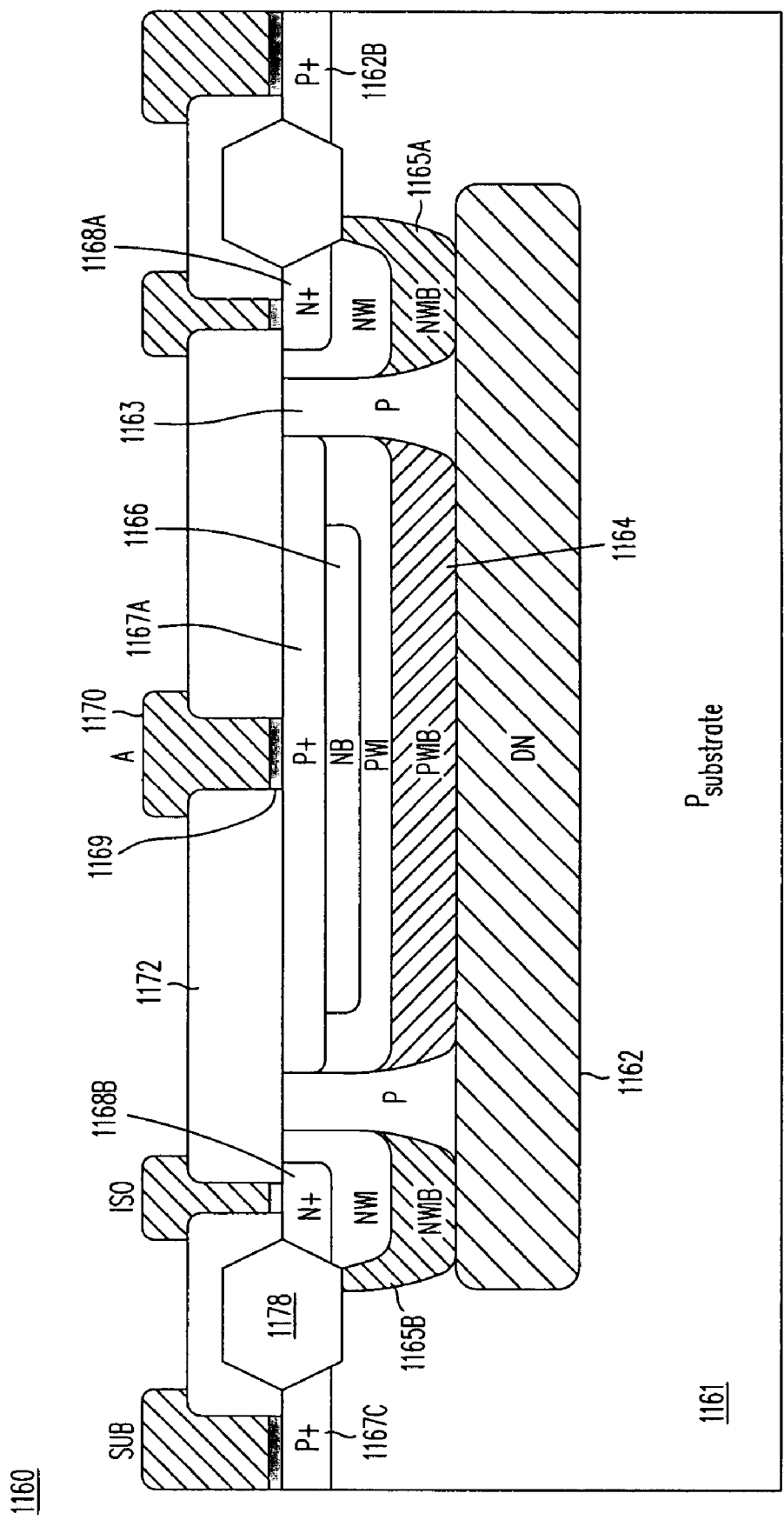

Cross section 1160 of FIG. 29E illustrates an isolated P+ to N-base buried Zener comprising isolated P-type region 1163 containing and isolating said P+ to N-base buried Zener diode from P-type substrate 1161. Floating P-type region 1163 is isolated by high-energy implanted DN floor isolation layer 1162 and sidewall isolation N-wells 1165A and 1165B having an annular shape and overlapping vertically onto DN layer 1162 and contacted by N+ regions 1168A and 1168B. P+ anode 1167A extends across the surface and forms electrical contact with the isolated P-type region 1163 and with chain implanted P-well 1164 containing N-base 1166. Breakdown is determined by the concentration of the buried interface between P+ 1167A and N-base 1166. The P+ anode, labeled A, is contacted through ILD 1172 and electrically connected by metal 1170 with barrier metal 1169. N-base cathode 1166 is contacted by N+ in the third dimension (not shown). Contact to non-isolated P-type substrate 1161 is facilitated by P+ regions 1167C and 1167B, which in a preferred embodiment form a ring circumscribing said diode.

Unlike a conventional diffused well which has its peak concentration near the surface and a monotonically decreasing concentration with increasing depth, first P-type well 1164 is formed by high energy ion implantation of boron, and preferably by a boron chain-implant comprising a series of boron implants varying in dose and energy. The chain implant, while it may comprise any number of implants, is graphically represented in the drawing by two regions—a surface layer PW1, and a subsurface layer PW1B, formed by ion implantation through a single mask and without the use of epitaxy. In a preferred embodiment the deeper layer is more highly concentrated than the surface well, causing the breakdown of the Zener to occur at a location well below the surface. Alternatively a second P-well having a different dopant profile can be substituted for a first P-well to achieve a different breakdown.

Another inventive P-N diode in the process is the termination used to float isolated P-type pockets to high-voltages above the substrate. The purpose of the termination edge is to shape the electric field at the edge of the N-type sidewall isolation, where typically the sidewall comprises an N-well overlapping onto a high energy implanted DN floor isolation layer.

Figure 30A:
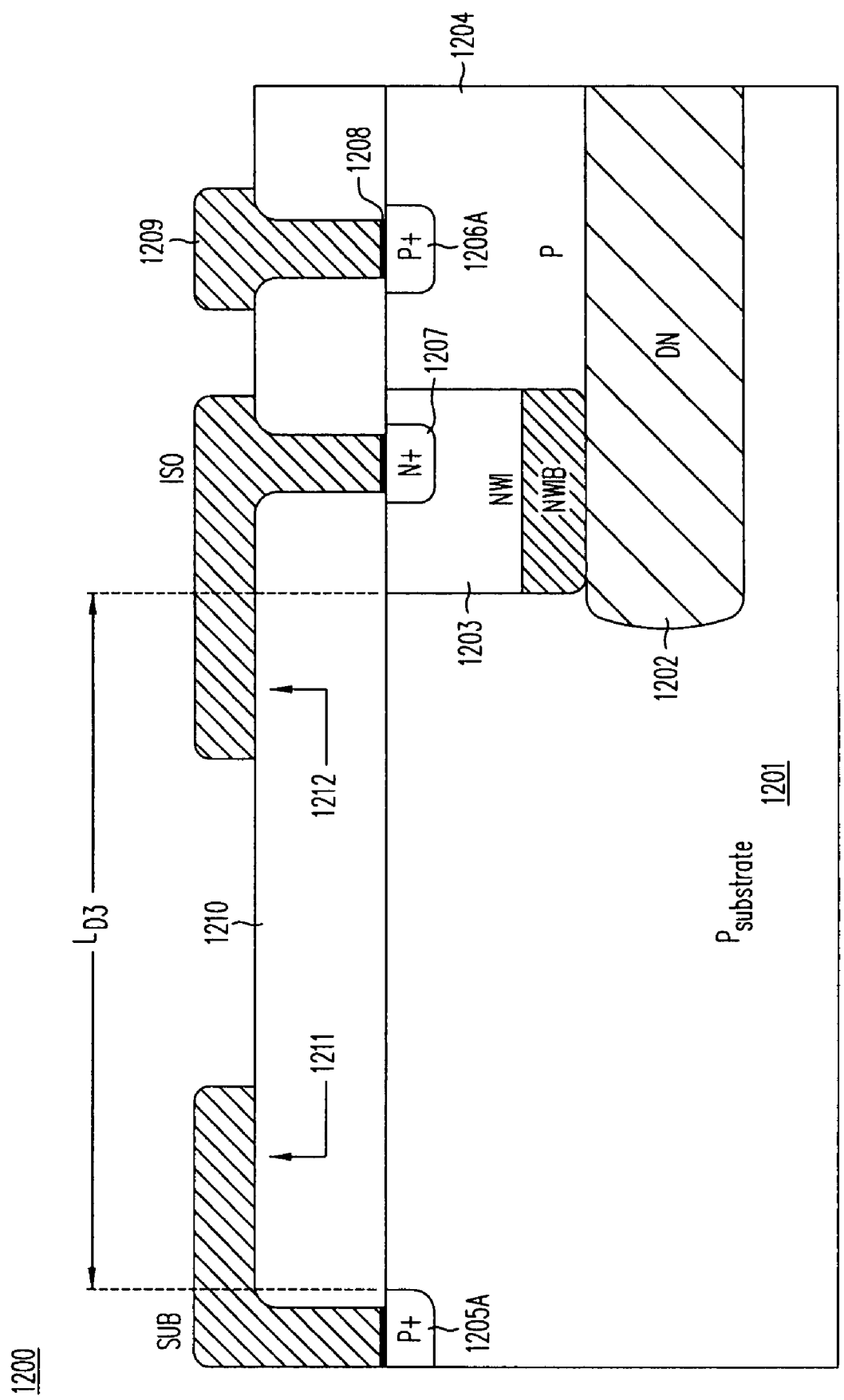
FIGS. 30A-30K are cross-sectional views of high-voltage terminations of an isolated P-type pocket.

In the embodiment shown in FIG. 30A, the isolated P-type pocket 1204 is isolated by DN floor isolation layer 1202 and N-well 1203 and surrounded by P-type substrate 1201 and P+ substrate ring 1205A. In this example, the termination comprises metal field plates 1211 and 1212 extending laterally over ILD 1210. The termination has a length $L_{D3}$ defined as the distance from P+ substrate ring 1205A to N-well 1203.

Figure 30B:
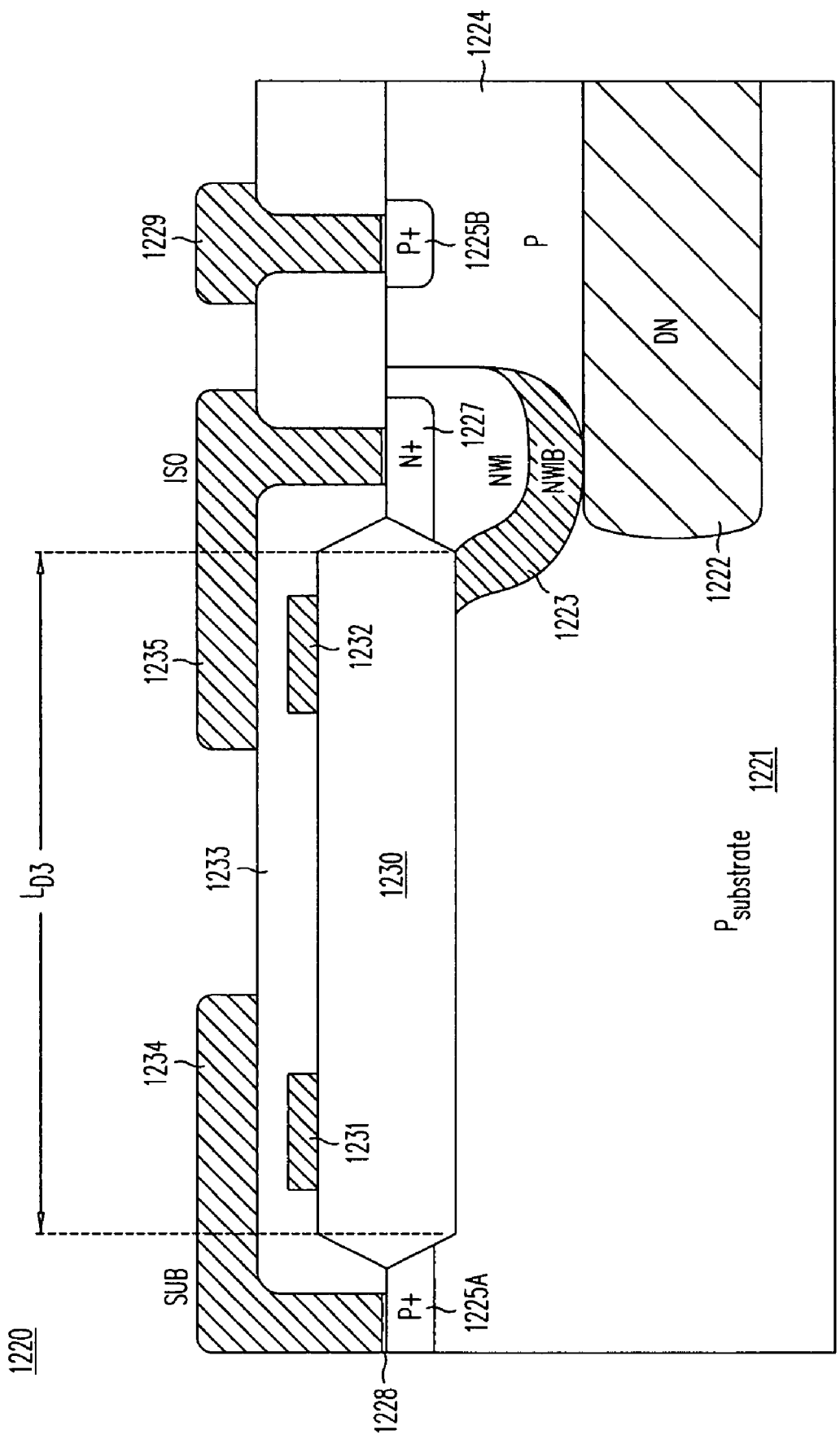

In the embodiment shown in FIG. 30B, the isolated P-type pocket 1224 is isolated by DN floor isolation layer 1222 and N-well 1223 and surrounded by P-type substrate 1221 and P+ substrate ring 1225A. In this example, the termination comprises polysilicon field plates 1231 and 1232 atop LOCOS field oxide layer 1230, and metal field plates 1234 and 1235 extending laterally over ILD 1233. In other embodiments, only the polysilicon or the metal field plates may be used on either the P+ or N-well side of the termination. The lengths of the field plates and their spacing is preferably adjusted to increase the BV of the termination. The termination has a length $L_{D3}$ defined as the distance from P+ substrate ring 1225A to N-well 1223. In this embodiment N-well 1223 extends laterally under LOCOS field oxide layer 1230, causing the bottom portion NW1B to approach the surface and form a junction extension region that is shallower and more lightly doped than the combined NW1 and NW1B, which may serve to reduce the electric field crowding near the edge of DN layer 1222 and thus improve the BV of this termination.

Figure 30C:
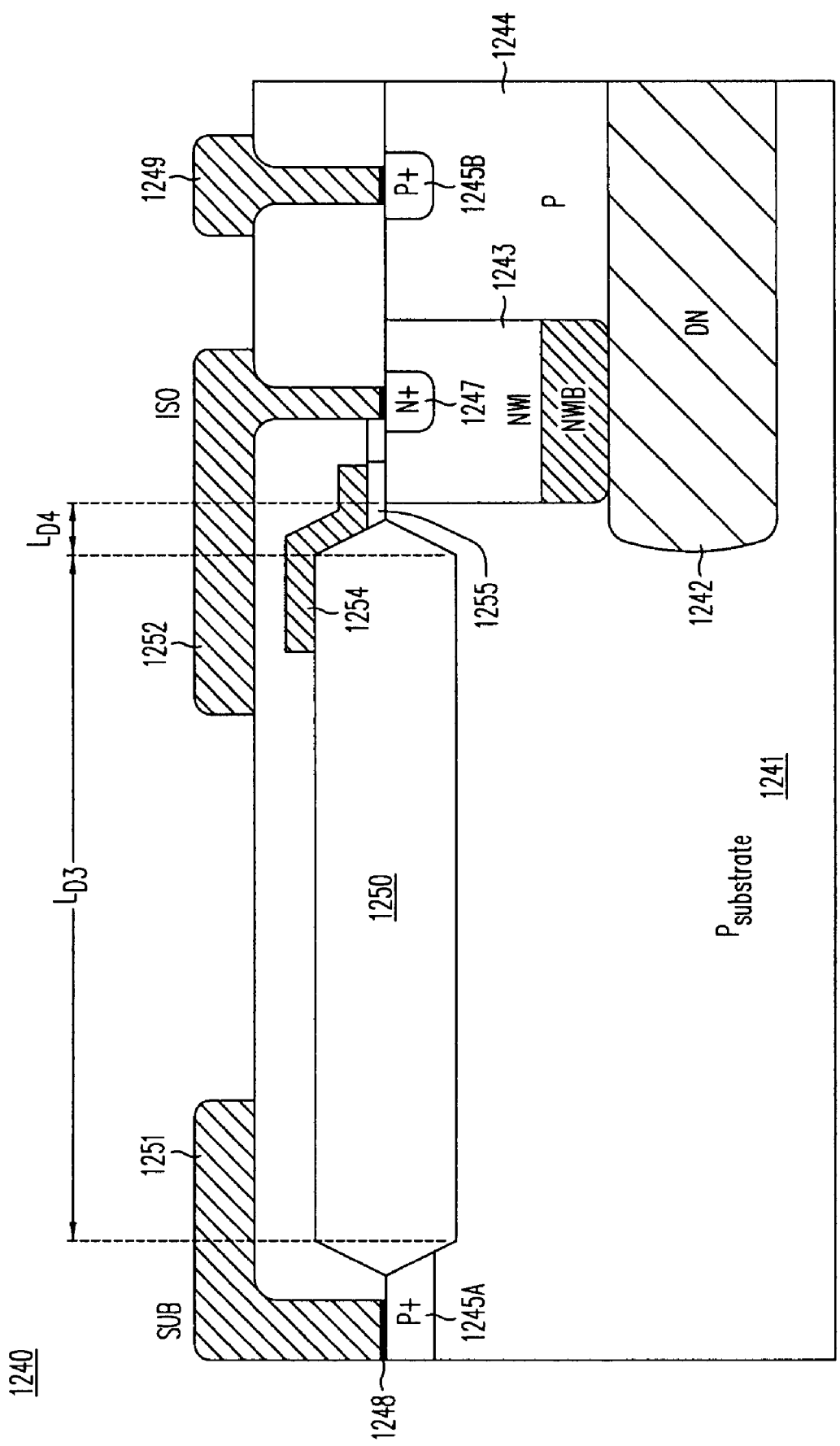

In the embodiment shown in FIG. 30C, the isolated P-type pocket 1244 is isolated by DN floor isolation layer 1242 and N-well 1243 and surrounded by P-type substrate 1241 and P+ substrate ring 1245A. In this embodiment, the termination comprises metal field plates 1251 and 1252 which extend laterally over ILD 1253 and LOCOS field oxide layer 1250. The termination has a length $L_{D3}$ defined as the distance from P+ substrate ring 1245A to N-well 1243. In this embodiment, N-well 1243 does not extend under LOCOS field oxide layer 1250. Also shown is an optional polysilicon field plate 1254 that overlaps the edge of N-well 1243 and has a portion sitting over thin oxide 1255 and a portion extending over LOCOS field oxide layer 1250. In combination with metal field plate 1152, polysilicon field plate 1254 allows formation of field plates with up to three different thicknesses of dielectric between the field plate and the underlying silicon.

Figure 30D:
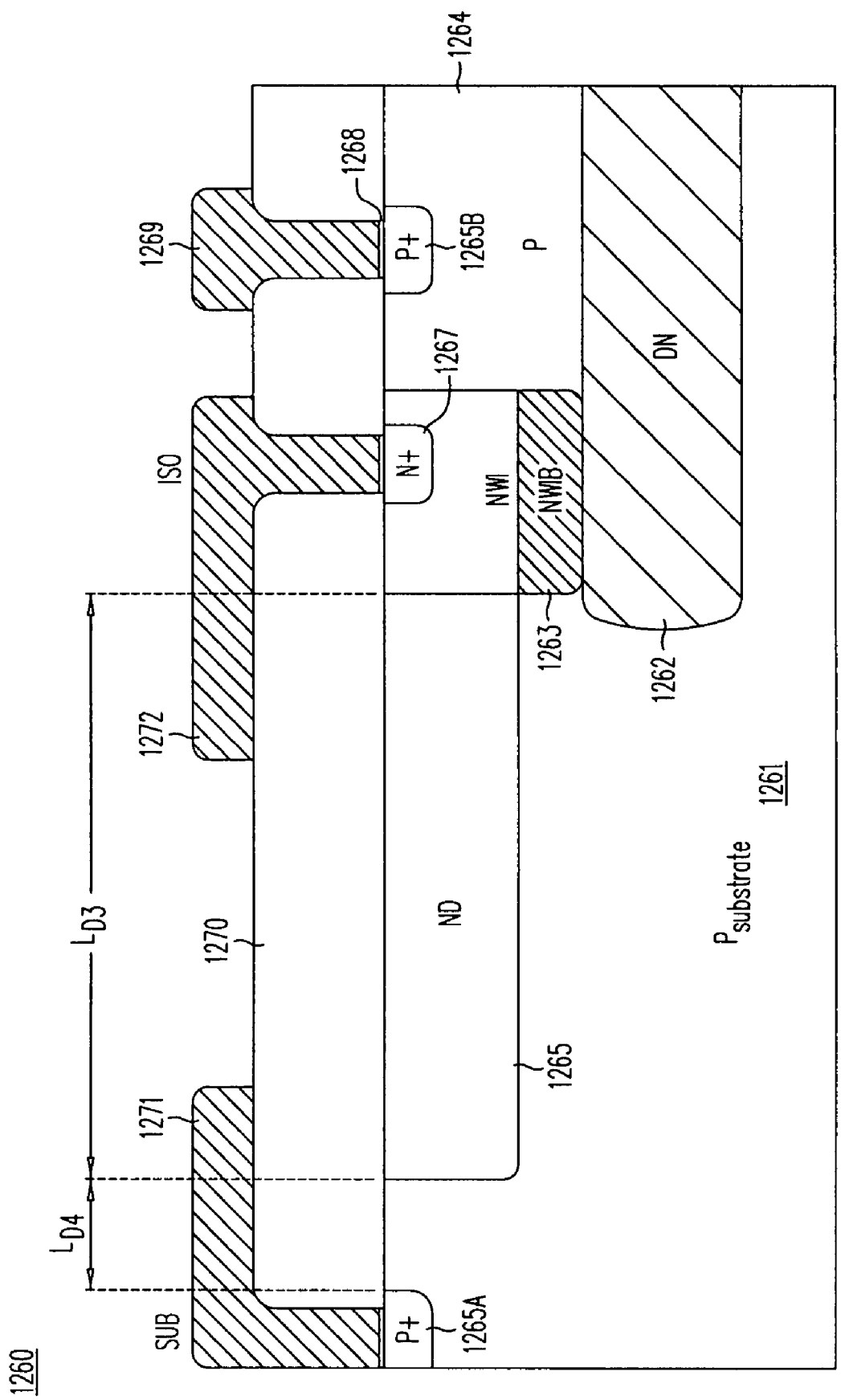

In the embodiment shown in FIG. 30D, the isolated P-type pocket 1264 is isolated by DN floor isolation layer 1262 and N-well 1263 and surrounded by P-type substrate 1261 and P+ substrate ring 1265A. In this embodiment, the termination comprises deep ND region 1266 connected to N-well 1263 and extending under field oxide layer 1270 by a length $L_{D3}$ and spaced apart from P+ substrate ring 1265A by distance $L_{D4}$. The termination may also include metal field plates 1271 and 1272 extending over ILD 1270.

Figure 30E:
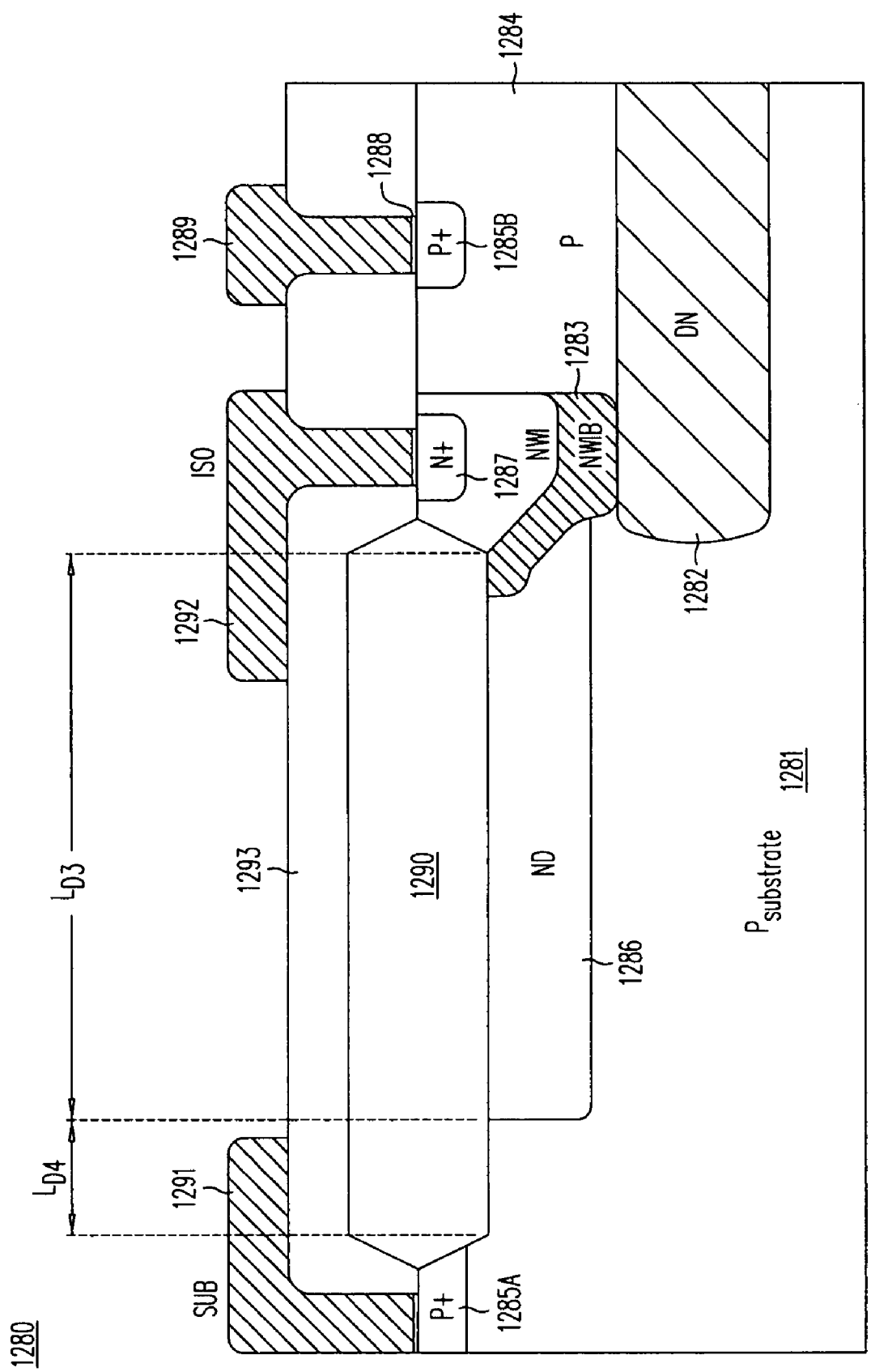

In the embodiment shown in FIG. 30E, the isolated P-type pocket 1284 is isolated by DN floor isolation layer 1282 and N-well 1283 and surrounded by P-type substrate 1281 and P+ substrate ring 1285A. N-well 1283 may extend under LOCOS field oxide layer 1290, as shown, to provide a first junction extension region formed by NW1B. In an alternative embodiment, N-well 1283 may surround N+ region 1287, as shown, but not extend laterally under LOCOS field oxide layer 1290. In this embodiment, the termination also comprises conformal deep ND region 1286 connected to N-well 1283 and extending under LOCOS field oxide layer 1290 by a length $L_{D3}$ and spaced apart from P+ substrate ring 1285A by distance $L_{D4}$. The termination may also include metal field plates 1291 and 1292 overlapping onto ILD 1293.

Figure 30F:
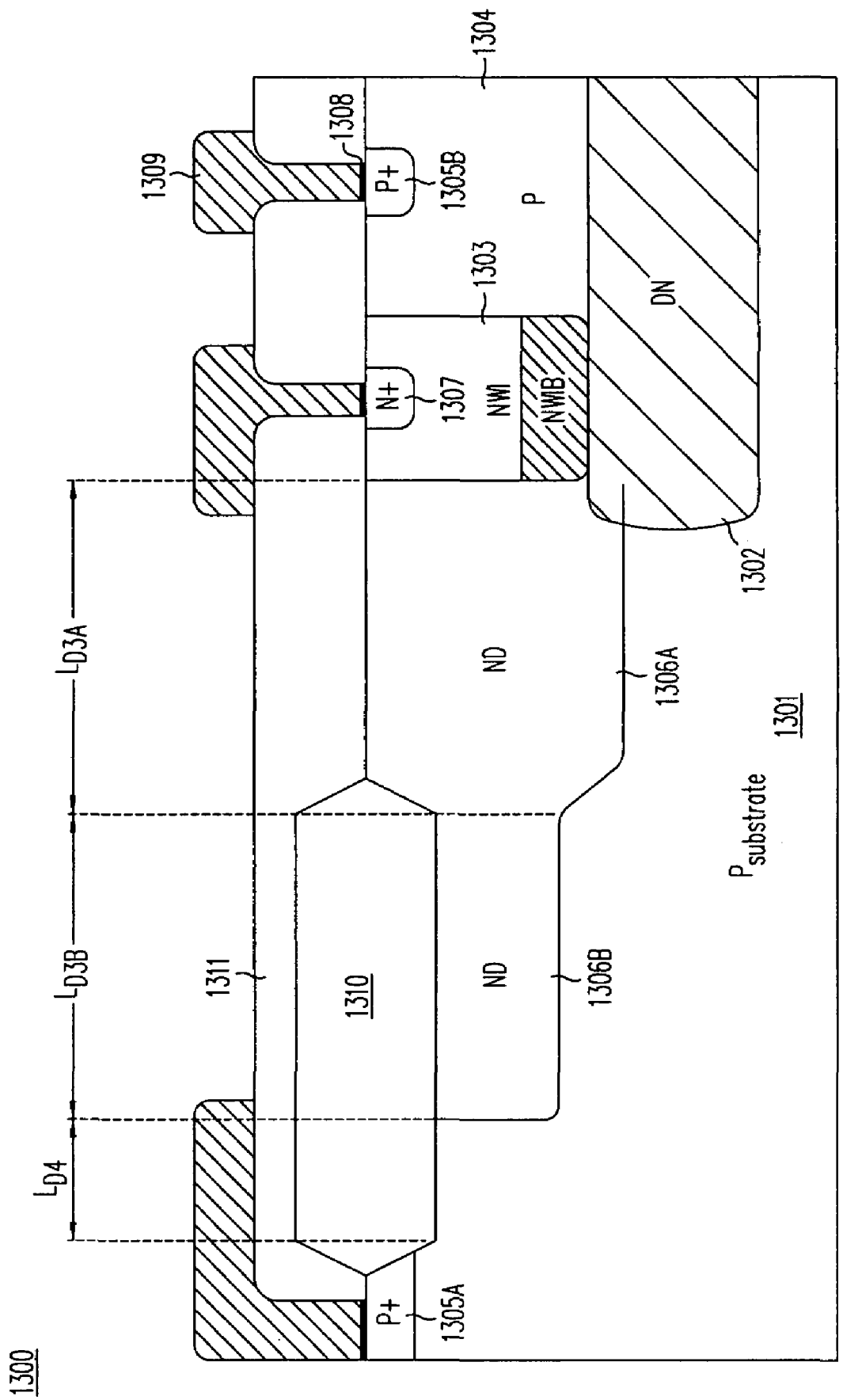

In the embodiment of FIG. 30F, the isolated P-type pocket 1304 is isolated by DN floor isolation layer 1302 and N-well 1303 and surrounded by P-type substrate 1301 and P+ substrate ring 1305A. In this embodiment, the termination comprises conformal deep ND region 1306 including a portion 1306A in the active area with a length $L_{D3A}$ and a portion 1306B under LOCOS field oxide layer 1310 with a length $L_{D3B}$, and spaced apart from P+ substrate ring 1305A by distance $L_{D4}$.

Figure 30G:
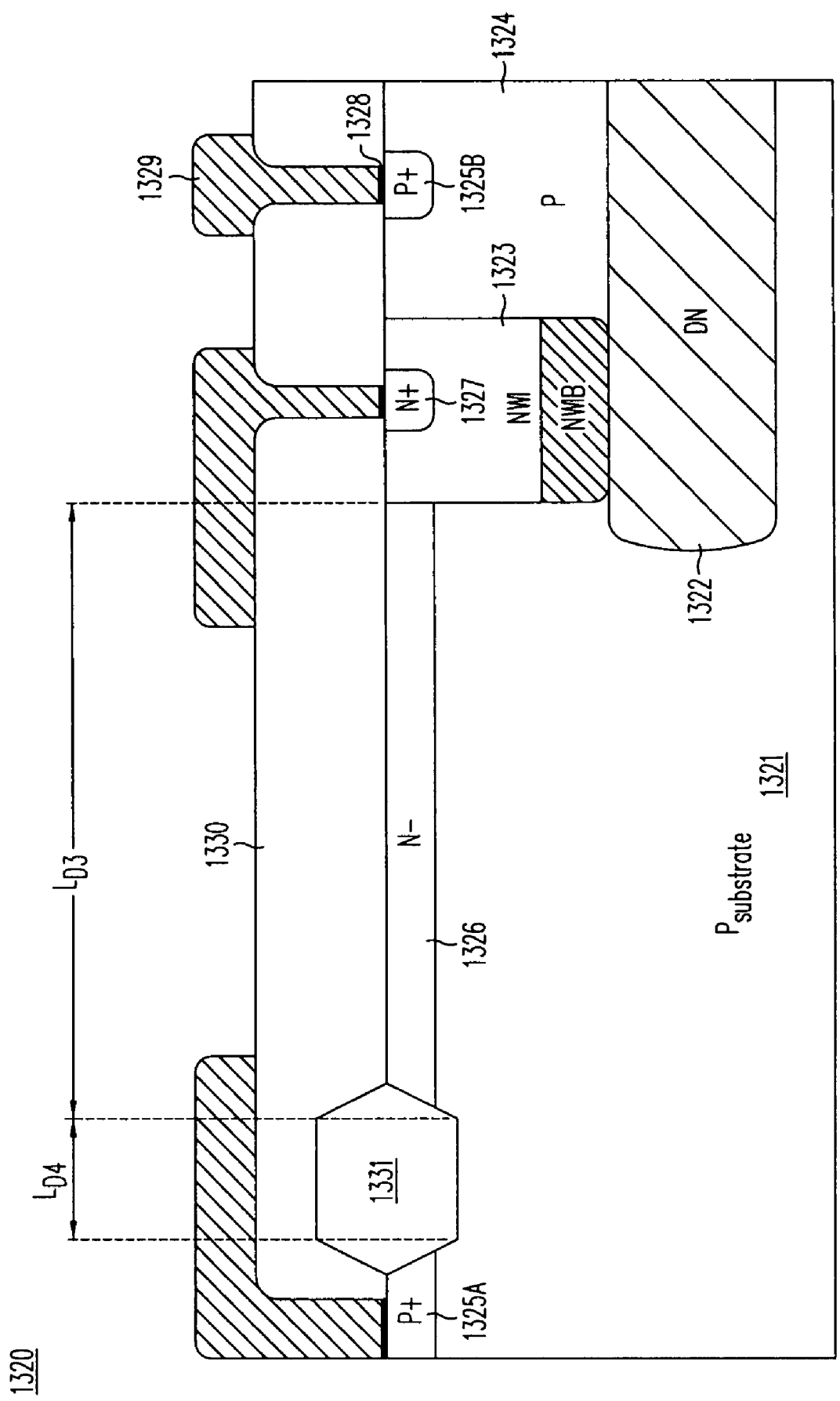

In the embodiment of FIG. 30G, the isolated P-type pocket 1324 is isolated by DN floor isolation layer 1322 and N-well 1323 and surrounded by P-type substrate 1321 and P+ substrate ring 1325A. In this embodiment, the termination comprises shallow N− drift region 1326 connected to N-well 1323 and extending under field ILD 1330 by a length $L_{D3}$. P+ substrate ring 1325A and N− drift region 1326 are self-aligned to LOCOS field oxide layer 1331 and spaced apart by a distance $L_{D4}$.

Figure 30H:
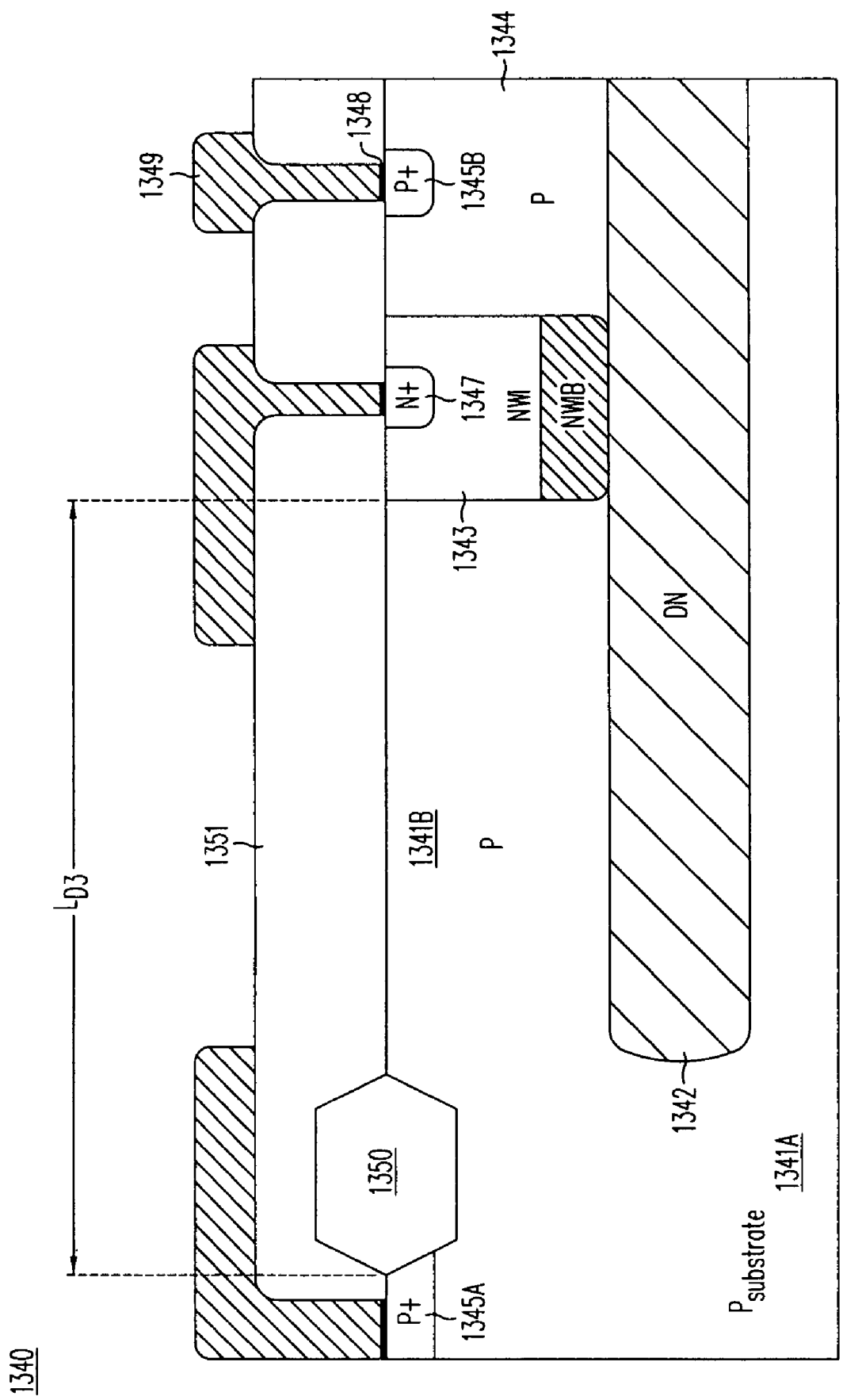

In the embodiment of FIG. 30H, the isolated P-type pocket 1344 is isolated by DN floor isolation layer 1342 and N-well 1343 and surrounded by P-type substrate 1341A and P+ substrate ring 1345A. In this embodiment, the substrate 1341A comprises a region 1341B under LOCOS field oxide layer 1350 and ILD 1351, having a length $L_{D3}$ defined as the distance from P+ substrate ring 1345A to N-well 1343. A portion of DN floor isolation layer 1342 extends beyond N-well 1343 toward P+ substrate ring 1345A to help reduce surface electric fields. The extension of DN layer 1342 beyond N-well 1343 does not extend below LOCOS 1350 in this example, so the depth of the DN layer 1342 is substantially constant in the termination area.

Figure 30I:
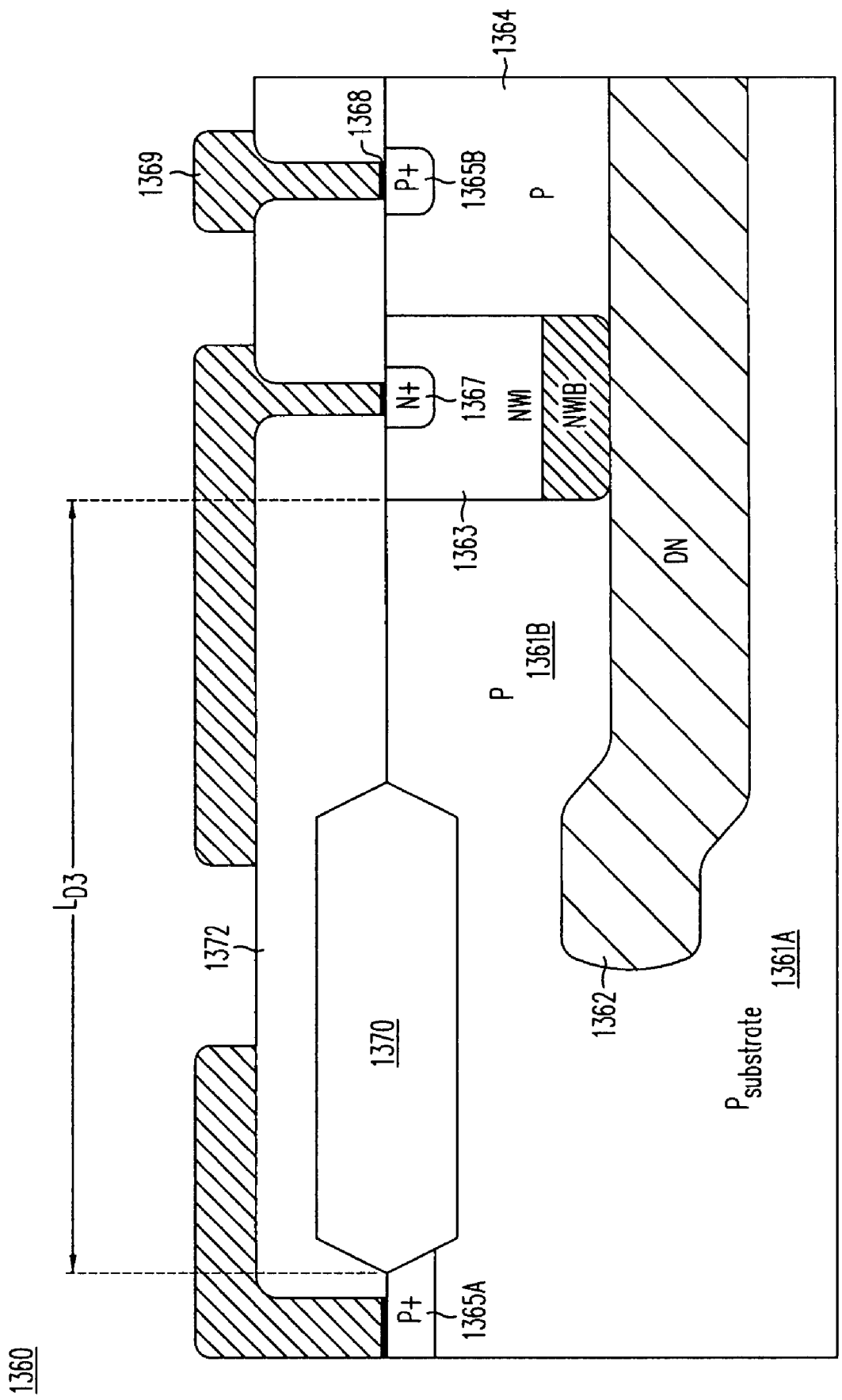

In the embodiment of FIG. 30I, the isolated P-type pocket 1364 is isolated by DN floor isolation layer 1362 and N-well 1363 and surrounded by P-type substrate 1361A and P+ substrate ring 1365A. In this embodiment, the substrate 1361A comprises a region 1361B under ILD 1372 and LOCOS field oxide layer 1370, having a length $L_{D3}$ defined as the distance from P+ substrate ring 1365A to N-well 1363. A portion of DN layer 1362 extends beyond N-well 1363 toward P+ substrate ring 1365A to help reduce surface electric fields. The extension of DN layer 1362 extends under a portion of LOCOS field oxide layer 1370 in this example, so the depth of the DN layer 1362 is conformal to the LOCOS field oxide layer 1370 in the termination area.

Figure 30J:
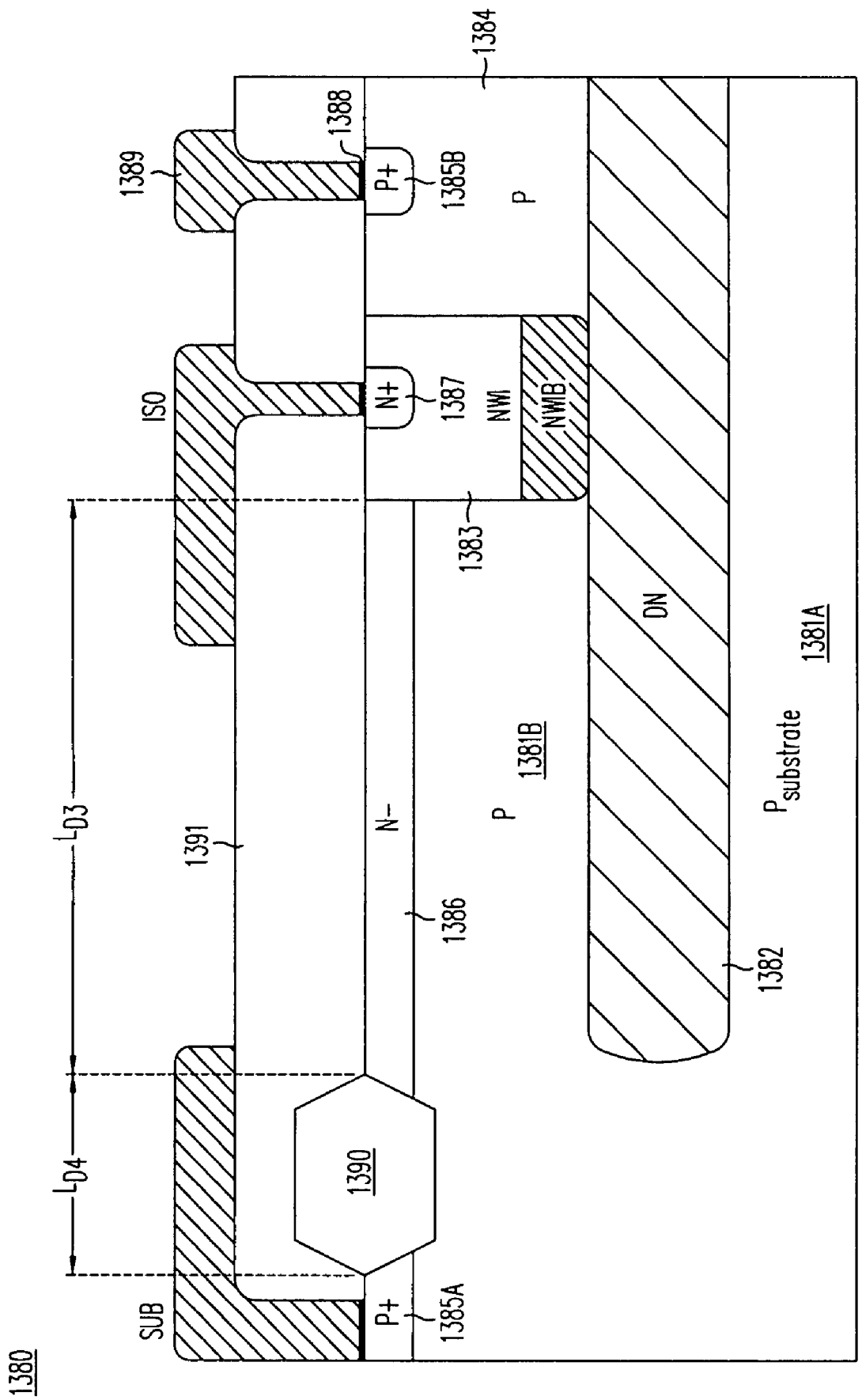

In the embodiment of FIG. 30J, the isolated P-type pocket 1384 is isolated by DN floor isolation layer 1382 and N-well 1383 and surrounded by P-type substrate 1381A and P+ substrate ring 1385A. In this embodiment, the substrate 1381A comprises a region 1381B under LOCOS field oxide layer 1390 and ILD 1391, having a length $L_{D4}$ between the P+ substrate ring 1385A and the N− drift region 1386, and $L_{D3}$ between LOCOS field oxide layer 1390 and N-well 1383. The P+ substrate ring 1385A and ND region 1386 are self-aligned to LOCOS field oxide layer 1390. A portion of DN layer 1382 extends beyond N-well 1383 toward P+ substrate ring 1385A to help reduce surface electric fields. The DN layer 1382 may be held back from LOCOS field oxide layer 1390 such that the depth of DN layer 1382 is substantially constant, as shown, or it may alternatively extend under the LOCOS field oxide layer 1390 so that it has a depth that conforms to the LOCOS field oxide layer 1390, as in the embodiment of FIG. 30I. Shallow ND region 1386 is included as a surface termination extending from N-well 1383 to LOCOS 1390.

Figure 30K:
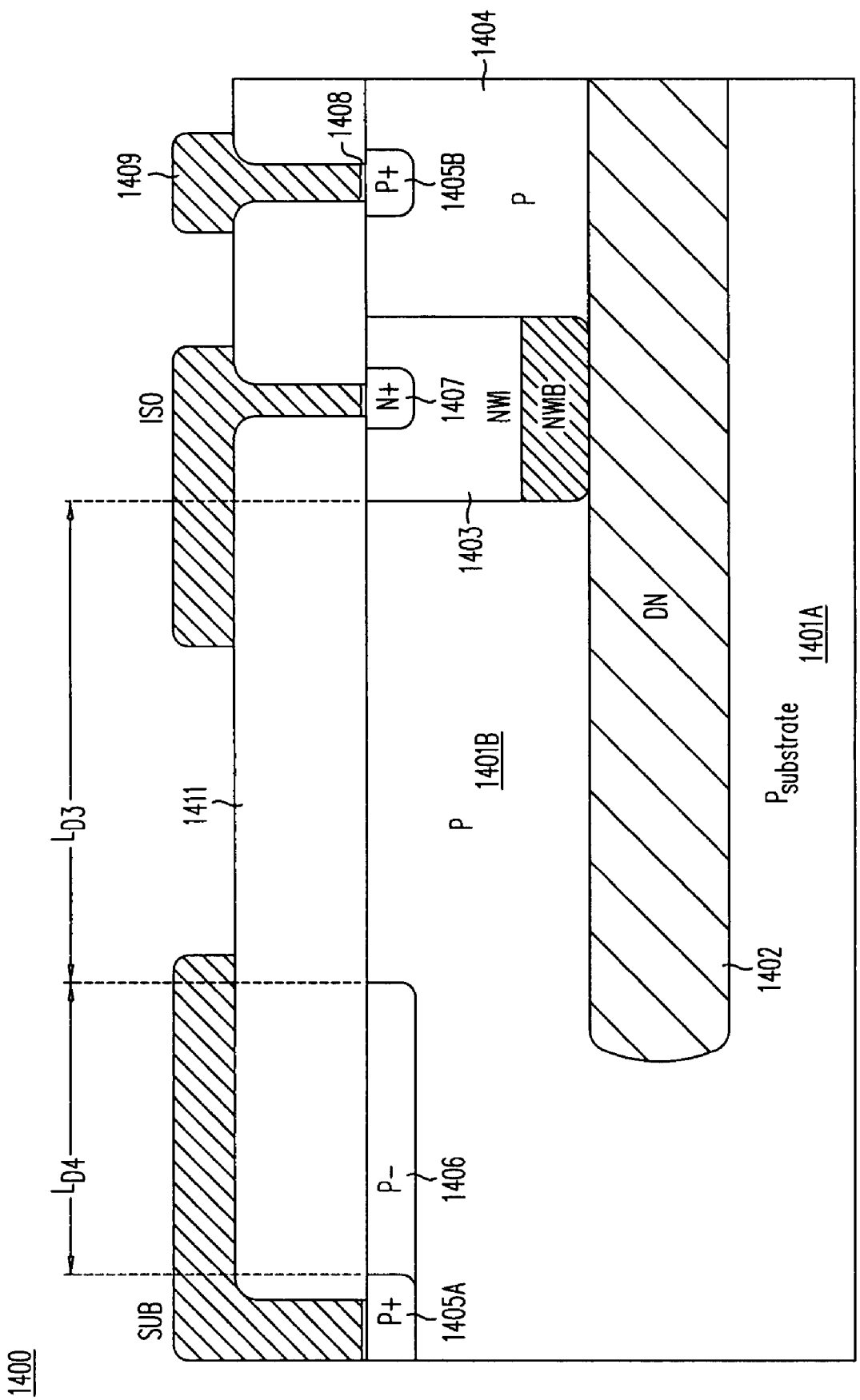

In the embodiment of FIG. 30K, the isolated P-type pocket 1404 is isolated by DN floor isolation layer 1402 and N-well 1403 and surrounded by P-type substrate 1401A and P+ substrate ring 1405A. In this embodiment, the substrate 1401A comprises a region 1401B under ILD 1411. A portion of DN layer 1402 extends beyond N-well 1403 toward P+ substrate ring 1405A to help reduce surface electric fields. Shallow P− drift region 1406 is also included as a surface termination extending from P+ 1405A toward N-well 1403. The termination has a length $L_{D4}$ between the P+ substrate ring 1405A and the edge of P− drift region 1406, and a length $L_{D3}$ between the edge of P− drift region 1406 and N-well 1403.

The various features shown in the termination examples of FIGS. 30A-30K are illustrative of terminations that are compatible with the process of this invention and capable of optimizing the BV of isolated regions. It is well within the scope of this invention to combine the features from different figures to arrive at the best termination structure for a given implementation. For example, the multi-tiered polysilicon and metal field plates of FIGS. 30B and 30C, the conformal DN layer of FIG. 30I, and the N− drift region of FIG. 30I may all be combined, and many other combinations of the disclosed elements are also possible. It is also within the scope of this invention to modify the structures shown in accordance with known processing techniques. For example, it is possible to add metal interconnect layers above the single metal layer shown, and to use these layers as additional levels of field plates. It is further possible to substitute the LOCOS field oxide by alternative field dielectric schemes such as deposited and/or recessed field oxides.

While specific embodiments of this invention have been described, it should be understood that these embodiments are illustrative only, and not limiting. Many additional or alternative embodiments in accordance with the broad principles of this invention will be apparent to those of skill in the art.

We claim:

1. A lateral trench DMOS device formed in a semiconductor substrate of a first conductivity type, the substrate not comprising an epitaxial layer, the device comprising:
   a dielectric layer formed at a surface of the substrate, the dielectric layer having first and second openings;
   a trench formed in the substrate, the trench extending downward from the surface of the substrate directly below the first opening in the dielectric layer, the trench containing a gate and a gate dielectric layer;
   a body region of the first conductivity type formed adjacent the trench;
   a source region of a second conductivity formed adjacent the surface of the substrate and the trench;
   a drain region of the second conductivity type formed adjacent the surface of the substrate below the second opening in the dielectric layer, the drain region comprising a drain contact region, an upper dopant region and a lower dopant region, the drain contact region being located at the surface of the substrate directly above the upper dopant region viewed at a vertical centerline of the drain region, the upper dopant region being located directly above the lower dopant region viewed at the vertical centerline of the drain region, the drain contact region having a peak doping concentration greater than a peak doping concentration of either the upper dopant region or the lower dopant region, the lower dopant region having a peak doping concentration greater than a peak doping concentration of the upper dopant region; and
   a conformal drift region of the second conductivity type abutting the trench, the body region and the drain region, the drift region having a doping concentration that is less than a doping concentration of the drain region, the drift region comprising first and second deep portions located directly below the first and second openings in the dielectric layer, respectively, and a shallow portion located directly below the dielectric layer, the deep portions extending deeper into the substrate than the shallow portion.

2. The lateral trench DMOS device of claim 1 wherein the drain region is conformal and extends laterally under a section of the dielectric layer adjacent the second opening in the dielectric layer.

3. The lateral trench DMOS device of claim 1 wherein the body region comprises a vertical series of dopant regions having different doping concentrations, respectively.

4. The lateral trench DMOS device of claim 1 wherein the drift region comprises a termination portion on an opposite side of the drain region from the body region.

5. The lateral trench DMOS device of claim 1 wherein the source region comprises a plurality of wider portions along the trench, the wider portions of the source region alternating with body contact regions.

6. A lateral trench DMOS device formed in a semiconductor substrate, the substrate not comprising a epitaxial layer, the DMOS device comprising:
   a trench extending downward from a surface of the substrate, the trench being lined with a dielectric layer and containing a gate electrode, the trench having a sidewall and a bottom;
   a source region of a first conductivity type adjacent the surface of the substrate and a sidewall of the trench;
   a drain region of the first conductivity type adjacent the surface of the substrate and spaced apart from the source region, the drain region comprising a drain contact region, an upper dopant region and a lower dopant region, the drain contact region being located at the surface of the substrate directly above the upper dopant region viewed at a vertical centerline of the drain region, the upper dopant region being located directly above the lower dopant region viewed at the vertical centerline of the drain region, the drain contact region having a peak doping concentration greater than a peak doping concentration of either the upper dopant region or the lower dopant region, the lower dopant region having a peak doping concentration greater than a peak doping concentration of the upper dopant region;

a body region of a second conductivity type adjacent the source region and the sidewall of the trench; and a drift region of the first conductivity type adjacent the body region, the sidewall of the trench and the drain region, the drift region comprising a pinched portion and a non-pinched portion, at least a part of the pinched portion being located directly below the body and source regions and being in contact with the sidewall of the trench, at least a part of the non-pinched portion extending downward from the surface of the substrate and being located between the body region and the drain region.

7. The lateral trench DMOS device of claim 6 wherein the drift region extends directly below a bottom of the drain region.

8. The lateral trench DMOS device of claim 7 wherein the drift region extends to the surface of the substrate on a side of the drain region opposite to the trench.

9. The lateral trench DMOS device of claim 6 wherein the drift region comprises at least two dopant regions implanted at different energies and having different doping concentrations.

10. The lateral trench DMOS device of claim 9 wherein a portion of the drift region that is implanted deeper in the substrate has a higher doping concentration than a portion of the drift region that is implanted shallower in the substrate.

11. The lateral trench DMOS device of claim 6 wherein the trench, the source region and the drain region are formed in a longitudinal stripe pattern.

12. The lateral trench DMOS device of claim 6 wherein the trench laterally surrounds the drain region.

13. The lateral trench DMOS device of claim 6 wherein the body region comprises at least two dopant regions implanted at different energies and having different doping concentrations.

14. The lateral trench DMOS device of claim 6 wherein the trench extends deeper into the substrate than the drift region.

15. The lateral trench DMOS device of claim 6 wherein the drift region extends deeper into the substrate than the trench.

16. The lateral trench DMOS of claim 1 wherein the dielectric layer comprises a field oxide layer, the field oxide layer comprising a bird's beak area wherein a thickness of the field oxide layer transitions from zero to full thickness, the drift region further comprising a transition portion located directly below the bird's beak area of the field oxide layer, the depth of the drift region in the transition portion varying from a first depth equal to the depth of the deep portion to a second depth equal to the depth of the shallow portion.

17. The lateral trench DMOS of claim 16 wherein the transition portion of the drift region is located between the shallow and deep portions of the drift region.

18. The lateral trench DMOS device of claim 1 wherein the shallow portion of the drift region does not extend into an area directly below the first and second openings in the dielectric layer and the first and second deep portions of the drift region do not extend into an area directly below the dielectric layer.

19. The lateral trench DMOS device of claim 1 wherein the shallow portion of the drift region and the first and second deep portions of the drift region, respectively, are located in separate horizontal areas of the substrate.

20. The lateral trench DMOS device of claim 1 wherein no part of the shallow portion of the drift region is located either directly above or directly below any part of the deep portions of the drift region.

* * * * *

UNITED STATES PATENT AND TRADEMARK OFFICE
CERTIFICATE OF CORRECTION

| | |
|---|---|
| PATENT NO. | : 7,576,391 B2 |
| APPLICATION NO. | : 11/982764 |
| DATED | : August 18, 2009 |
| INVENTOR(S) | : Richard K. Williams, Donald Ray Disney and Wai Tien Chan |

It is certified that error appears in the above-identified patent and that said Letters Patent is hereby corrected as shown below:

On the title page, item (60), under the heading "Related U.S. Application Data," is corrected to read as follows:

Division of application No. 11/443,745, filed on May 31, 2006, and a continuation-in-part of application No. 11/881,841, filed on Jul. 30, 2007, which is a continuation of application No. 10/767,419, filed on Jan. 29, 2004, which is a continuation of application No. 10/262,567, filed on Sep. 29, 2002.

The specification at column 1, lines 7-16, under the heading "Cross-Reference to Related Applications, is corrected to read as follows:

This application is a divisional of Application No. 11/443,745, filed May 31, 2006, which is incorporated herein by reference in its entirety.

This application is a continuation-in-part of Application No. 11/881,841, filed July 30, 2007, which is a continuation of Application No. 10/767,419, filed January 29, 2004, now U.S. Patent No. 7,265,434, which is a continuation of Application No. 10/262,567, filed September 29, 2002, now U.S. Patent No. 6,855,985, which is incorporated herein by reference in its entirety.

Signed and Sealed this
Ninth Day of July, 2013

Teresa Stanek Rea
*Acting Director of the United States Patent and Trademark Office*